(12) United States Patent
Kosugi et al.

(10) Patent No.: US 7,684,210 B2
(45) Date of Patent: Mar. 23, 2010

(54) CARD UNIT, DEVICE UNIT, CARD ATTACHING/DETACHING METHOD AND ELECTRONIC APPARATUS

(75) Inventors: Naofumi Kosugi, Kawasaki (JP); Koichi Namimatsu, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 564 days.

(21) Appl. No.: 11/377,405

(22) Filed: Mar. 17, 2006

(65) Prior Publication Data

US 2007/0087594 A1 Apr. 19, 2007

(30) Foreign Application Priority Data

Oct. 14, 2005 (JP) ............................. 2005-301030

(51) Int. Cl.
*H05K 7/14* (2006.01)
*H05K 7/18* (2006.01)

(52) U.S. Cl. ........................ 361/801; 361/756; 361/727

(58) Field of Classification Search ......... 361/684–686, 361/756, 727, 737, 769, 600, 784, 796, 800–801; 211/13.1, 41.1
See application file for complete search history.

(56) References Cited

U.S. PATENT DOCUMENTS

| 5,326,277 | A |   | 7/1994 | Kuramitsu | 439/327 |
|---|---|---|---|---|---|
| 5,470,240 | A |   | 11/1995 | Suzuki | 439/157 |
| 5,657,204 | A | * | 8/1997 | Hunt | 361/752 |
| 5,868,585 | A |   | 2/1999 | Barthel et al. | 439/377 |
| 6,053,760 | A | * | 4/2000 | Bailis et al. | 439/377 |
| 6,071,143 | A | * | 6/2000 | Barthel et al. | 439/377 |
| 6,115,258 | A |   | 9/2000 | Hoyle, Jr. et al. | 361/752 |
| 6,128,196 | A | * | 10/2000 | Hoyle et al. | 361/752 |
| 6,171,120 | B1 | * | 1/2001 | Bolich et al. | 439/157 |
| 6,317,334 | B1 |   | 11/2001 | Abruzzini et al. | 361/797 |
| 6,373,712 | B1 | * | 4/2002 | Bailis et al. | 361/756 |
| 6,545,877 | B1 |   | 4/2003 | Agha et al. | 361/801 |
| 6,625,039 | B2 |   | 9/2003 | Barringer et al. | 361/800 |
| 6,671,184 | B1 | * | 12/2003 | Barringer et al. | 361/801 |
| 6,924,988 | B2 | * | 8/2005 | Barringer et al. | 361/818 |
| 7,057,904 | B2 | * | 6/2006 | Bundza et al. | 361/801 |

(Continued)

FOREIGN PATENT DOCUMENTS

EP 0 547 286 A1 6/1993

(Continued)

OTHER PUBLICATIONS

European Search Report dated Aug. 28, 2009.

(Continued)

*Primary Examiner*—Hung S Bui
(74) *Attorney, Agent, or Firm*—Kratz, Quintos & Hanson, LLP

(57) ABSTRACT

A card unit on which a card attached to a connector and detached from it is loaded has a frame, which is loaded with the card and is expanded and contracted, and an attaching/detaching mechanism which attaches the card to the connector and detaches the card from the connector by expanding and contracting the frame. The attaching/detaching mechanism has a rotatable attaching/detaching lever which makes the frame expand and contract by its rotational operation. A maintaining part (maintaining surface parts) is provided, and the frame is maintained at a position, at which the card is disengaged from the connector, by the maintaining part.

20 Claims, 46 Drawing Sheets

U.S. PATENT DOCUMENTS

| | | | |
|---|---|---|---|
| 7,145,780 B2 * | 12/2006 | Malone et al. | 361/752 |
| 7,215,556 B2 * | 5/2007 | Wrycraft | 361/802 |
| 7,420,816 B2 * | 9/2008 | Rubenstein | 361/759 |
| 2002/0176234 A1 | 11/2002 | Sawada et al. | |
| 2004/0008501 A1 | 1/2004 | Barringer et al. | 361/801 |
| 2004/0012921 A1 | 1/2004 | Hidaka et al. | |

FOREIGN PATENT DOCUMENTS

| | | |
|---|---|---|
| GB | 2 370 920 A | 7/2002 |
| JP | 09-018183 | 1/1997 |
| JP | 09-074293 | 3/1997 |
| JP | 11-265763 | 9/1999 |
| JP | 2002-353663 | 12/2002 |
| JP | 2004-54967 | 2/2004 |
| KR | 10-0262429 | 8/2000 |
| KR | 2002-0060575 | 7/2002 |
| WO | WO 99/55127 | 10/1999 |
| WO | WO 02/21888 | 3/2002 |

OTHER PUBLICATIONS

Korean Office Action (Notice Requesting Submission of Opinion) dated Jan. 31, 2007 issued in corresponding Korean Application No. 10-2006-0028341.

Korean Decision to a Grant Patent dated Sep. 21, 2007 issued in corresponding Korean Patent Application No. Oct. 2006-0028341.

* cited by examiner ated on an electronic apparatus of a server unit and so on. In particular, the present invention relates to a card unit; a device unit, a card attaching/detaching method and an electronic apparatus suitable for the attaching and detaching of various kinds of cards which are loaded on a server unit, for example, a PCI (Peripheral Component Interconnect) card and so on.

CARD UNIT, DEVICE UNIT, CARD ATTACHING/DETACHING METHOD AND ELECTRONIC APPARATUS

CROSS-REFERENCE TO RELATED APPLICATIONS

This application is based upon and claims the benefit of priority from the prior Japanese Patent Application No. 2005-301030 filed on Oct. 14, 2005, the entire contents of which are incorporated herein by reference.

BACKGROUND OF THE INVENTION

1. Field of the Invention

The present invention relates to an attaching and detaching constitution of a card such as a printed circuit board mounted on an electronic apparatus of a server unit and so on. In particular, the present invention relates to a card unit; a device unit, a card attaching/detaching method and an electronic apparatus suitable for the attaching and detaching of various kinds of cards which are loaded on a server unit, for example, a PCI (Peripheral Component Interconnect) card and so on.

2. Description of the Related Art

As an electronic apparatus loaded with a lot of printed circuit boards, for example, on a server unit, a lot of cards are loaded for the purpose of extending the function of the PCI card and so on according to the scale of a system. Further, each card is attached and detached for an exchange as the need arises, for example, in a case of the extension of a function and maintenance. To cut off a power source for the purpose of performing such a card exchange imposes an excessive burden on a user, and there is also a risk in which a failure is caused. Ordinary, in the maintenance of the PCI card and so on in the server unit, after the power source is cut off, the work for an exchange is performed through access to an objective card by using a tool such as a screw-driver. Or, even a state that the power source is kept, a tool such as a screw-driver is needed in order to gain access to a card to be exchanged. Further, the management of electrostatic damage countermeasures as an example is also needed.

In connection with a card exchanging technology and so on in such an electronic apparatus, the following technologies have been known, for example. That is, as a constitution for the purpose of mounting a card such as a printed circuit board, there is a constitution in which a united card is attached to a card connector and is detached from the card connector (The Japanese Laid Open Publication No. 2002-353663 (the paragraph No. 0014, FIG. 1)). Further, there is a constitution in which an operation is performed by a lever attached to an apparatus unit when the apparatus unit is attached to an enclosure and is detached from the enclosure (The Japanese Laid Open Publication No. 2004-54967 (the paragraph No. 0037, FIG. 4, etc.))

By the way, in an exchangeable card loaded on an electronic apparatus such as a server unit, it is feared that the accuracy of connection is lowered due to the attaching and detaching between the card and a connector provided at a board side. Further, it is feared that a contact point is damaged. Because of this it is necessary to pay close attention to the attaching and detaching of the card. In a case of using a tool such as a screw-driver for the exchange of a card, it is feared that the tool comes into contact with a component such as another base board carelessly. Furthermore, an operation in which the opening and closing of a case of an apparatus is needed, for example. Because of this, in a case that the number of processes is large, the efficiency of maintenance in an exchange and so on may be lowered.

Concerning the problems mentioned above, the publications No. 2002-353663 and No. 2004-54967 do not disclose or suggest these problems. Further, these publications do not disclose or suggest a constitution for the solution of these problems.

SUMMARY OF THE INVENTION

A first object of the present invention, therefore, is to make it easy to operate the attaching and detaching of various kinds of cards, such as a printed circuit board.

Further, a second object of the present invention is to improve the attaching and detaching accuracy of in the attaching and detaching operation between a connector and a card with a card exchange and so on.

In order to attain the above object, a first technical side of the present invention is a card unit on which a card attached to a connector and detached from the connector is loaded, and is a constitution that has a frame, loaded with the card, which is expanded and contracted, and an attaching/detaching mechanism which attaches the card to the connector and detaches the card from the connector by expanding and contracting the frame. As a constitution like this, it is possible to attach the card loaded on the frame of the card unit to the connector and detach the card from the connector by expanding and contracting the frame through the attaching/detaching mechanism.

In order to attain the above objects, the above-mentioned card unit may also be constituted so that the attaching/detaching mechanism has a rotatable attaching/detaching lever which makes the frame expand and contract by a rotational operation of the attaching/detaching lever. According to a constitution like this, the attaching/detaching mechanism is operated by the rotation of the attaching/detaching lever, and the frame can be expanded and contracted.

In order to attain the above objects, the above-mentioned card unit may also be constituted to further comprise a maintaining part which maintains the frame at a position where the card is disengaged from the connector. According to a constitution like this, the frame is maintained at the position, at which the card is disengaged from the connector, by the maintaining part, and it is possible to exchange the card on the frame with ease.

In order to attain the above objects, the above-mentioned card unit may also be constituted to further comprise a locking mechanism which locks a movement of the frame at a position where the card is attached to the connector. According to a constitution like this, the movement of the frame is locked by the locking mechanism, and it is possible to keep a coupled state between the connector and the card.

In order to attain the above objects, the above-mentioned card unit may also be constituted to further comprise a protection cover that protects the card loaded on the frame. According to a constitution like this, the card on the frame is protected by the protection cover.

In order to attain the above objects, the card unit may also be constituted so that the frame has a supporting frame part and a movable frame part which is loaded with the card and can be moved, and so that the frame is expanded and contracted by a movement of the movable frame part. According to a constitution like this, the frame becomes an expanded state or a contracted state by a position of the movable frame part which moves as opposed to the supporting frame part.

In order to attain the above objects, the above-mentioned card unit may also be constituted to further comprise a base part, which is provided in the frame, and a card fixing mechanism, in which a fixing position is adjusted according to the card, fixing the card on the base part. According to a constitution like this, it is possible to fix the card to the movable frame part through the base part without relating to a size or a shape of the card.

In order to attain the above objects, the above-mentioned card unit may also be constituted so that the attaching/detaching mechanism comprise a movable frame part which is loaded with the card and can be moved, a supporting frame part which is provided separately from the movable frame part, a slide part which is supported slidably at the supporting frame part, and a moving direction converting mechanism part, provided between the slide part and the movable frame part, which moves the movable frame part in a direction intersecting a moving direction of the slide part, and so that the card is attached to the connector and is detached from the connector by moving the movable frame part through the moving direction converting mechanism part by moving the slide part.

In order to attain the above objects, the above-mentioned card unit may also be constituted so that the locking mechanism is provided between the frame and a grip which is provided rotatably in a rotatable attaching/detaching lever making the frame expand and contract by its rotational operation, and can be released by a rotation of the grip. According to a construction like this, the expansion and contraction of the frame is locked, and it is possible to keep a loaded state of the card for the connector.

In order to attain the above objects, the above-mentioned card unit may also be constituted so that a moving start point starting a movement to the supporting frame part and a moving end point ending the movement to the supporting frame part are set to the attaching/detaching mechanism, and so that a maintaining part is also provided at one or both of the moving start point and the moving end point and maintains the movable frame part at a position of the moving start point and/or the moving end point. According to a constitution like this, the accuracy of an exchanging position of the card and the accuracy of an attaching position of the card and the connector are heightened.

In order to attain the above objects, the above-mentioned card unit may also be constituted to further include a positioning part which determines an attaching and detaching position between the connector and the card loaded on the movable frame part.

In order to attain the above objects, the above-mentioned card unit may also be constituted so that the moving direction converting mechanism part comprises a slide shaft attached to the slide part and a long hole, formed in the movable frame part, which is provided with some angle in a direction intersecting a moving direction of the slide shaft.

In order to attain the above objects, the above-mentioned card unit may also be constituted to further comprise a light guide part, provided in the supporting frame part, which guides a light to a front surface side of the card unit.

In order to attain the above objects, the above-mentioned card unit may also be constituted to further include a guide part, formed in the supporting frame part, which guides a movement of the slide shaft and also regulates its moving range.

In order to attain the above objects, the above-mentioned card unit may also be constituted so that the card unit further comprises a rail which is provided in the frame, and so that the card unit is attached to an external device by the rail. The above-mentioned card unit may also be constituted so that the card fixing mechanism has a fixing position adjusting mechanism which adjusts a fixing position correspondingly to the card. The above-mentioned card unit may also be constituted to further comprise a locking mechanism locking a movement of the movable frame part at a position at which the card is attached to the connector. The above-mentioned card unit may also be constituted so that an operation part which operates an external switch is provided at the slide part. The above-mentioned card unit may also be constituted so that the positioning part is included in an attaching/detaching lever, in a body, which moves the movable frame part by its rotation. Further, the above-mentioned card unit may also be constituted so that the positioning part is constituted by a positioning bar which is attached rotatably to the slide part.

In order to attain the above objects, a second technical side of the present invention is a device unit including a card unit, on which a card is loaded, in an attachable and detachable way, and is a constitution that comprises a base board part on which a connector attached to the card and detached from the card is mounted, and a housing part which covers the base board part and houses the card unit.

In order to attain the above objects, the above-mentioned device unit may also be constituted so that the card unit has a movable frame part which is loaded with the card and is moved, and so that the card is attached to the connector and is detached from the connector by a movement of the movable frame part.

In order to attain the above objects, the above-mentioned device unit may also be constituted so that the housing part has a rail part which supports slidably the card unit. The above-mentioned device unit may also be constituted so that the card unit comprises a frame, which is loaded with the card and is expanded and contracted, and an attaching/detaching mechanism which attaches the card to the connector and detaches the card from the connector by expanding and contracting the frame. The above-mentioned device unit may also be constituted so that the attaching/detaching mechanism comprises a movable frame part which is loaded with the card and can be moved, a supporting frame part which is provided separately from the movable frame part, a slide part which is supported slidably at the supporting frame part, and a moving direction converting mechanism part, provided between the slide part and the movable frame part, which moves the movable frame part in a direction intersecting a moving direction of the slide part, and so that the card is attached to the connector and is detached from the connector by moving the movable frame part through the moving direction converting mechanism part by moving the slide part.

In order to attain the above objects, a third technical side of the present invention is a card attaching/detaching method between a card loaded on a card unit and a connector, and is a constitution that comprises a process which moves a slide part in a direction intersecting a frame loaded with the card and converts a moving direction of the slide part, and a process which attaches the card to the connector and detaches the card from the connector by a movement of the frame operated by the slide part. According to a constitution like this, the frame is moved according to the slide part, and it is possible to perform the attaching and detaching between the card and the connector by a movement of the frame.

In order to attain the above objects, a fourth technical side of the present invention is an electronic apparatus having a card unit on which a card is loaded, and is constitution that comprises a device unit, which includes a card unit loaded with a card in an attachable and detachable way, in an attachable and detachable way. According to a constitution like this, it is possible to load various kinds of electronic apparatuses with a desired card by using the device unit which has the card unit loaded with the desired card.

In order to attain the above objects, the above-mentioned electronic apparatus may also be constituted to further comprise a switch which is switched according to attaching and detaching of the card unit, and a switching part which separates the connector accepting attaching and detaching of the card, which is an exchanged object, from a bus by a changeover of the switch. According to a constitution like this, it is possible to attach the card to the connector separated from the bus and to connect the bus with the connector to which the card has been attached. Because of this, it is possible to avoid the damage of the card and an influence to a device side, on which the card is loaded, due to the attaching and detaching of the card.

In order to attain the above objects, the above-mentioned electronic apparatus may also be constituted so that the card unit has a movable frame part which is loaded with the card and is moved, and so that the card is attached to the connector and is detached from the connector by a movement of the movable frame part.

In order to attain the above objects, a fifth technical side of the present invention is an electronic apparatus having a card unit loaded on a card, and is a constitution that a base board part on which a connector attached to the card and detached from the card is mounted, and a housing part which covers the base board part and houses the card unit. According to a constitution like this, it is possible to be applied to an electronic apparatus such as a server unit, loaded with a plurality of cards, in which a card exchange is needed.

In order to attain the above objects, the above-mentioned electronic apparatus may also be constituted so that the card unit comprises a frame, loaded with the card, which is expanded and contracted, and an attaching/detaching mechanism which attaches the card to the connector and detaches the card from the connector by expanding and contracting the frame. The above-mentioned electronic apparatus may also be constituted so that the attaching/detaching mechanism comprises a movable frame part which is loaded with the card and can be moved, a supporting frame part which is provided separately from the movable frame part, a slide part which is supported slidably at the supporting frame part, and a moving direction converting mechanism part, provided between the slide part and the movable frame part, which moves the movable frame part in a direction intersecting a moving direction of the slide part, and so that the card is attached to the connector and is detached from the connector by moving the movable frame part through the moving direction converting part mechanism by moving the slide part.

The technical features and advantages of the present invention are as in the following.

(1) A tool such as a screw-driver is unnecessary for the attaching and detaching in an exchange of various kinds of cards, for example, a printed circuit board. Or, its use is reduced. Because of this, the attaching and detaching management of a card can be made easy.

(2) Since an attaching and detaching position of a card accompanied by a card exchange is regulated, there is no deviation in an positional relation between a connector and a card which is an attached and detached object. Because of this, the attaching and detaching accuracy between the card and the connector may be improved.

BRIEF DESCRIPTION OF THE DRAWINGS

The foregoing and other objects, features and attendant advantages of the present invention will be appreciated as the same become better understood by means of the following description and accompanying drawings wherein.

DETAILED DESCRIPTION OF THE PREFERRED EMBODIMENTS

First Embodiment

Figure 1:
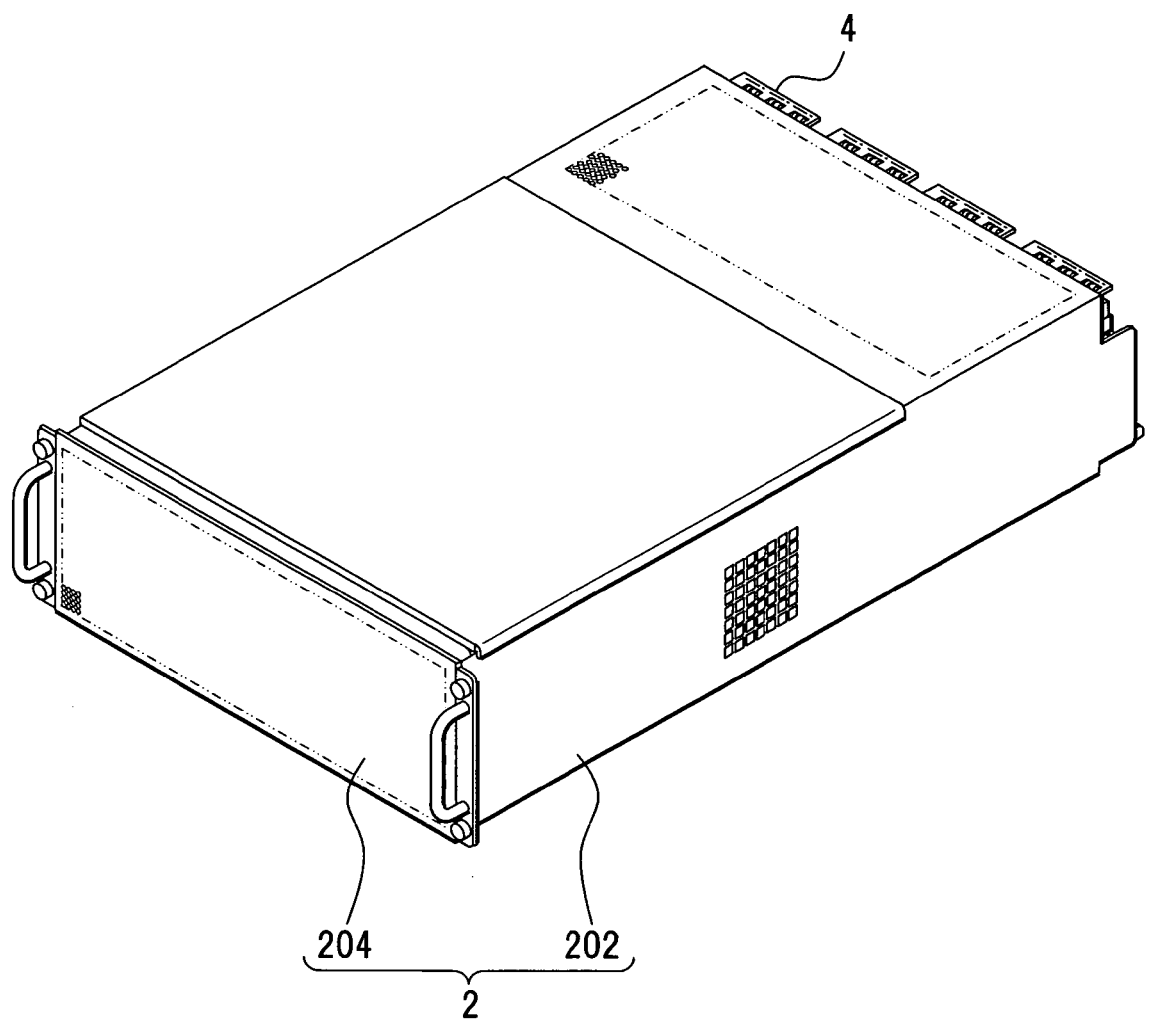
FIG. 1 is a perspective view showing a server unit according to a first embodiment in a case of looking from its front side.
Figure 2:
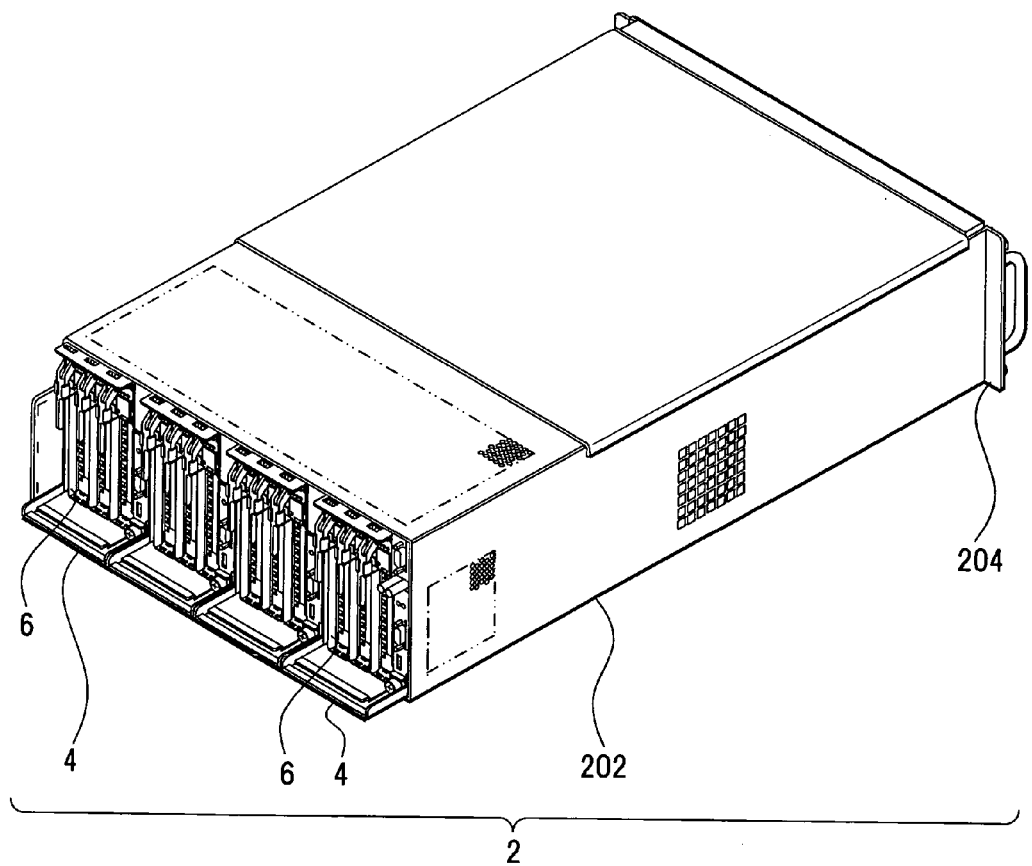
FIG. 2 is a perspective view showing the server unit in a case of looking from its rear side.
Figure 3:
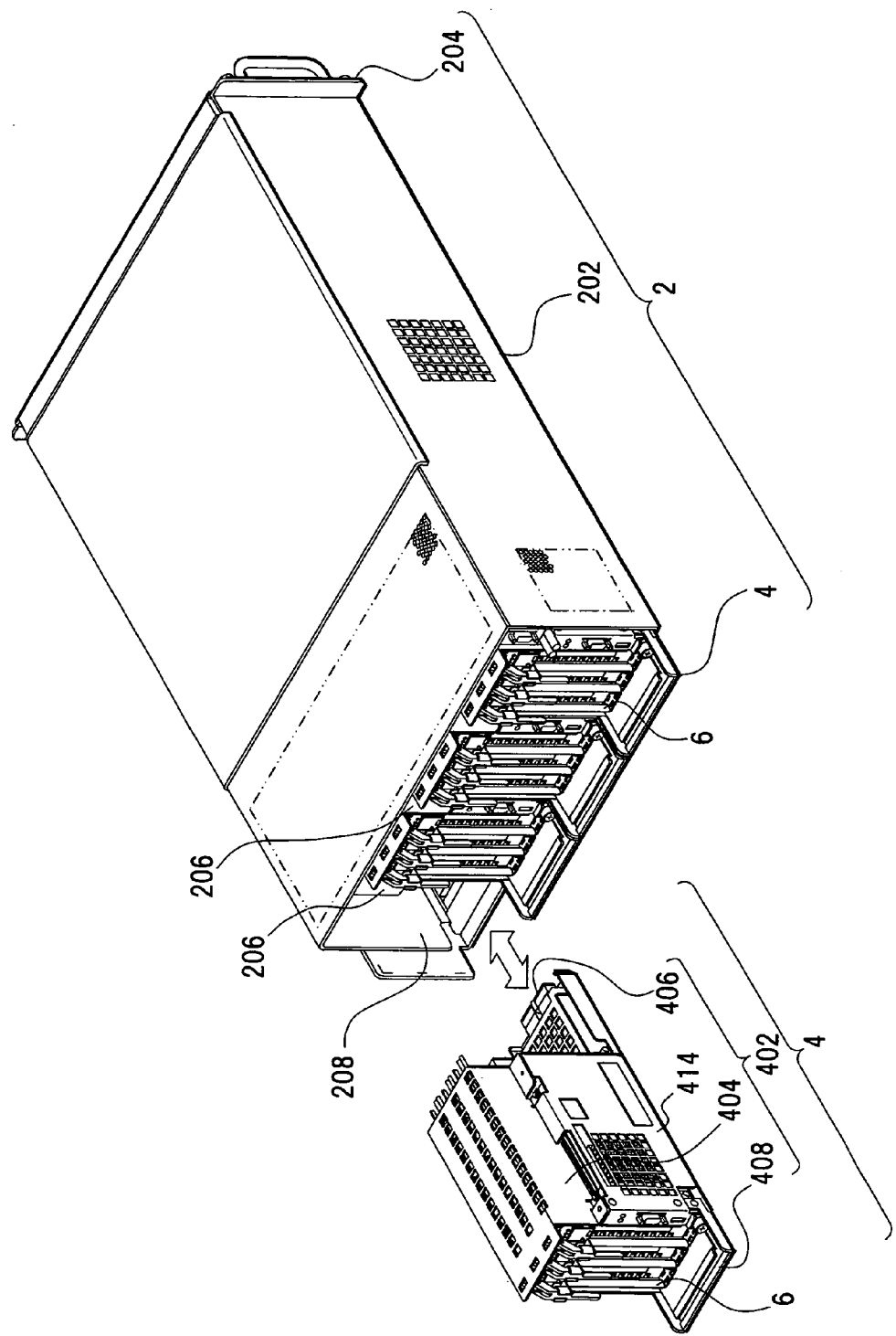
FIG. 3 is a perspective view showing the server unit and a device unit before mounted on the server unit 2.

An electronic apparatus and a device unit according to a first embodiment of the present invention are explained by referring to FIG. 1, FIG. 2 and FIG. 3. FIG. 1 is a perspective view showing a server unit in a case of looking from its front side, FIG. 2 is a perspective view showing the server unit in a case of looking from its rear side, and FIG. 3 is a perspective view showing the server unit and the device unit before mounted on the server unit 2. In FIG. 1 through FIG. 3, the same portions are indicated by the same reference numerals.

In FIG. 1 through FIG. 3, the server unit 2 is shown as an example of an electronic apparatus. On the server unit 2, one or a plurality of device units 4 are mounted in an attachable and detachable way. The device units 4 constitute a part of the server unit 2. On the device unit 4, one or a plurality of card units 6 are mounted in an attachable and detachable way.

In the server unit 2, a front panel part 204 is provided at a front side of the main body case 202, and the device units 4 mentioned before are mounted at its rear side in an attachable and detachable way. A plurality of device unit attaching/detaching parts 208 which are divided by partition walls 206 are set in the main body case 202, and, in this embodiment, four sets of device units 4 are mounted. Each of the device units 4 has a shelf 402 which is attached to the main body case 202 and is detached from the main body case 202. A plurality of card units 6 are mounted on the shelf 402, and, in this embodiment, a maximum number of three sets of card units 6 are mounted. On the card unit 6, a card 8 (FIG. 14) such as a printed circuit board is loaded in an attachable and detachable way.

In the shelf 402 of each device unit 4, a square-cylindrical shaped housing part 404 which covers the card units 6 is provided, and a connector 406 for the purpose of connecting with an internal circuit of the server unit 2 is mounted. Along with this, a handle part 408 for the purpose of operating the shelf 402 is formed in the shelf 402. The device unit 4 is installed in the device unit attaching/detaching part 208 of the main body case 202 so that the handle part 408 is projected from the rear part of the server unit 2.

According to a constitution like this, as shown in FIG. 3, it is possible to draw out the device unit 4 or the shelf 402 from the main body part 202. Also concerning the main body part 202, if the shelf 402 or the device unit 4 is housed, it is possible to connect the internal circuit of the server unit 2 to the connector 406. Further, it is possible to attach and detach the card unit 6 in both cases of on the main body case 202 and on the device unit 4 separated from the server unit 2.

Figure 4:
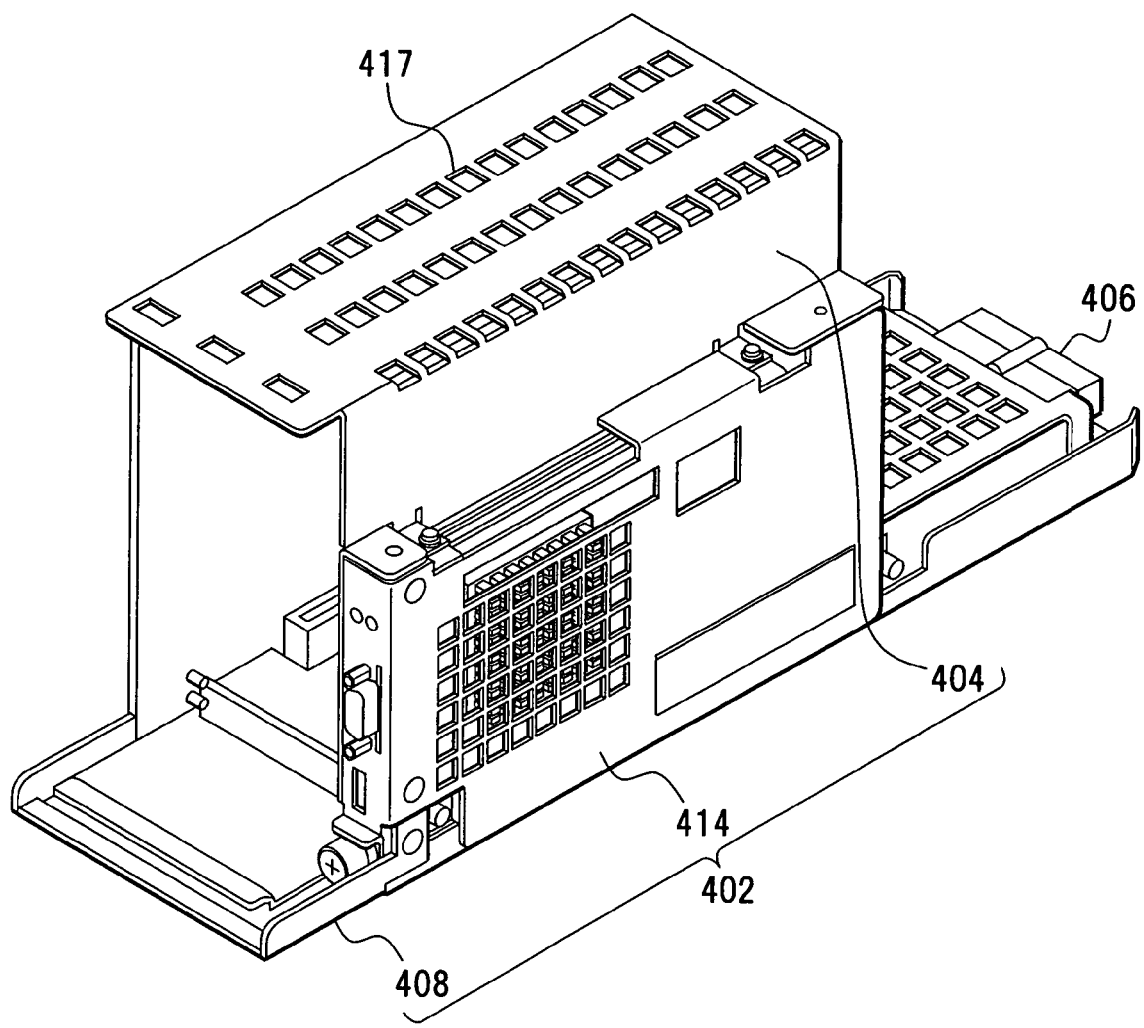
FIG. 4 is a perspective view showing a shelf in a case of looking from its front side.
Figure 5:
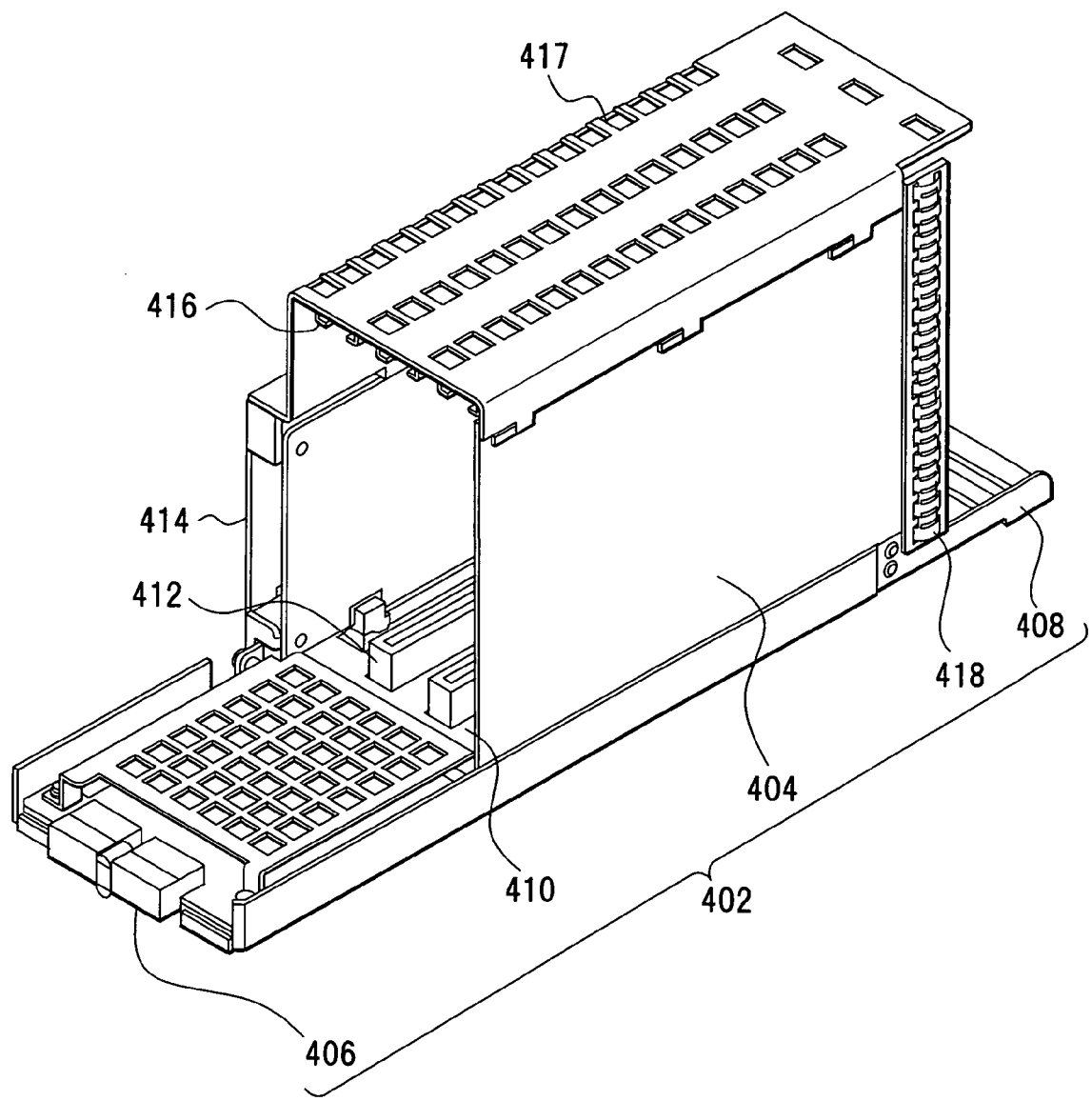
FIG. 5 is a perspective view showing the shelf in a case of looking from its rear side.
Figure 6:
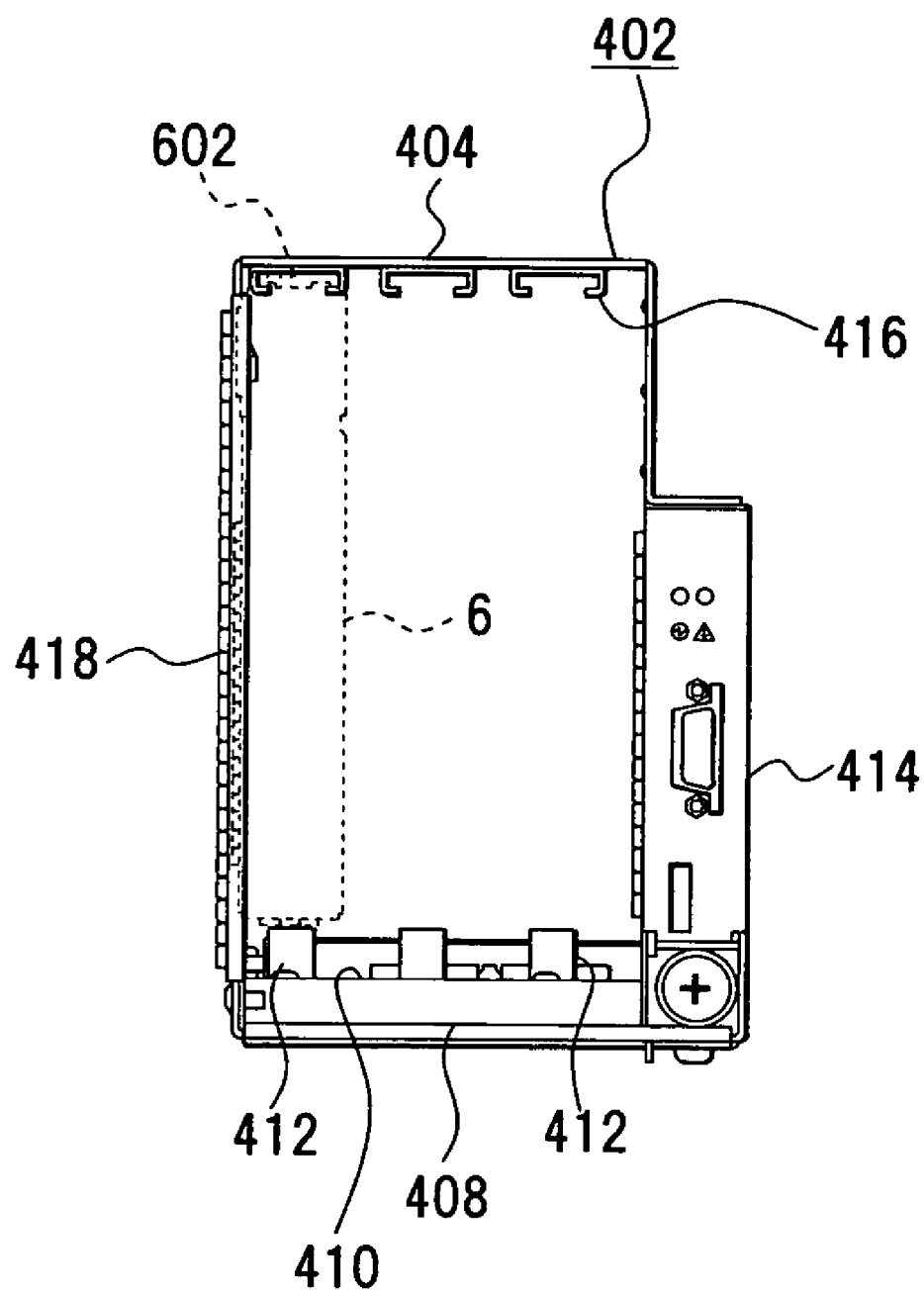
FIG. 6 is a front view showing the shelf.
Figure 7:
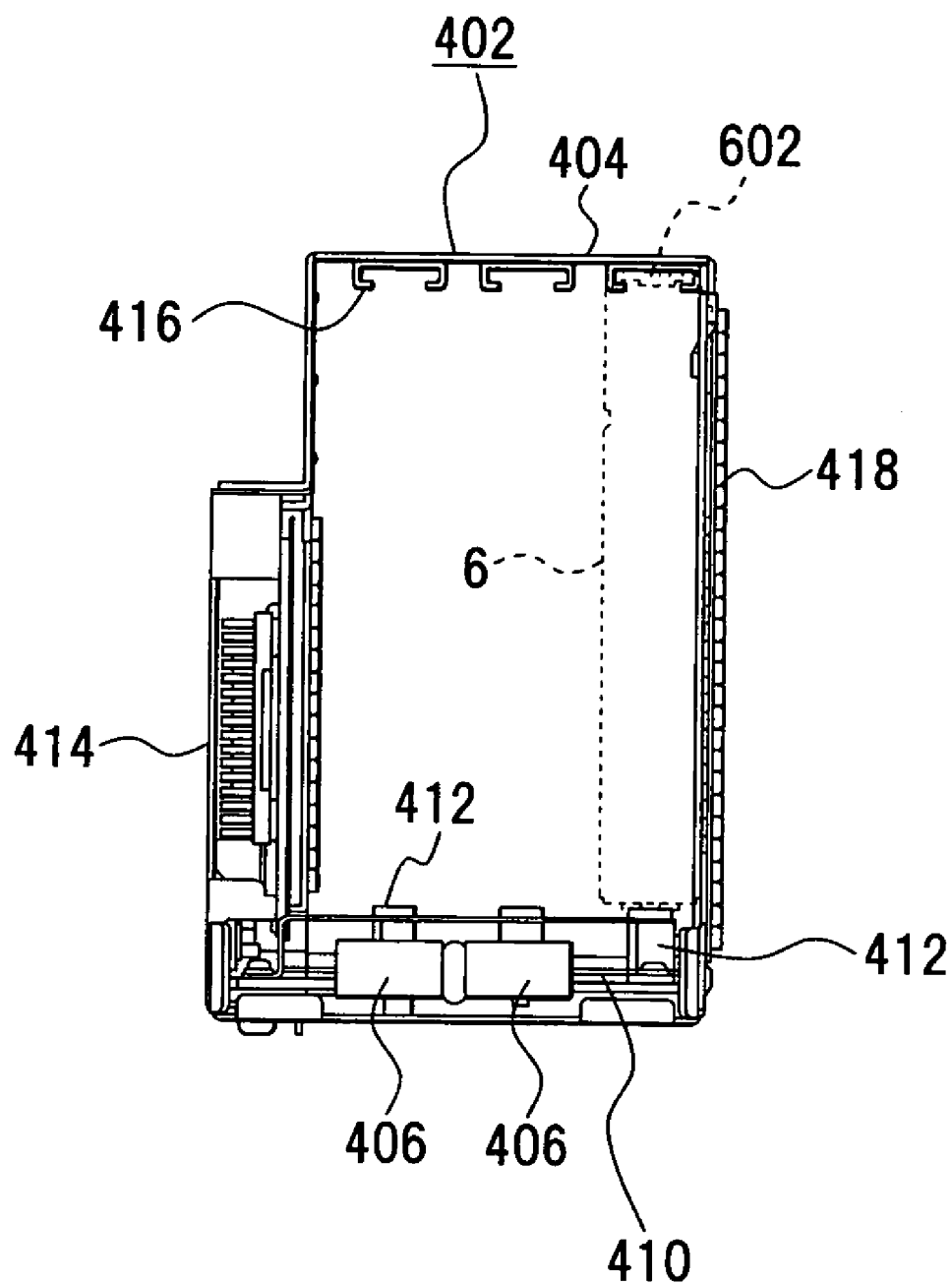
FIG. 7 is a rear view showing the shelf.
Figure 8:
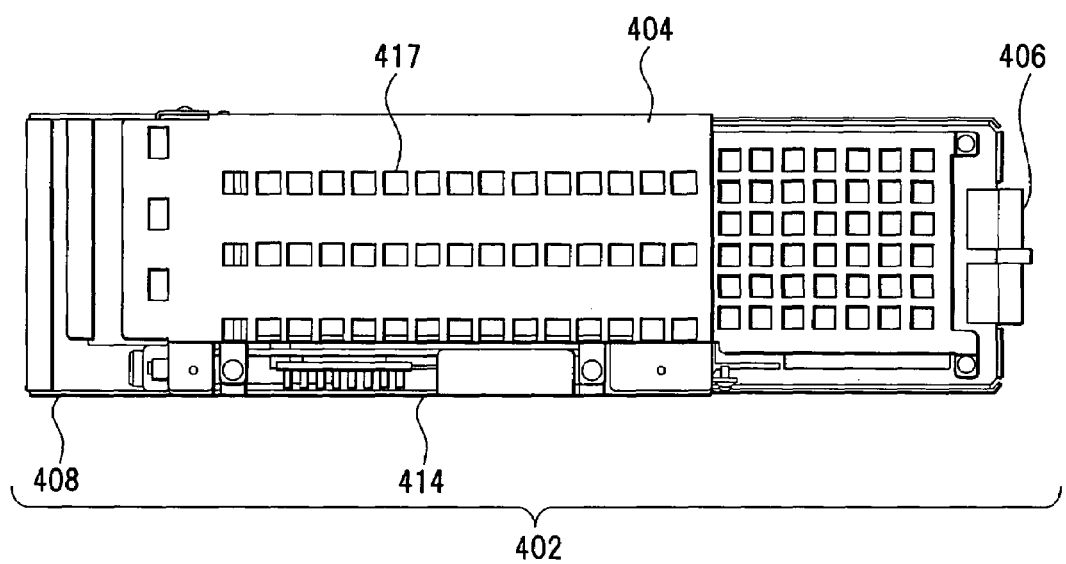
FIG. 8 is a plan view showing the shelf.
Figure 9:
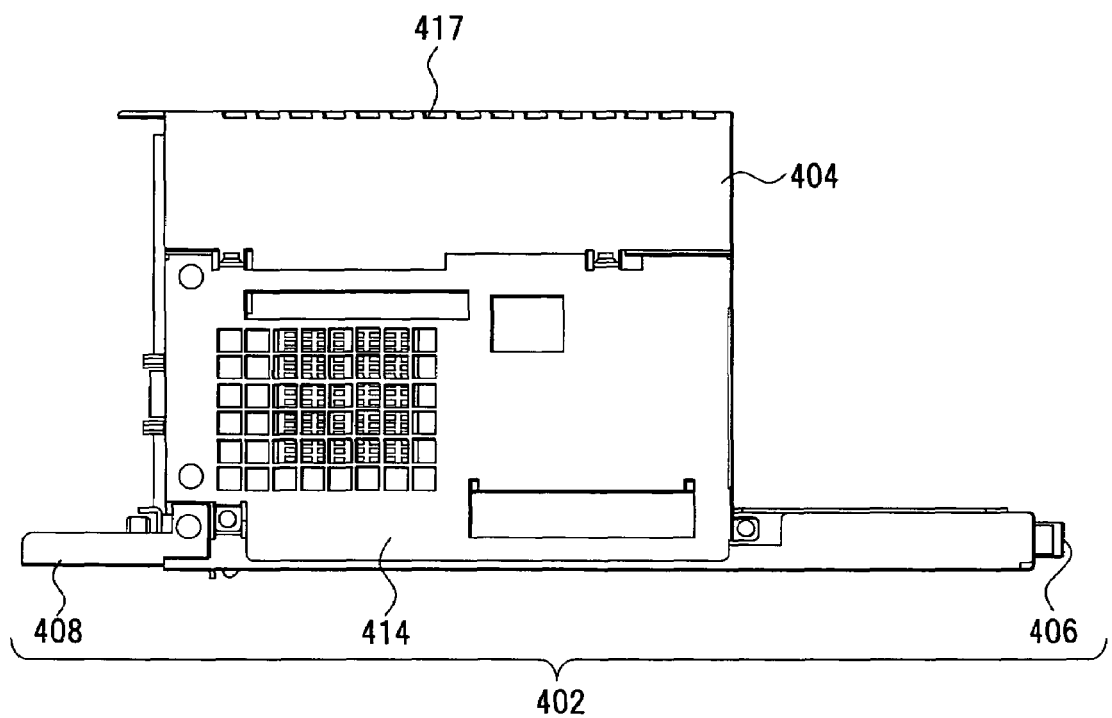
FIG. 9 is a right side view showing the shelf.
Figure 10:
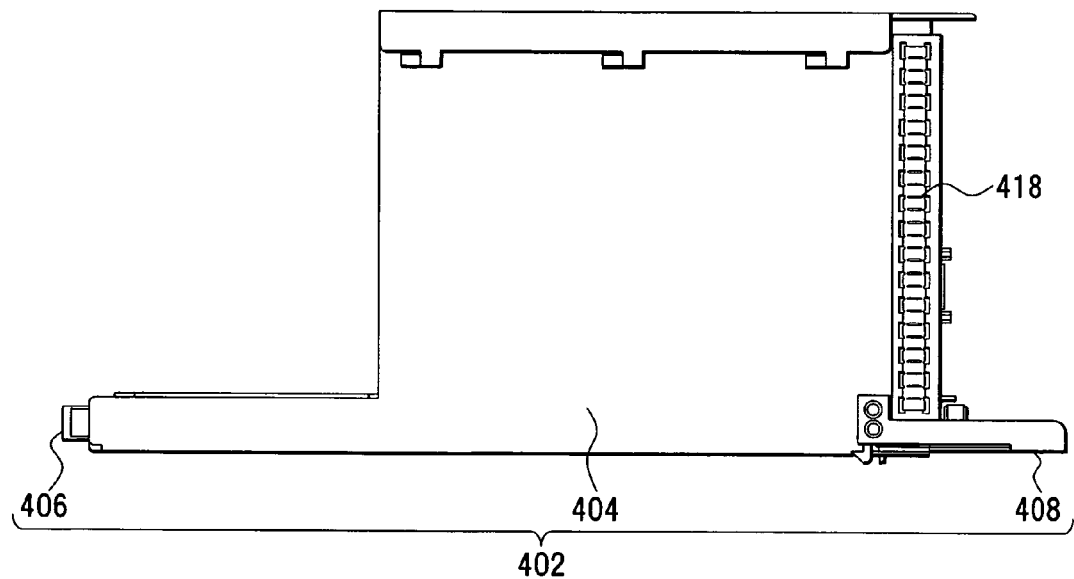
FIG. 10 is a left side view showing the shelf.

Next, the shelf 402 of the device unit 4 is explained by referring to FIG. 4, FIG. 5, FIG. 6, FIG. 7, FIG. 8, FIG. 9 and FIG. 10. FIG. 4 is a perspective view showing the shelf in a case of looking from its front side, FIG. 5 is a perspective view showing the shelf in a case of looking from its rear side, FIG. 6 is a front view showing the shelf, FIG. 7 is a rear view showing the shelf, FIG. 8 is a plan view showing the shelf, FIG. 9 is a right side view showing the shelf, and FIG. 10 is a left side view showing the shelf. In FIG. 4 through FIG. 10, the same portions as those of FIG. 1 through FIG. 3 are indicated by the same reference numerals.

On an upper surface part of the shelf 402, a plurality of connectors 412 corresponding to the card units 6 together with a base board 410 are mounted. Further, on this upper surface part, the housing part 404 mentioned previously, formed by a metal plate as an example, which covers these connectors 412 is mounted, and a control part 414 and so on are also mounted. At a ceiling part of the housing part 404, shelf rails 416 as a plurality of rail portions are provided oppositely to each connector 412. A rail 602 (FIG. 11) of the card unit 6 side is engaged with each shelf rail 416, and the card unit 6 is slidably supported in a dangling state.

Further, at the ceiling part of the housing part 404 of the shelf 402, a plurality of air holes 417 are formed. Furthermore, at a side part of the housing part 404, a spring 418 for the purpose of closely contacting with the partition wall 206 of the main body case 202 of the server unit 2 is provided.

According to a constitution like this, by inserting the rail 602 of the card unit 6 into the shelf rail 416 of the housing part 404 to slide it under the dangling state, it is possible to move the card unit 6 to a position corresponding to the connector 412.

Further, it is possible to closely contact the housing part 404 with the partition wall 206 of the server unit 2 by the spring 418. By this, the leak prevention of an electromagnetic wave is given, for example, and a shielding effect may be heightened.

Figure 11:
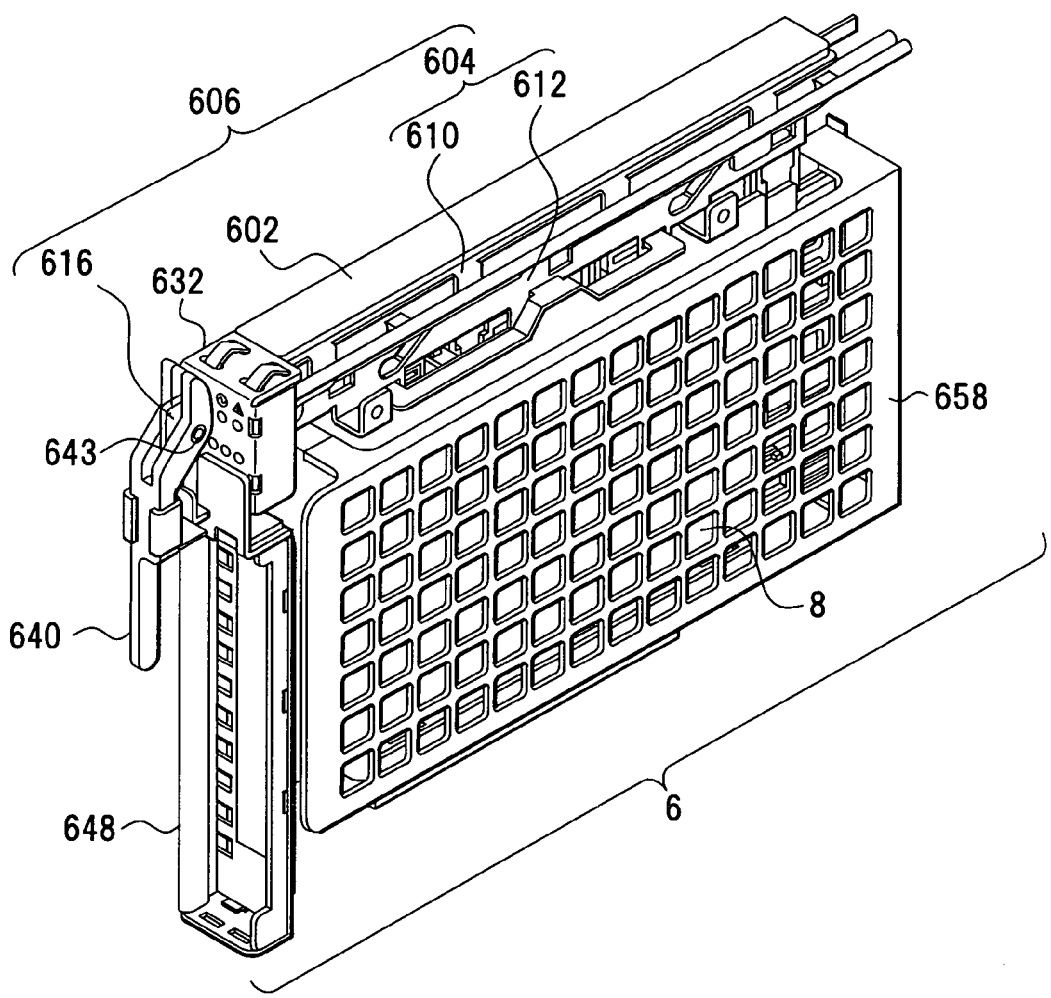
FIG. 11 is a perspective view showing a card unit in a case of looking from its front side.
Figure 12:
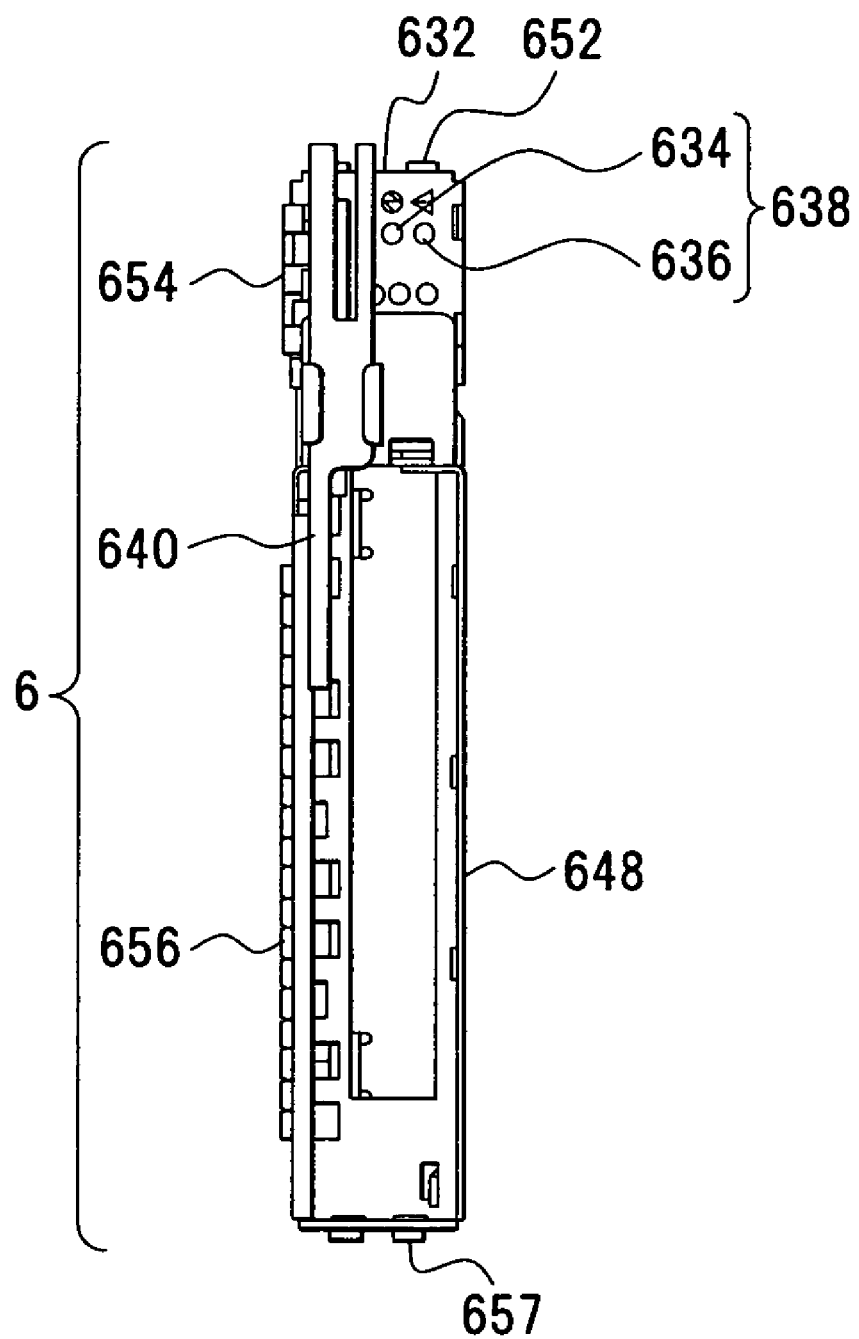
FIG. 12 is a front view showing the card unit.
Figure 13:
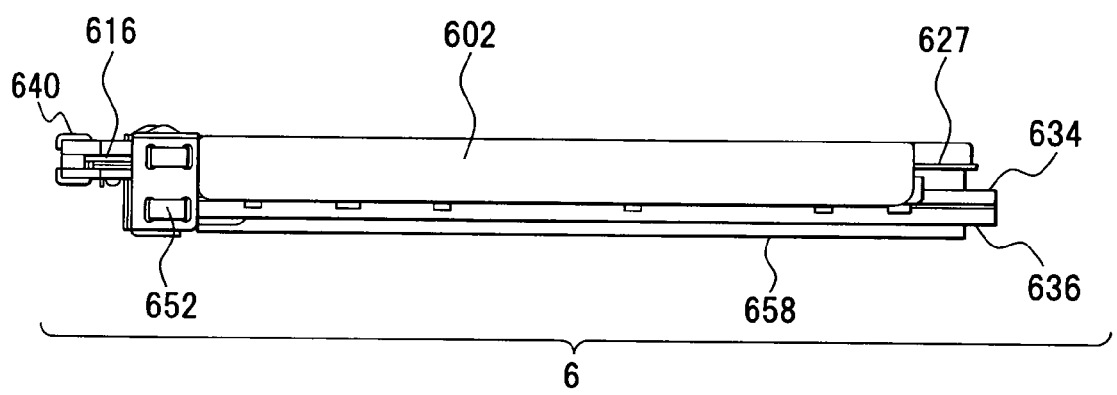
FIG. 13 is a plan view showing the card unit.
Figure 14:
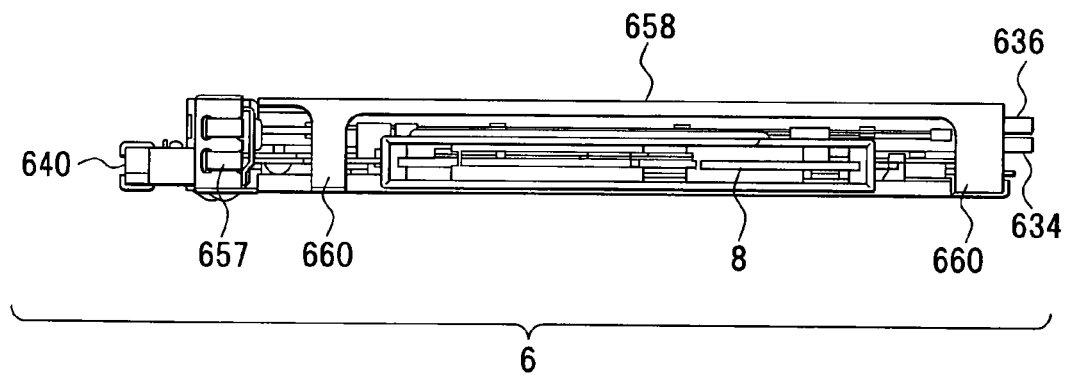
FIG. 14 is a bottom view showing the card unit.
Figure 15:
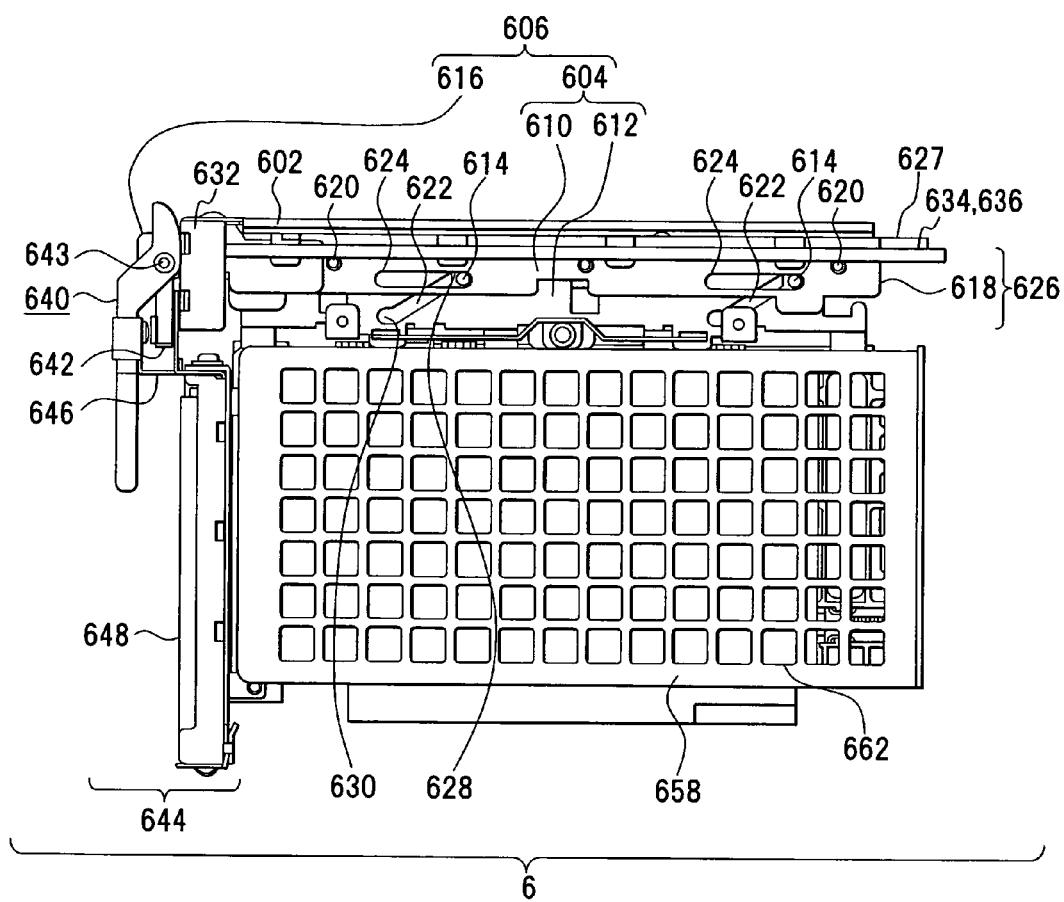
FIG. 15 is a right side view showing the card unit.
Figure 16:
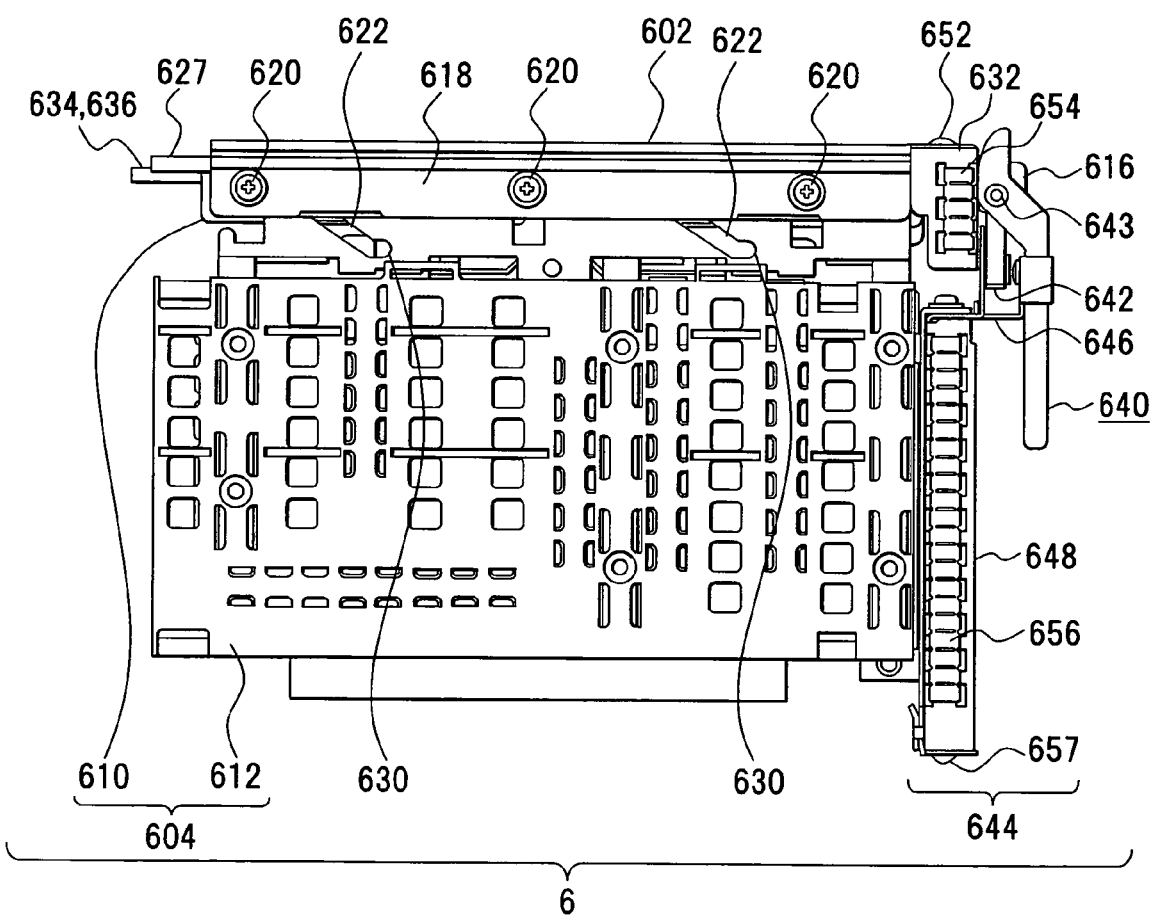
FIG. 16 is a left side view showing the card unit.

Next, the card unit is explained by referring to FIG. 11, FIG. 12, FIG. 13, FIG. 14, FIG. 15 and FIG. 16. FIG. 11 is a perspective view showing the card unit in a case of looking from its front side, FIG. 12 is a front view showing the card unit, FIG. 13 is a plan view showing the card unit, FIG. 14 is a bottom view showing the card unit, FIG. 15 is a right side view showing the card unit, and FIG. 16 is a left side view showing the card unit. In FIG. 11 through FIG. 16, the same portions as those of FIG. 3, FIG. 6 and FIG. 7 are indicated by the same reference numerals.

In the card unit 6, a frame 604 which is loaded with a card 8 such as a printed circuit board and can be expanded and contracted is installed, and an attaching/detaching mechanism 606 which attaches the card to the connector 412 and detaches the card 8 from the connector 412 by the expansion and contraction of the frame 604 is also installed. The frame 604 has a supporting frame part 610 and a movable frame part 612, and is a constitution that the frame 604 is expanded and contracted by moving the movable frame part 612 against the supporting frame part 610. That is, the frame 604 is constituted so that the movable frame part 612 is connected to the supporting frame part 610 through a slide plate 616 and a plurality of slide shafts 614, and so that the movable frame part 612 is moved by a movement of the slide plate 616. The card 8 is loaded on the movable frame part 612, and this card 8 is attached to the connector 412 of the device unit 4 and is detached from the connector 412 according to the movement of the movable frame part 612.

The supporting frame part 610 and the slide plate 616 are provided at an upper edge part side of the movable frame part 612 to sandwich the movable frame part 612 between them. Further, a rail 602 which is engaged with the shelf rail 416 mentioned previously is attached to the supporting frame part 610. To this rail 602, a guide part 618 which covers the slide plate 616 is provided. This guide part 618 makes a fixed space maintain between the supporting frame part 610 and the slide plate 616, and is also fixed to the supporting frame part 610 by a plurality of screws 620. That is, the slide plate 616 can slide between the supporting frame part 610 and the guide part 618.

To the slide plate 616, the plurality of slide shafts 614 are fixed in a direction which crosses at right angles with its slide direction. To the movable frame part 612, a plurality of inclined holes 622 inclined in a direction which intersects a moving direction of the slide shafts 614 are formed, and the slide shafts 614 pierce each inclined hole 622. Further, to the supporting frame part 610, guide holes 624 are formed correspondingly to the moving directions of the slide shafts 614. By this, a moving direction converting part 626 is constituted. That is, the slide shafts 614 which move together with the slide plate 616 engage with the inclined holes 622 of the movable frame part 612, and, by this, the movable frame part 612 can be moved in a direction which intersects the moving direction of the slide shafts 614. This moving direction converting part 626 constitutes a moving direction converting mechanism which converts the moving direction of the movable frame part 612 into the direction which intersects the moving direction of the slide plate 616.

At each end part of the inclined holes 622, maintaining surface parts 628 and 630 are formed as maintaining parts which maintain the slide shafts 614. If the slide shaft 614 reaches the maintaining surface part 628 or the maintaining surface part 630, the movable frame part 612 is maintained in a static state.

Like this, under a state that the card unit 6 is maintained in the housing part 404 of the device unit 4 by the rail 602, the movable frame part 612 is moved according to the movement of the slide plate 616 of the moving direction converting part 626. By this, it is possible to attach the card 8 loaded on the movable frame part 612 to the connector 412 mentioned previously, and to detach the card 8 from the connector 412. Further, at a pointed end part of the slide plate 616, an operation part 627 used for a switch operation is formed.

Furthermore, a front panel part 632 is attached at a front end part of the supporting frame part 610. Further, as a light guide part attached to the supporting frame part 610, pointed end parts of a plurality of light pipes 634 and 636 are exposed to the front panel part 632. By this, an indicator part 638 is constituted. Light is guided to a side of the front panel part 632 from a rear part of the card unit 6 through these light pipes 634 and 636.

To a front end side of the slide plate 616, an attaching/detaching lever 640 which is used for the operation of attaching and detaching of the card 8 is attached rotatably by a supporting shaft 643, and a positioning bar 642 for the purpose of determining a moving start point of the slide plate 616 and the movable frame part 612 is also attached rotatably by the supporting shaft 643.

At a portion between the attaching/detaching lever 640 and the movable frame part 612, provided is a locking mechanism 644 which locks the movement of them both. To the attaching/detaching lever 640 a locking arm 646 is attached slidably, and a pointed end part of this locking arm 646 is inserted into a locking hole 650 of a reinforcing frame part 648 attached to the movable frame part 612, and is engaged with the movable frame part 612. By this, a locking state in which the movement of the movable frame part 612 is prevented is maintained.

In order to complement a gap between the card unit 6 and the housing part 404, to the front panel part 632 a shielding spring 652 composed of a spring plate as an example is attached at its upper part. Along with this, also at its side surface part a shielding spring 654 is attached in order to complement a gap between this card unit 6 and another card unit 6 adjacent to this card unit 6. Similarly, also at a side surface part and a bottom surface part of the reinforcing frame part 648, shielding springs 656 and 657 are attached in order to complement a gap between this card unit 6 and another card unit 6 adjacent to this card unit 6.

To the movable frame part 612, a protection cover 658 for protection of the card 8 is attached. To this protection cover 658, a plurality of mounting arm parts 660 for the purpose of mounting the protection cover 658 on the movable frame part 612 in an attachable and detachable way are provided. The protection cover 658 is integrally formed of synthetic resin, for example. By this, the protection cover 658 softens external force against the card 8 with the flexibility of a material. Along with this, the protection cover 658 has a plurality of ventilating holes 662, and prevents the overheating of the card 8.

Figure 17:
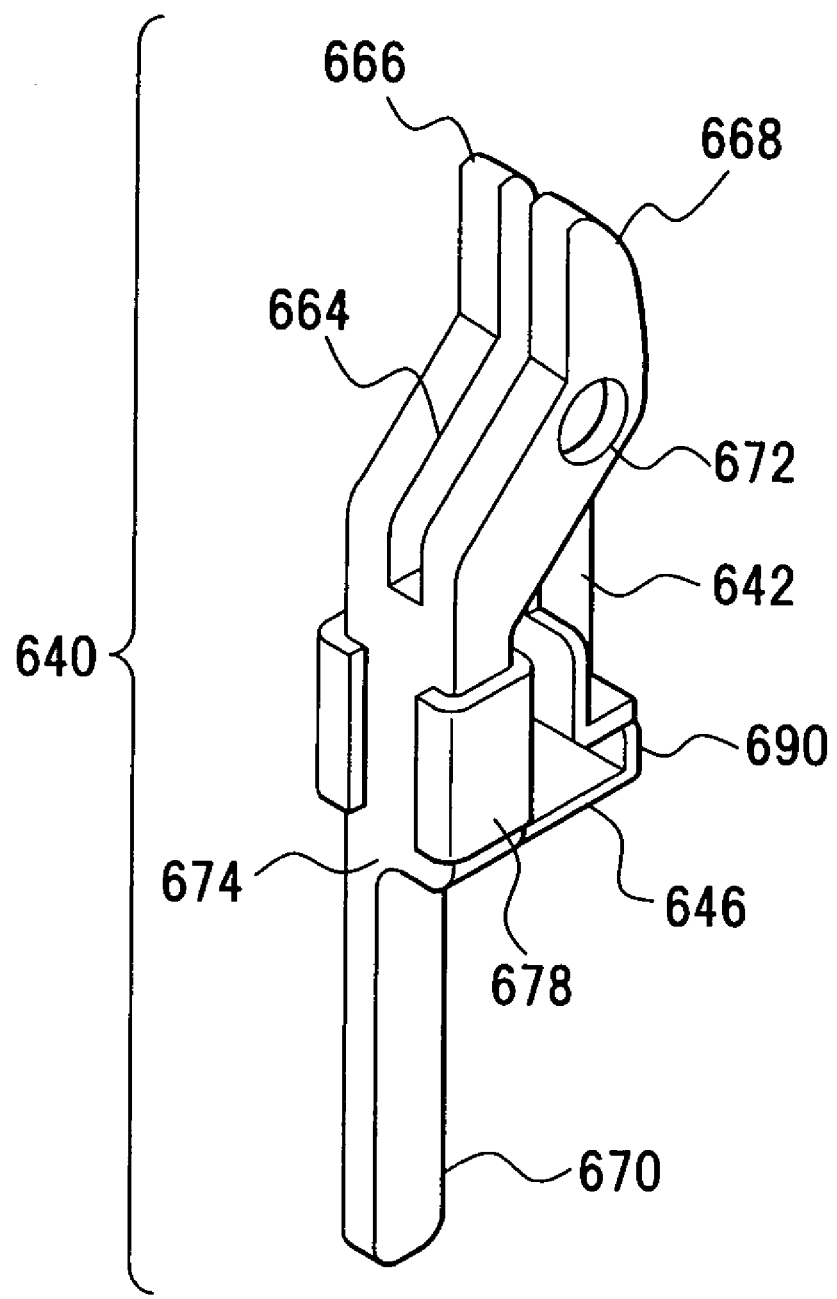
FIG. 17 is a drawing which shows an attaching/detaching lever in a case of looking from its front side.
Figure 18:
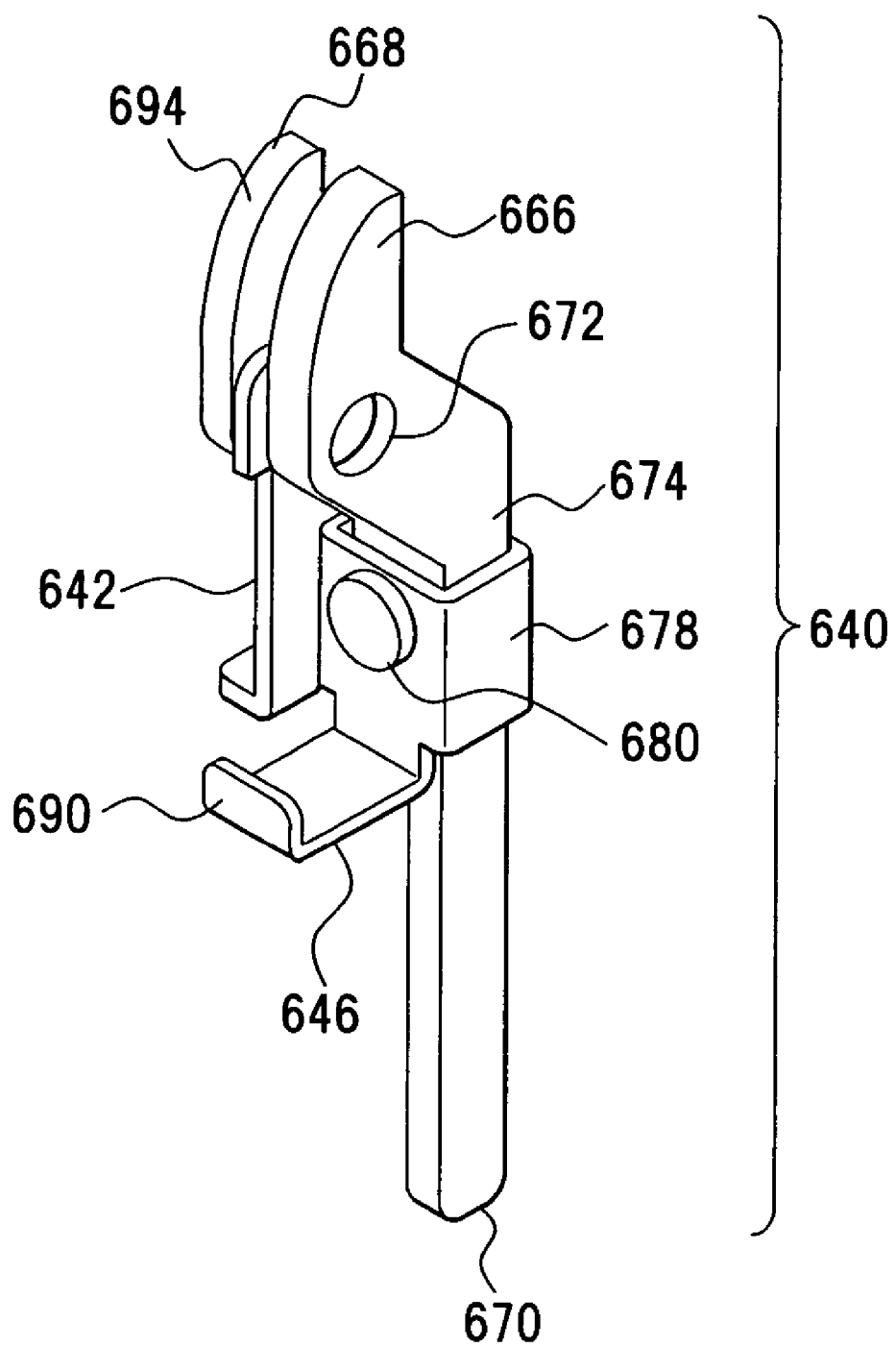
FIG. 18 is a drawing which shows the attaching/detaching lever in a case of looking from its rear side.
Figure 19:
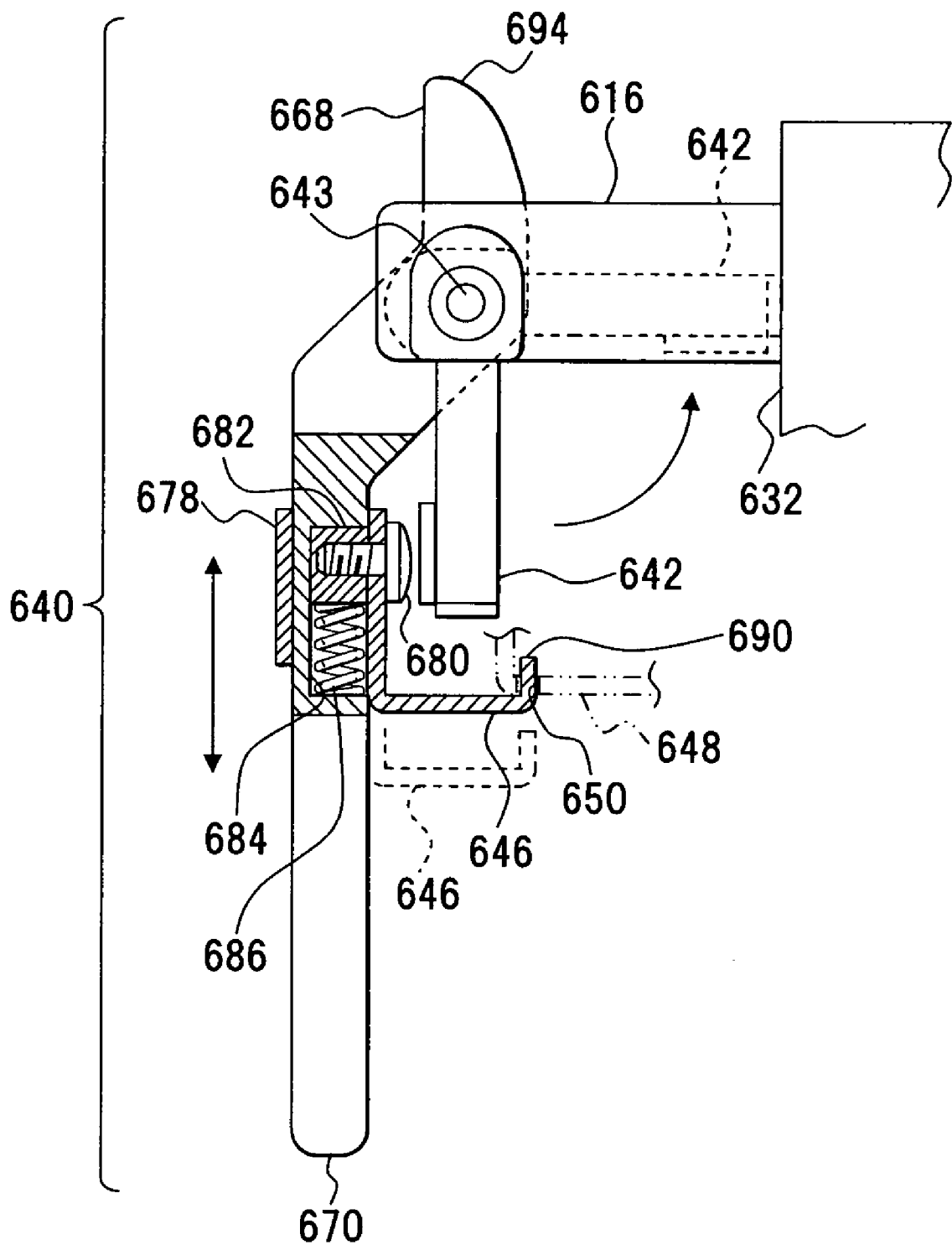
FIG. 19 is a side view showing the attaching/detaching lever and a slide plate in which its part is shown by a section.

Next, the attaching/detaching lever 640 is explained by referring to FIG. 17, FIG. 18 and FIG. 19. FIG. 17 is a drawing which shows the attaching/detaching lever in a case of looking from its front side, FIG. 18 is a drawing which shows the attaching/detaching lever in a case of looking from its rear side, and FIG. 19 is a side view showing the attaching/detaching lever and the slide plate in which its part is shown by a section. In FIG. 17 through FIG. 19, the same portions as those of FIG. 11 through FIG. 16 are indicated by the same reference numerals.

To the attaching/detaching lever 640, a pair of lever pieces 666 and 668 is provided by giving a slit part 664, and a grip part 670 is also formed. A positioning bar 642 is caught into each of the lever pieces 666 and 668 together with the slide plate 616 (FIG. 15). Along with this, in each of the lever pieces 666 and 668, a supporting hole 672 in which the supporting shaft 643 for the purpose of rotatably supporting them is penetrated is formed. A slide part 678 of the locking arm 646 is attached slidably to a main body part 674 of the attaching/detaching lever 640. To this slide part 678 a slider 682 is fixed by a fixing screw 680, and this slider 682 is housed in a space part 684 of the main body part 674 together with a spring 686 of a compressed state. A restoring force of this spring 686 acts between the locking arm 646 and the main body part 674, and the locking arm 646 is maintained in a lock position. A hook part 690 of the locking arm 646 is inserted into the locking hole 650 of the reinforcing frame part 648 of the movable frame part 612, and the movable frame part 612 is locked with the slide plate 616 through the locking arm 646. If an operator presses down the slide part 678 against the restoring force of the spring 686, the locking arm 646 can be moved to a lock releasing position of the grip 670 side.

In the lever pieces 666 and 668, cam surfaces 694 are formed for the purpose of moving the lever pieces 666 and 668 while contacting with a front surface part of the front panel part 632. The cam surfaces 694 are formed in a curved surface because of smoothing a rotation.

Further, as shown in FIG. 19, in a state that the slide plate 616 is drawn out from the front panel part 632, a position at which the pointed end part of the positioning bar 642 is closely contact with the front panel part 632 is the moving start point of the slide plate 616 and the movable frame part 612. At this position a contact with the positioning bar 642 from the front panel part 632 is released, and, if the movable frame part 612 is lowered by advancing the slide plate 616, the card 8 is properly inserted into a predetermined connector 412.

Figure 20A:
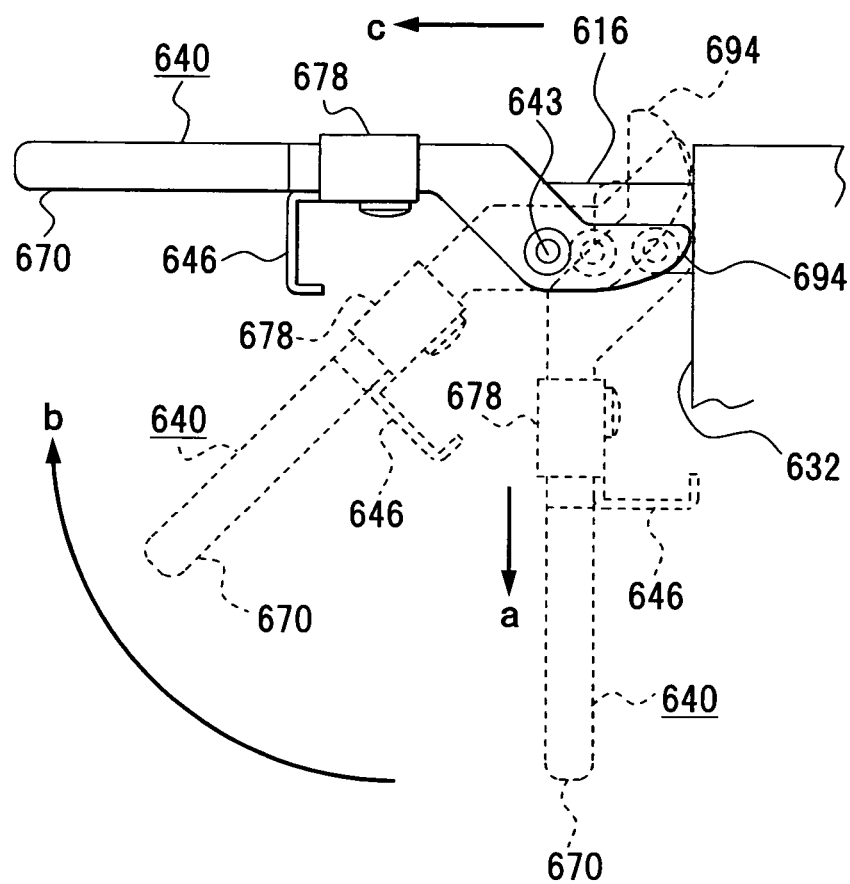
FIG. 20A is a drawing which shows a rotating operation of the attaching/detaching lever.
Figure 20B:
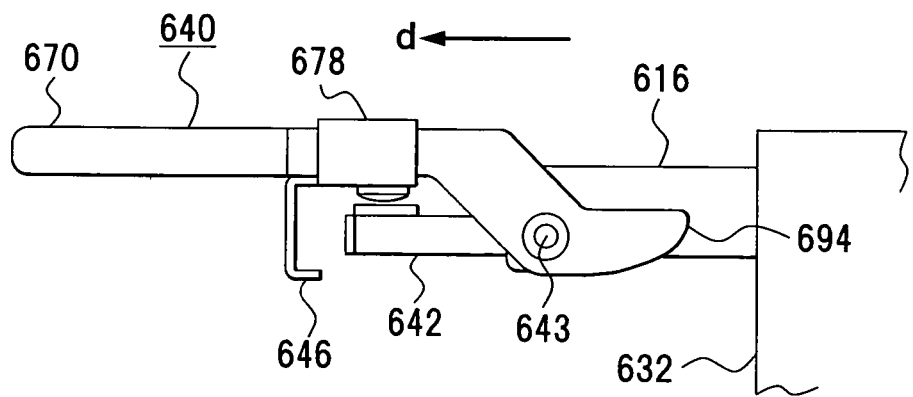
FIG. 20B is a drawing which shows a drawing-out operation of the slide plate.

Next, the operation of the attaching/detaching lever 640 and the slide plate 616 is explained by referring to FIG. 20A and FIG. 20B. FIG. 20A is a drawing which shows a rotating operation of the attaching/detaching lever, and FIG. 20B is a drawing which shows a drawing-out operation of the slide plate. In FIG. 20A and FIG. 20B, the same portions as those of FIG. 11 through FIG. 19 are indicated by the same reference numerals.

In FIG. 20A, if a locked state of the locking arm 646 is released by moving the slide part 678 of the attaching/detaching lever 640 in a direction shown by an arrow (a), and if the grip 670 is rotated in a direction shown by an arrow (b), the cam surfaces 694 roll on the front surface of the front panel part 632, and the supporting shaft 643 separates from the front panel part 632. As a result of this, the slide plate 616 is drawn out in a direction shown by an arrow (c).

As shown in FIG. 20B, if the slide plate 616 is drawn out in a direction shown by an arrow (d) under a state that the attaching/detaching lever 640 is maintained on an extension line (horizontality) of the slide plate 616, the movable frame part 612 moves to an uppermost part by the movement of the slide plate 616.

Further, in a case of lowering the movable frame part 612, as shown in FIG. 19, the slide plate 616 is maintained at a position at which the positioning bar 642 hits the front panel part 632, and, as shown in FIG. 20A, by rotating the attaching/detaching lever 640 in a direction opposite to the arrow (b), the movable frame part 612 can be lowered to a predetermined position from the above position. By this, it is possible to insert the card 8 into the connector 412 properly.

Figure 21A:
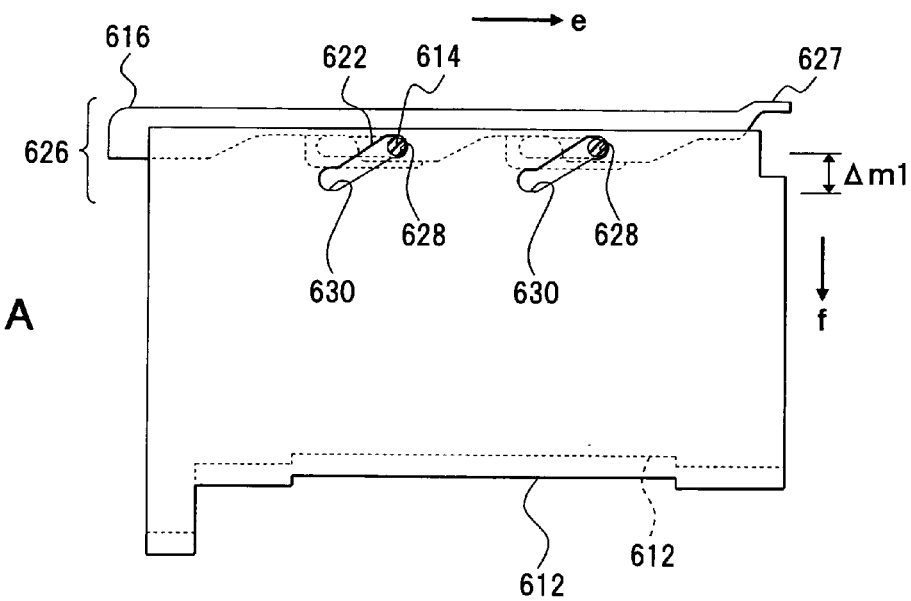
FIG. 21A is a drawing which shows an inserted state of the slide plate.
Figure 21B:
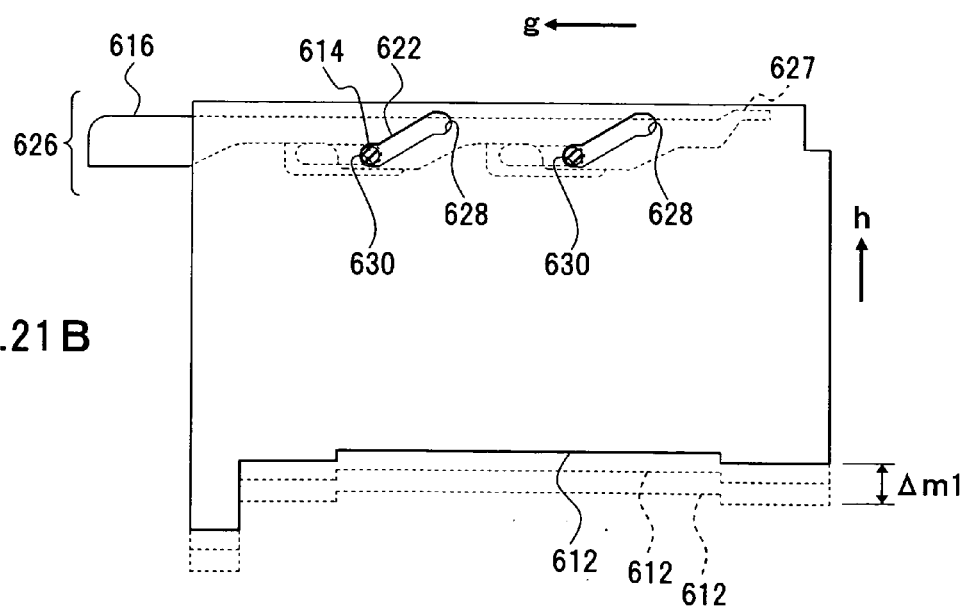
FIG. 21B is a drawing which shows a drawn-out state of the slide plate.

Next, the action of the moving direction converting part 626 is explained by referring to FIG. 21A and FIG. 21B. FIG. 21A is a drawing which shows an inserted state of the slide plate, and FIG. 21B is a drawing which shows a drawn-out state of the slide plate. In FIG. 21A and FIG. 21B, the same portions as those of FIG. 1 through FIG. 20 are indicated by the same reference numerals.

As shown in FIG. 21A, if the slide plate 616 is moved in a direction shown by an arrow (e), the slide shafts 614 move to a top dead point side through the inclined holes 622 of the movable frame part 612, and the movable frame part 612 falls in a direction shown by an arrow (f). The conversion of the moving direction by the moving direction converting part 626 is executed. The slide shafts 614 are maintained at the maintaining surface parts 628 which exist at the end part of the inclined holes 622, and the movable frame part 612 is kept in the static state. In this case, a moving range of the slide shafts 614 is a moving distance $\Delta m1$ of the movable frame part 612.

Further, as shown in FIG. 21B, if the slide plate 616 is moved in a direction shown by an arrow (g), the slide shafts 614 move to a bottom dead point side through the inclined holes 622 of the movable frame part 512, and the movable frame part 612 rises in a direction shown by an arrow (h). The slide shafts 614 are maintained at the maintaining surface parts 630 which exist at the end part of the inclined holes 622, and the movable frame part 612 is kept in the static state. That is, the movable frame part 612 is to rise by the moving distance $\Delta m1$ according to the moving range of the slide shafts 614.

Figure 22:
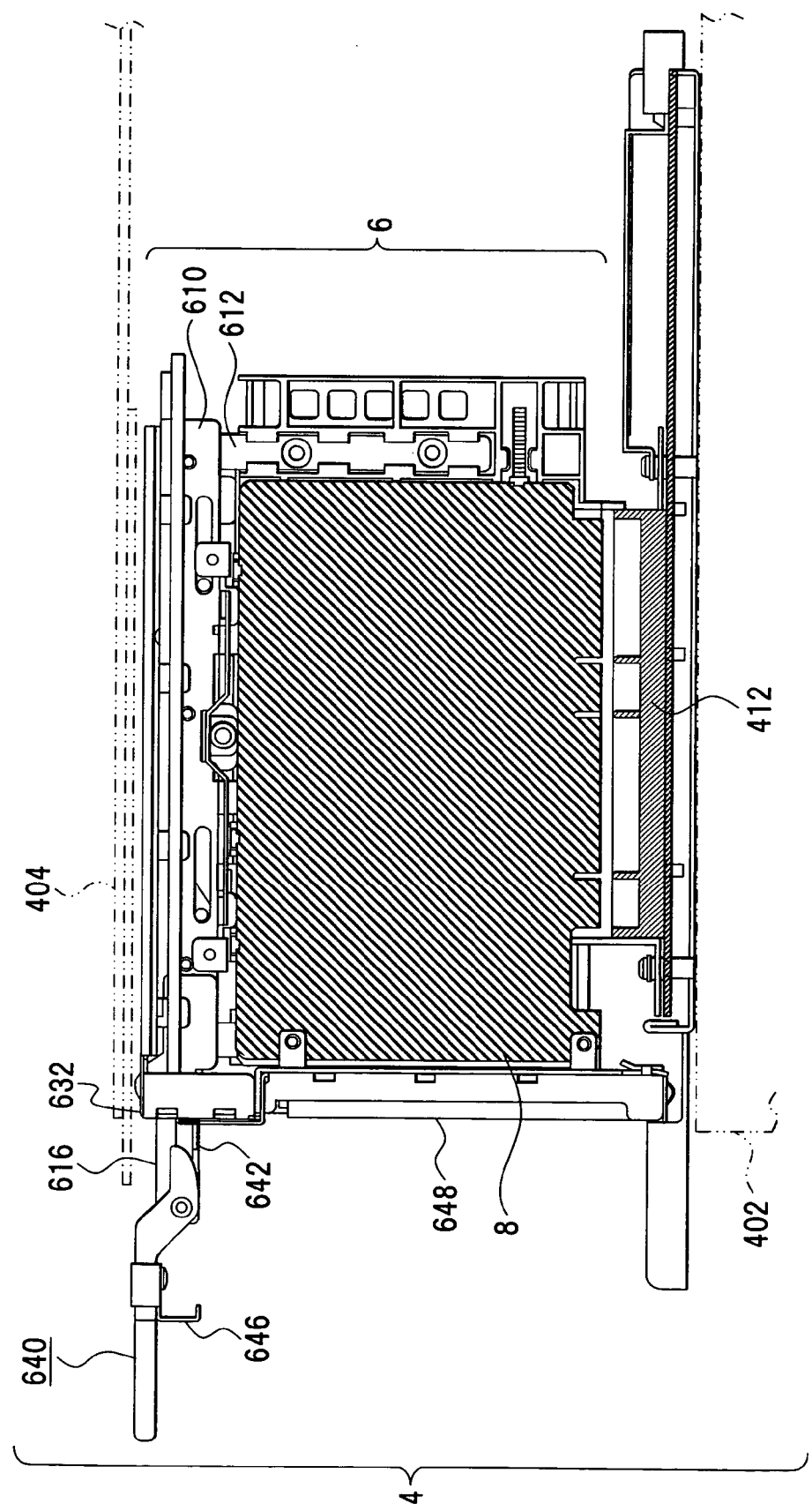
FIG. 22 is a drawing which shows a non-coupled state of the card and the connector.
Figure 23:
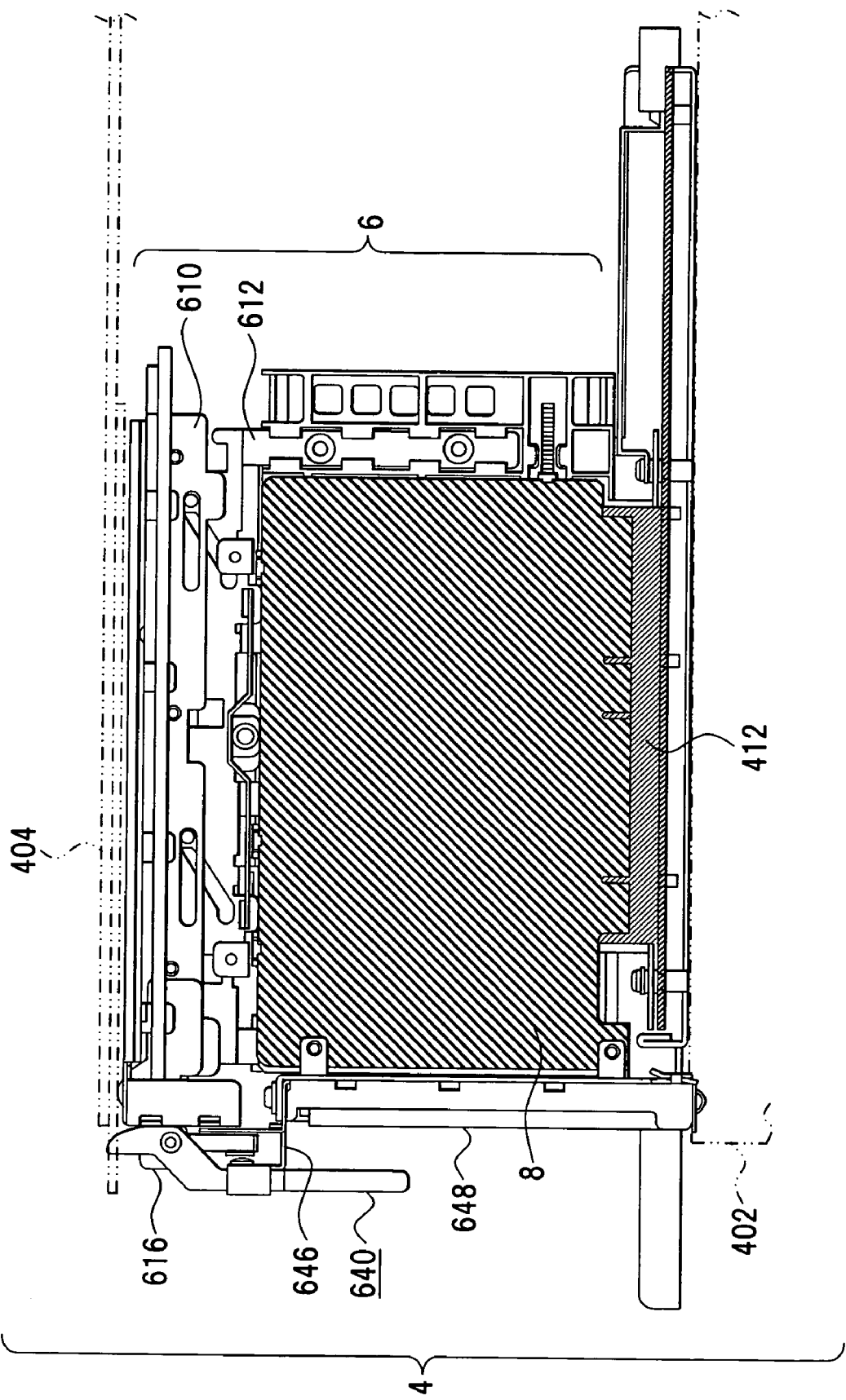
FIG. 23 is a drawing which shows a coupled state of the card and the connector.

Next, the attaching and detaching between the card 8 and the connector 412 in the device unit 4 are explained by referring to FIG. 22 and FIG. 23. FIG. 22 is a drawing which shows a non-coupled state of the card and the connector, and FIG. 23 is a drawing which shows a coupled state of the card and the connector. In FIG. 22 and FIG. 23, the same portions as those of FIG. 11 through FIG. 21B are indicated by the same reference numerals.

As shown in FIG. 22, as mentioned previously, if the locking arm 646 is taken off from the locking hole 650 of the reinforcing frame part 648 of the movable frame part 612, and if the slide plate 616 is drawn out from the front panel part 632 of the supporting frame part 610, the movable frame part 612 rises according to the movement of the slide plate 616. By this, the card 8 which is loaded on the movable frame part 612 is detached from the connector 412 of the device unit 4, and the card 8 becomes the non-coupled state. Under this state, it is possible to exchange the card 8.

Further, as shown in FIG. 22, if the slide plate 616 is maintained in a state that the positioning bar 642 is hit on the front panel part 632, if the contact of the positioning bar 642 with the front panel part 632 is released, and if the attaching/detaching lever 640 is rotated in a direction opposite to the arrow (b) of the FIG. 20A, the movable frame part 612 falls as shown in FIG. 21A. That is, if the slide plate 616 is pushed into an inside of the front panel part 632 of the supporting frame part 610, the movable frame part 612 falls. By this, as shown in FIG. 23, the card 8 loaded on the movable frame part 612 is inserted into the connector 412 and is coupled. Then, if the locking arm 646 is engaged with the reinforcing frame part 648, the attaching/detaching lever 640 and the supporting frame part 610 become the locked state. By this, since the movement of the slide plate 616 is prevented, the movement of the movable frame part 612 is obstructed. As a result of this, the coupled state between the card 8 and the connector 412 is maintained, and a stable connected state is kept.

Figure 24:
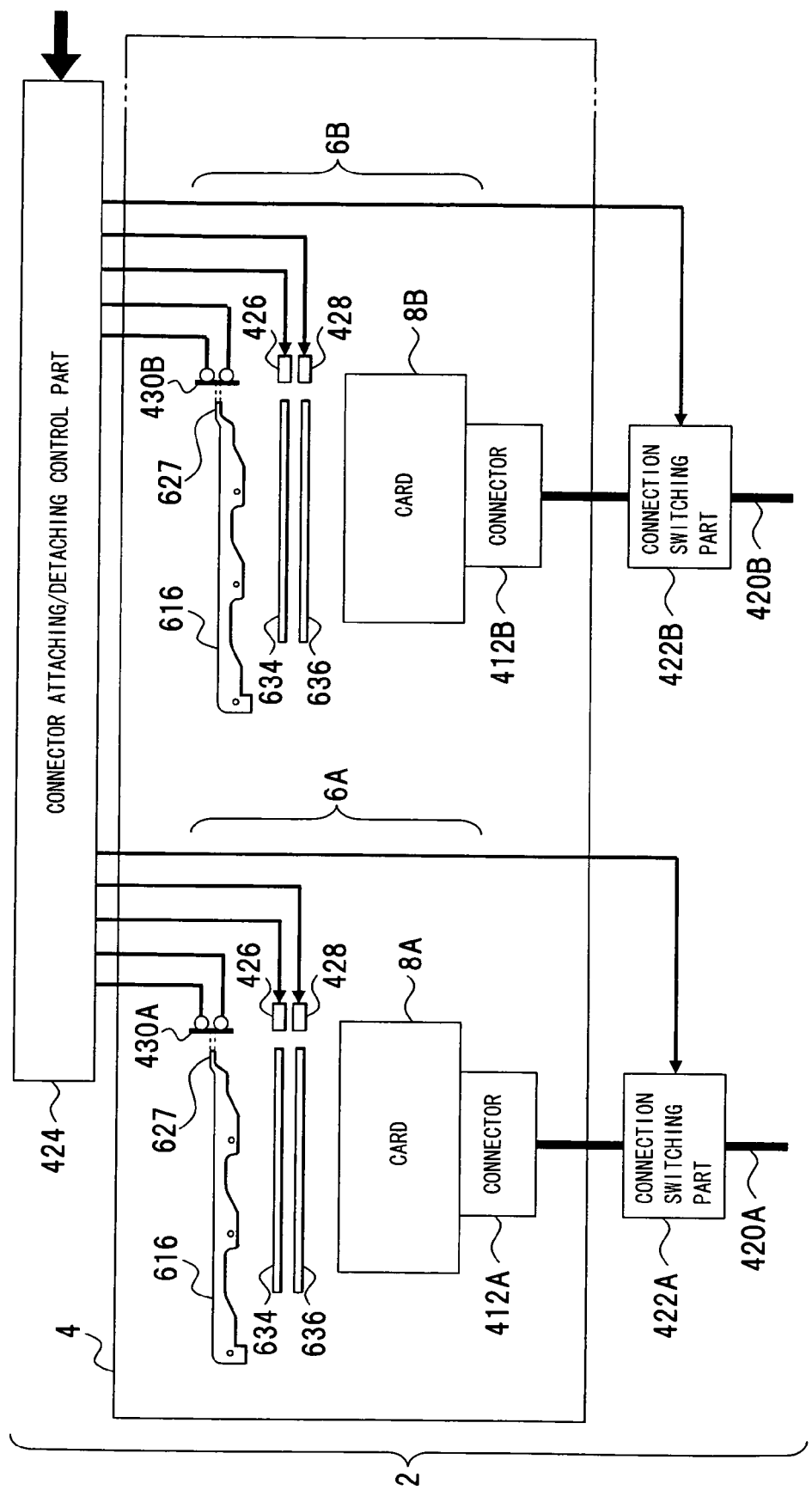
FIG. 24 is a drawing which shows an example of a composition of the device unit mounted on the server unit.

Next, a server unit using a device unit is explained by referring to FIG. 24. FIG. 24 is a drawing which shows an example of a composition of the device unit mounted on the server unit. In FIG. 24, the same portions as those of FIG. 1 through FIG. 23 are indicated by the same reference numerals, and, for the sake of convenience of explanation, a distinction by means of additional reference letters A and B is used.

In the device unit 4, the connectors 412A and 412B are installed correspondingly to the card units 6A and 6B. In this case, to the connector 412A a bus 420A is connected, and to the connector 412B a bus 420B is connected. Along with this, connection switching parts 422A and 422B which separate the connectors 412A and 412B from the buses 420A and 420B are installed. In order to control these connection switching parts 422A and 422B, a connector attaching/detaching control part 424 is installed in the server unit 2. This connector attaching/detaching control part 424 is connected with a host computer of the server unit 2 side. Further, in the connector attaching/detaching control part 424, as an indicator which displays anomaly and so on of the cards 8A and 8B, an LCD (Liquid Crystal Display) 426 is provided, for example. Along with this, an LCD 428 which displays the attaching and detaching of the cards 8A and 8B is also provided. Furthermore, switches 430A and 430B which are operated by an operation part 627 of the slide plate 616 are connected to the connector attaching/detaching control part 424, and they are opened and closed by its operation.

In a constitution like this, if the drawing-out of the slide plate 616 of the card unit 6A side is started and the switch 430A is switched to OFF from ON as an example, a switching control signal is given to the connection switching part 422A from the connector attaching/detaching control part 424, and the connector 412A is separated from the bus 420A by the connection switching part 422A. In this state the separation of the card 8A becomes possible, and, by drawing out the slide plate 616, the card 8A can be shifted safely to the non-coupled state from the coupled state in relation to the connector 412A. As described previously, by a chain of drawing-out operation of the slide plate 616, the card 8A can be shifted to a non-live electricity state from a live electricity state, and can also be separated from the connector 412A. By this, it is possible to exchange the card 8A for another card 8A.

Then, if the card 8A exchanged is attached to the device unit 4 together with the card unit 6A and the slide plate 616 is moved, the card 8A is coupled with the connector 412A at a predetermined position. After that, the switch 430A is switched to the ON state from the OFF state by means of the movement of the slide plate 616, and the connection switching part 422A can be shifted to a connected state. Because of this, the card 8A is connected to the bus 420A through the connector 412A.

This exchange management of the card 8A can be performed independently without giving any influence to a live electricity state of another card 8B. What is more, in connection with the card 8A, it is possible to perform the disconnection with the bus 420A before separating the card 8A from the connector 412A, and it is possible to perform the connection with the bus 420A after connecting the card 8A with the connector 412A. Because of this, since the attaching and detaching of the card 8A do not give any influence to a processing side of the bus 420A, the exchange having reliability may be realized.

Second Embodiment

Figure 25:
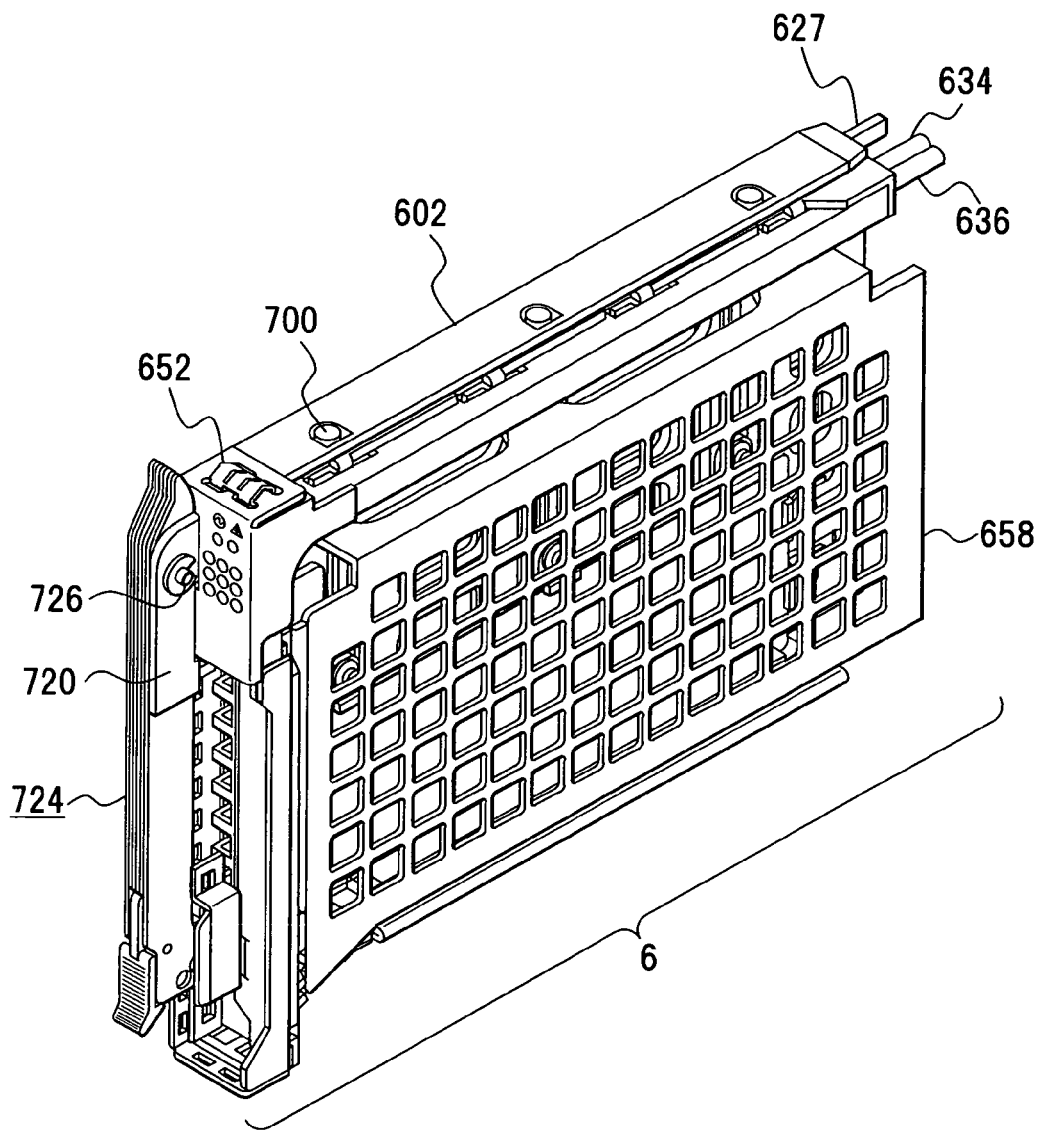
FIG. 25 is a perspective view showing a card unit, in which an attaching/detaching lever is closed, according to a second embodiment.
Figure 26:
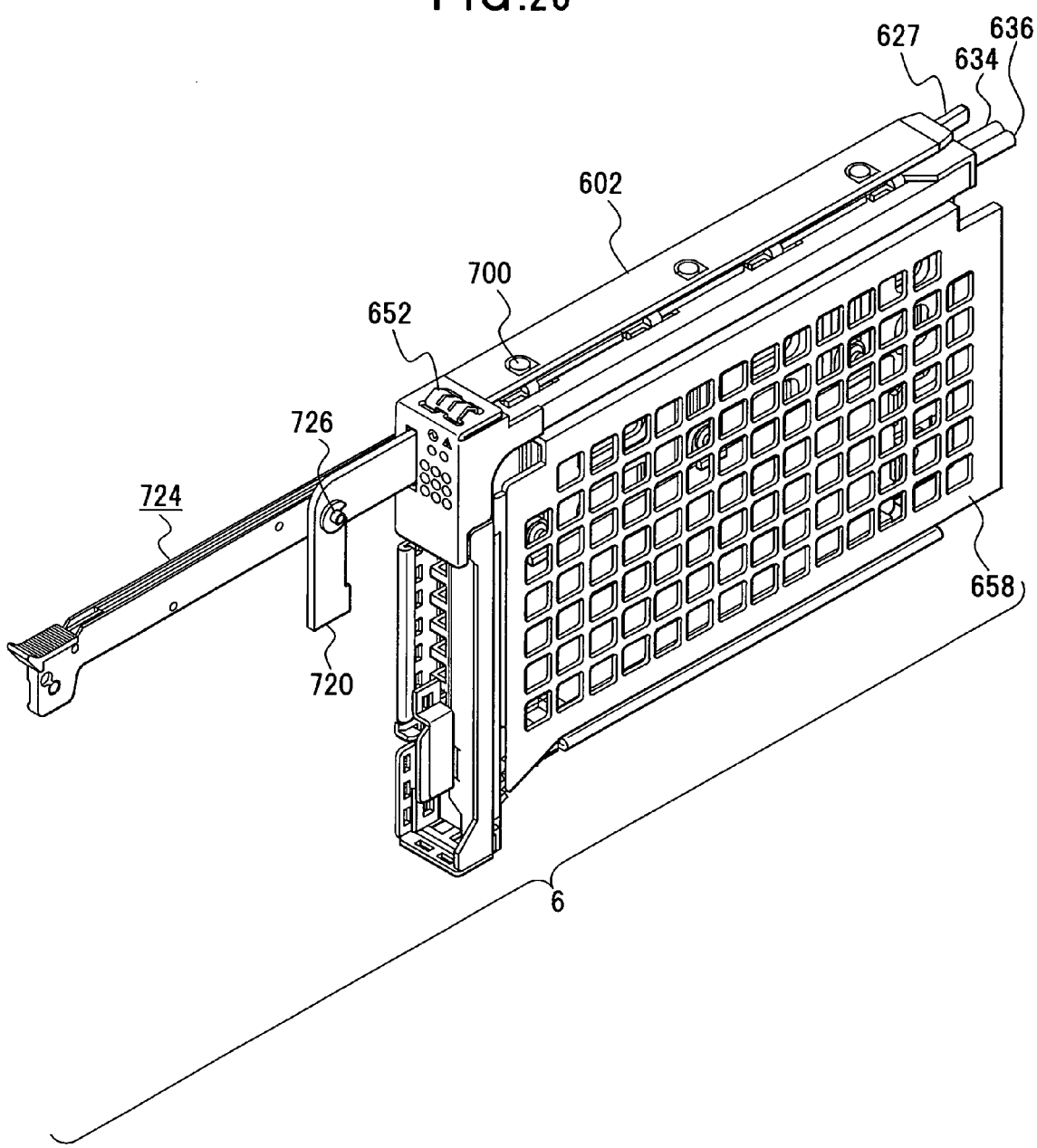
FIG. 26 is a perspective view showing the card unit in which the attaching/detaching lever is opened.
Figure 27:
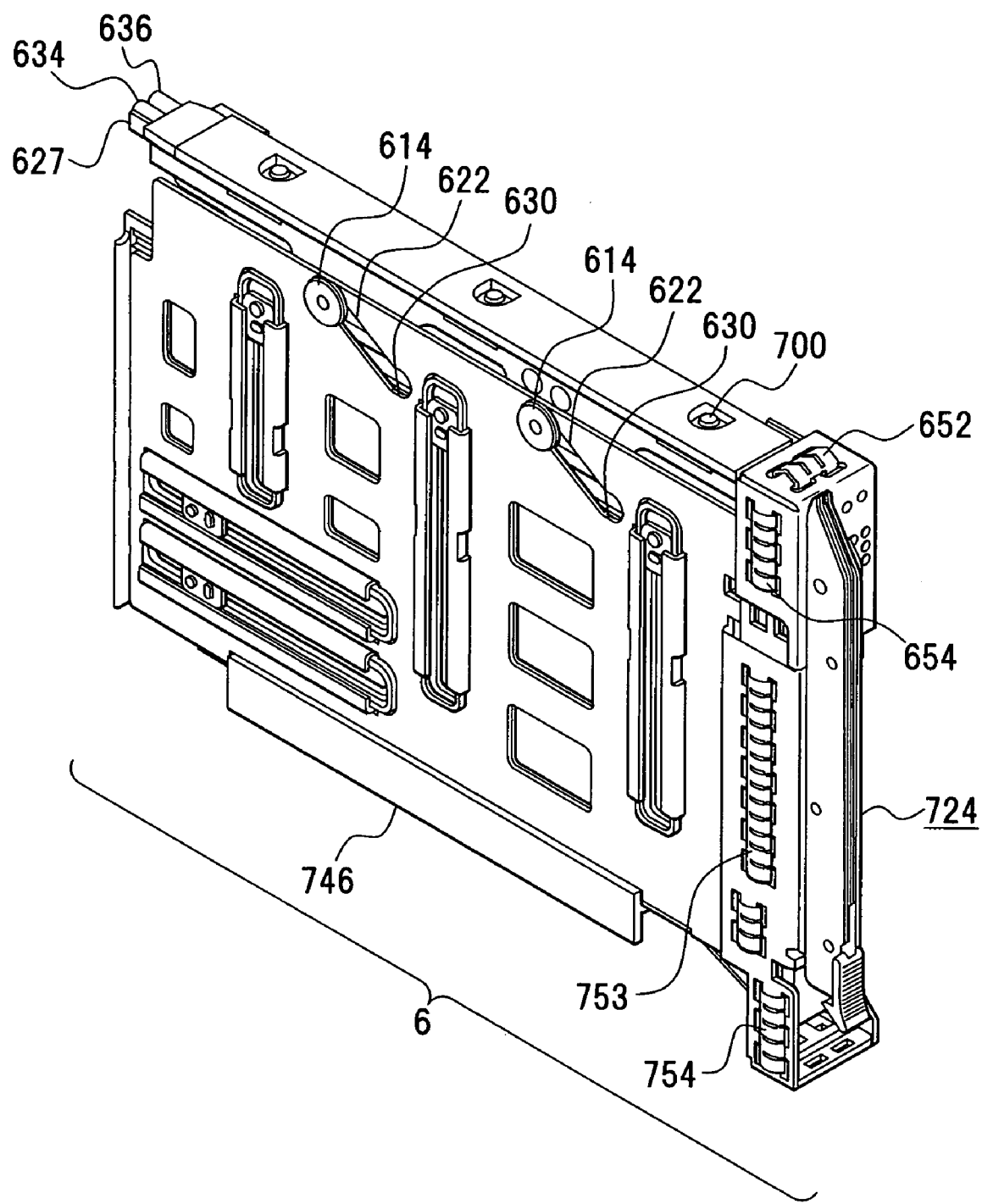
FIG. 27 is a perspective view showing the card unit in a case of looking from its rear side.
Figure 28:
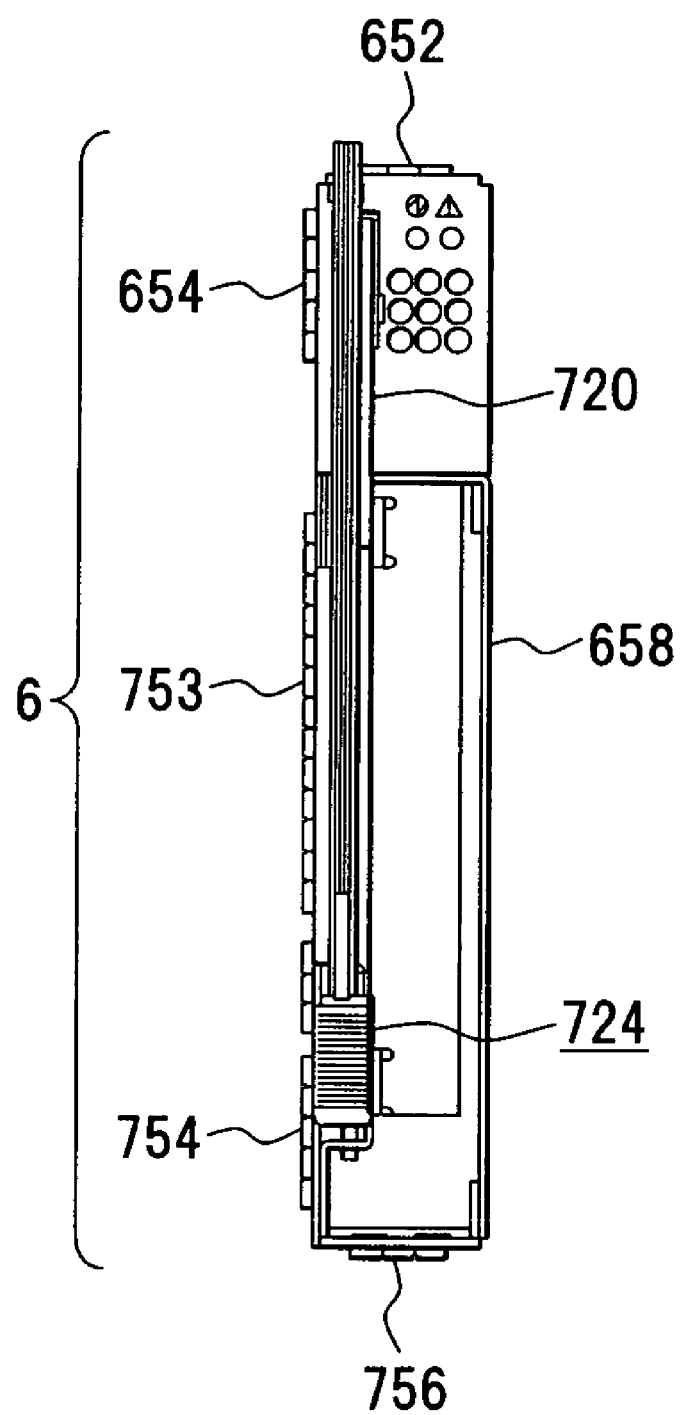
FIG. 28 is a front view showing the card unit.
Figure 29:
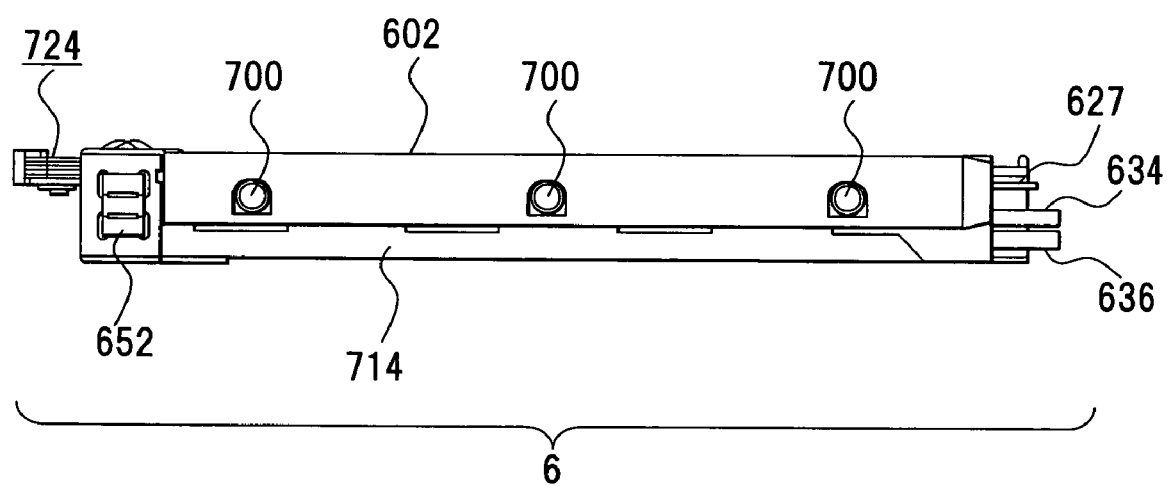
FIG. 29 is a plan view showing the card unit.
Figure 30:
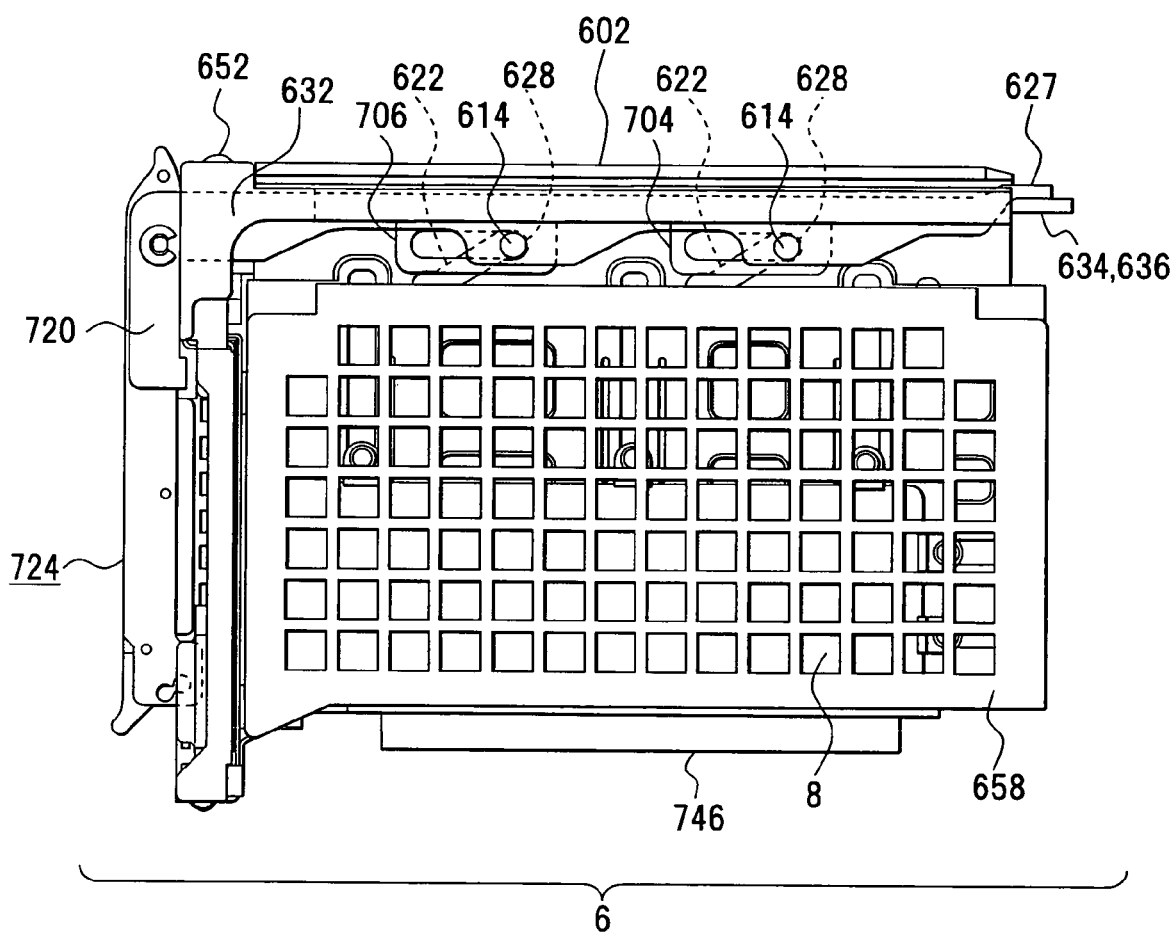
FIG. 30 is a side view showing the card unit.
Figure 31:
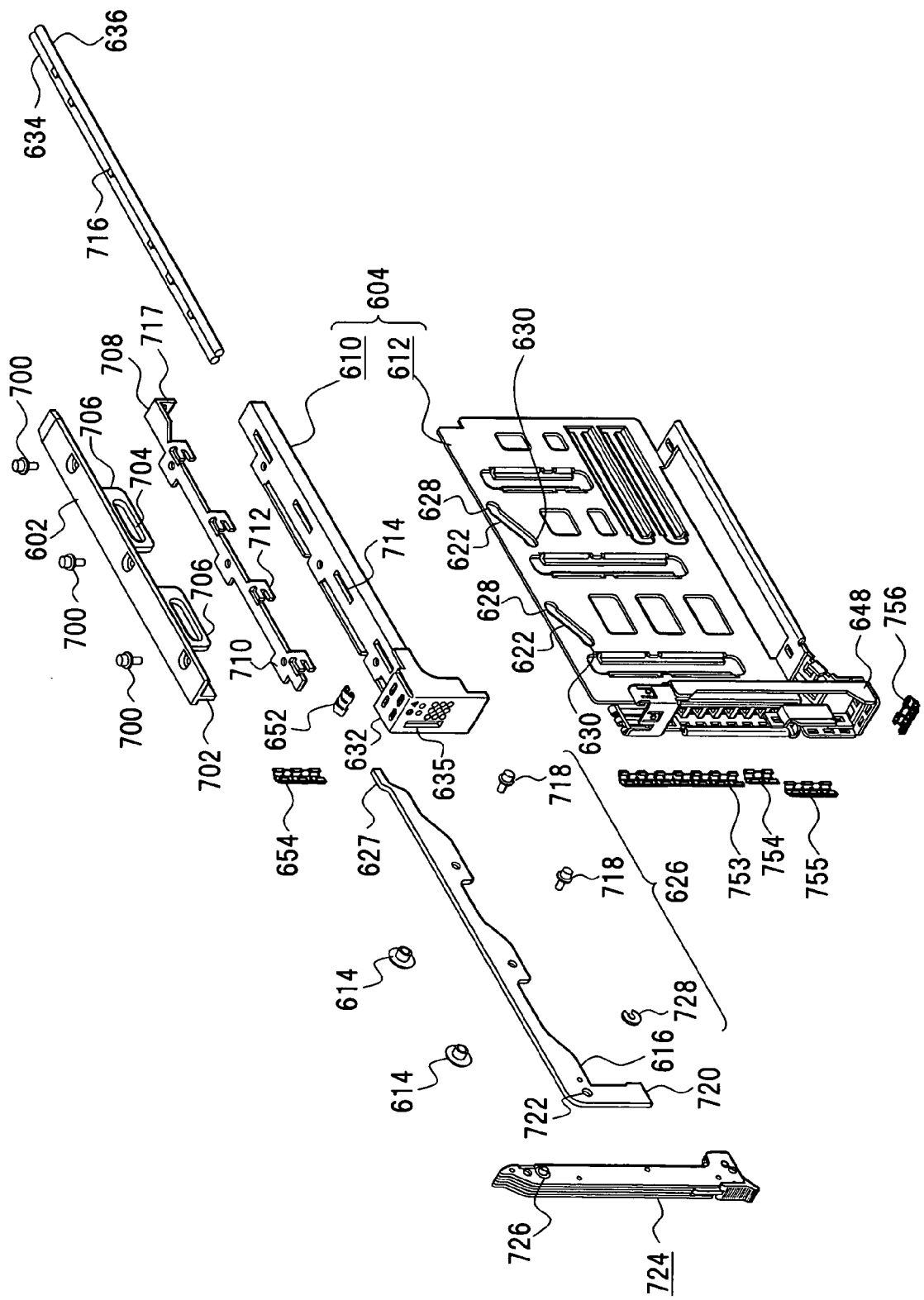
FIG. 31 is an exploded perspective view showing the card unit.
Figure 32:
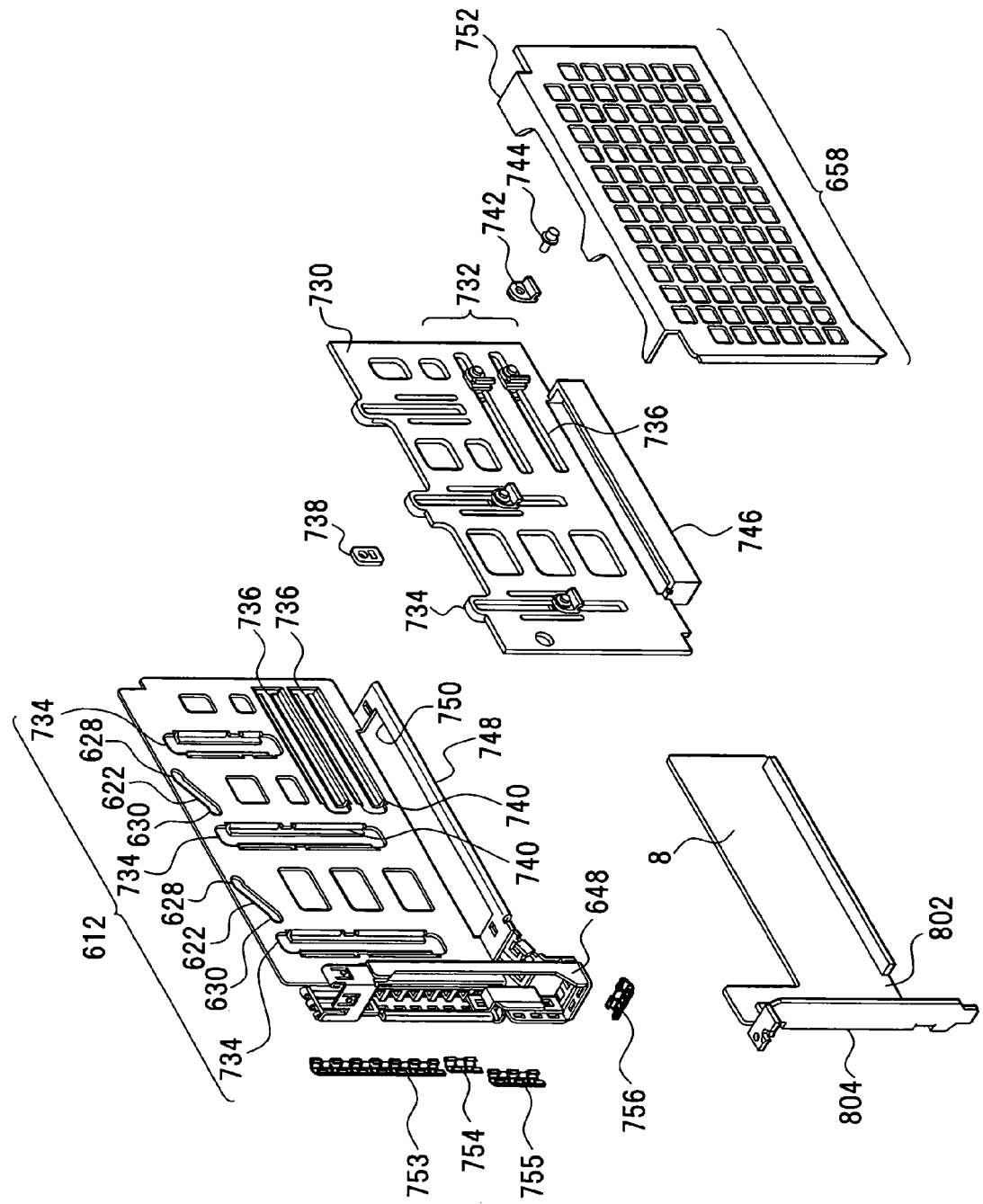
FIG. 32 is an exploded perspective view showing the card unit.
Figure 33:
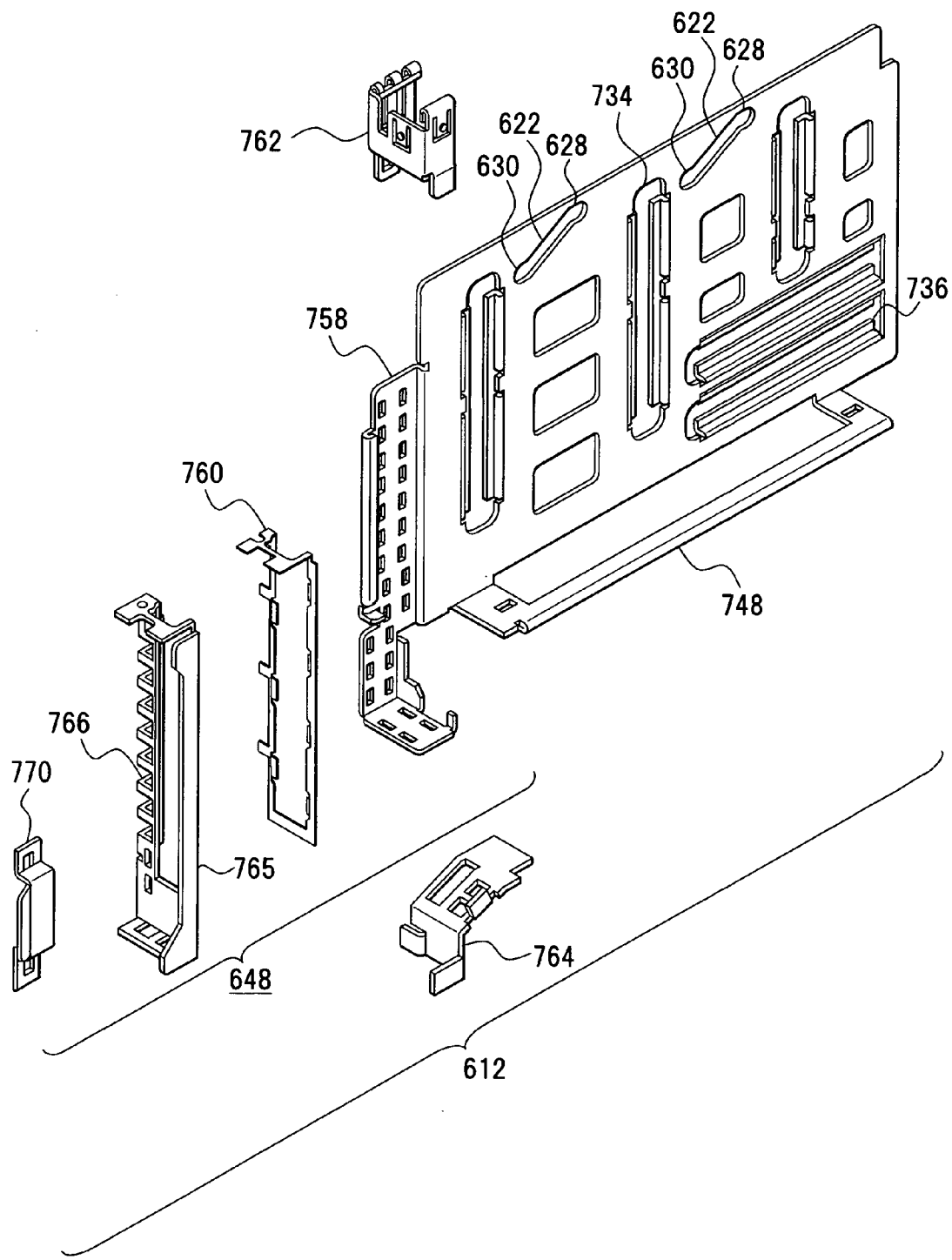
FIG. 33 is an exploded perspective view showing a movable frame part.
Figure 34:
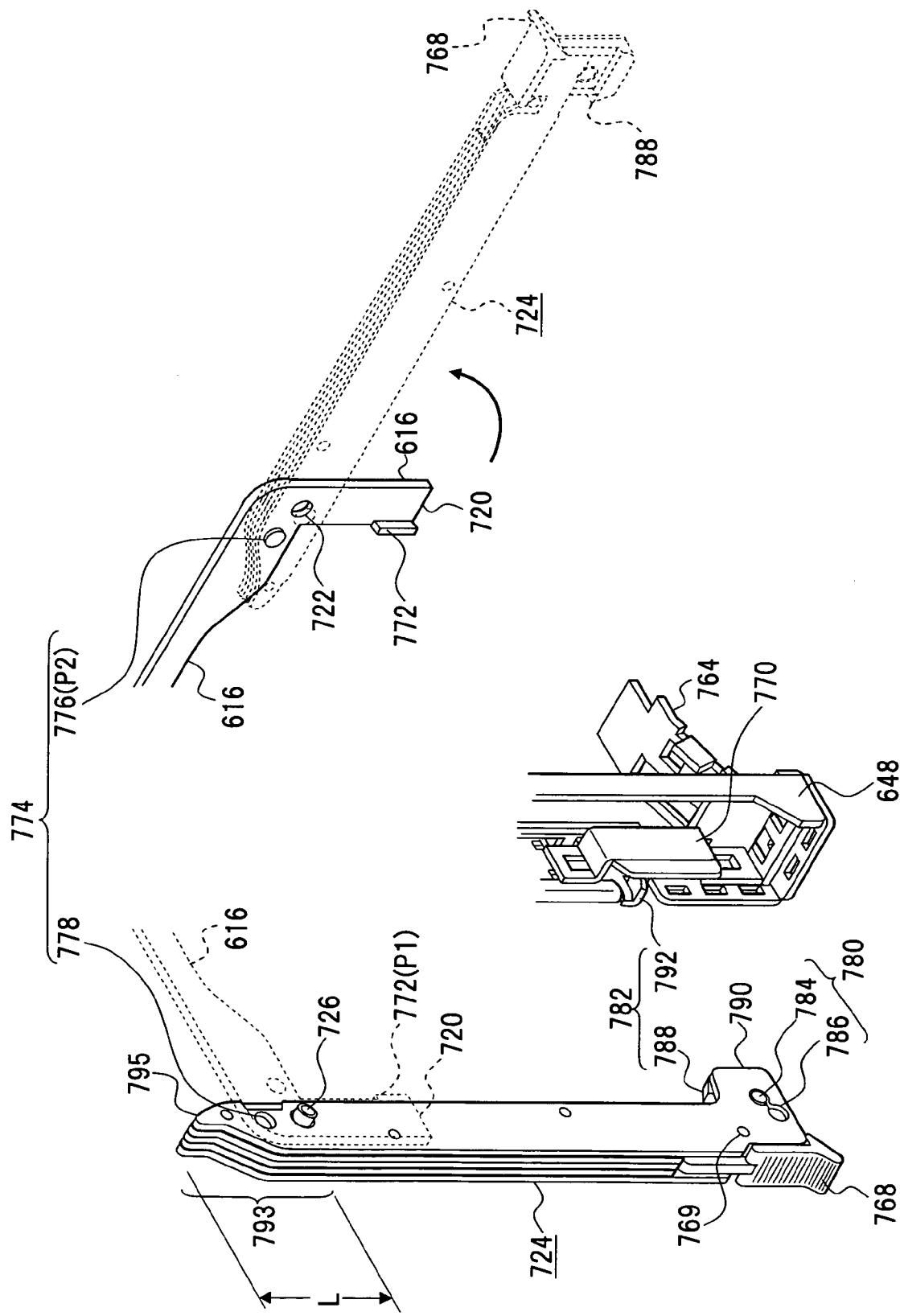
FIG. 34 is a perspective view showing an attaching/detaching lever.
Figure 35:
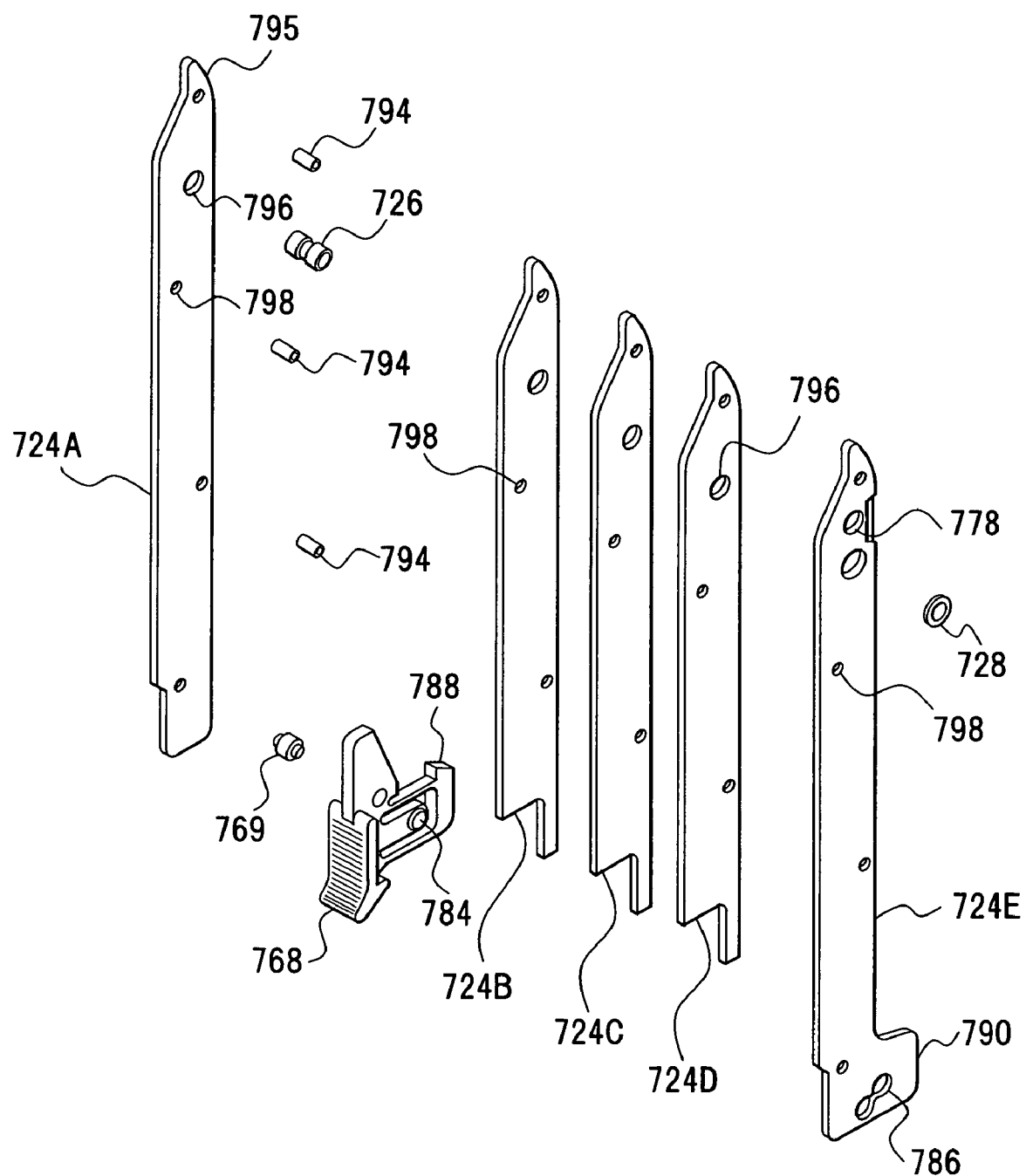
FIG. 35 is an exploded perspective view showing the attaching/detaching lever.
Figure 36:
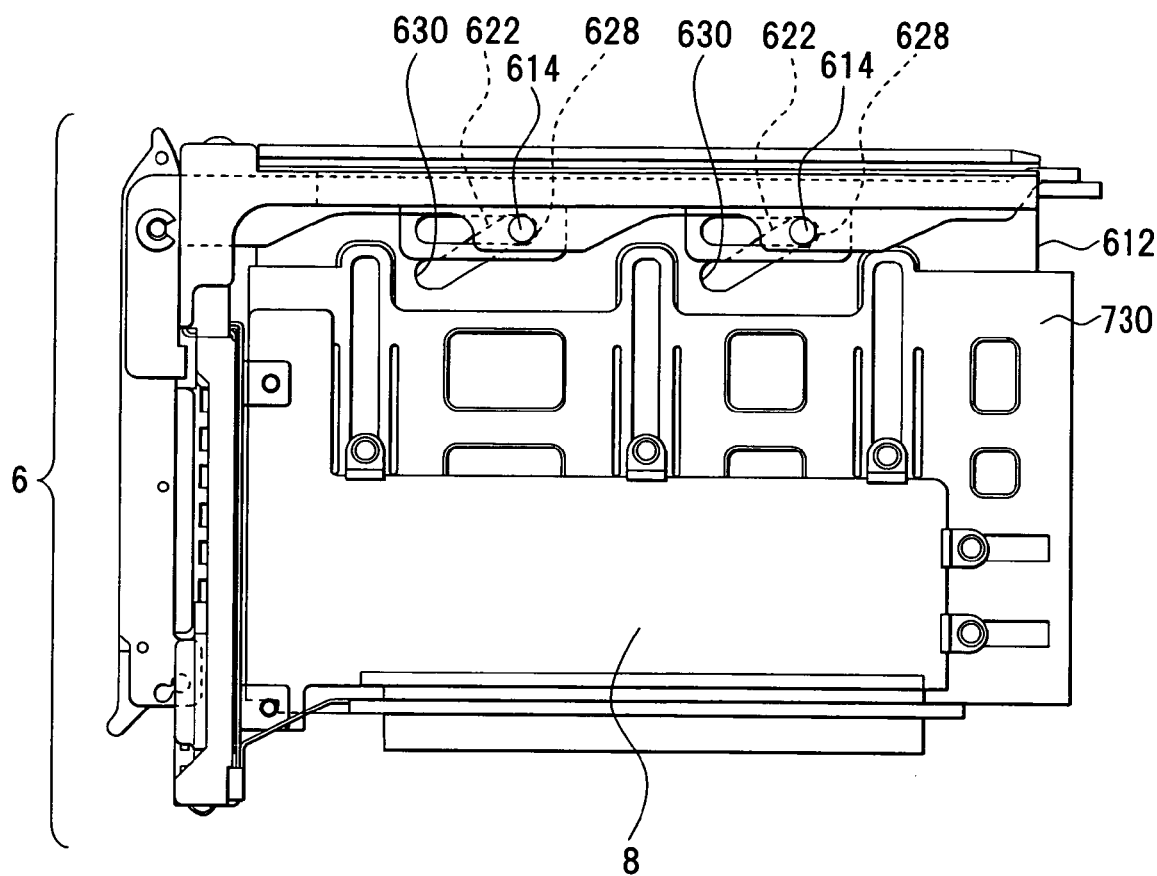
FIG. 36 is a drawing which shows a loaded state of a card.
Figure 37:
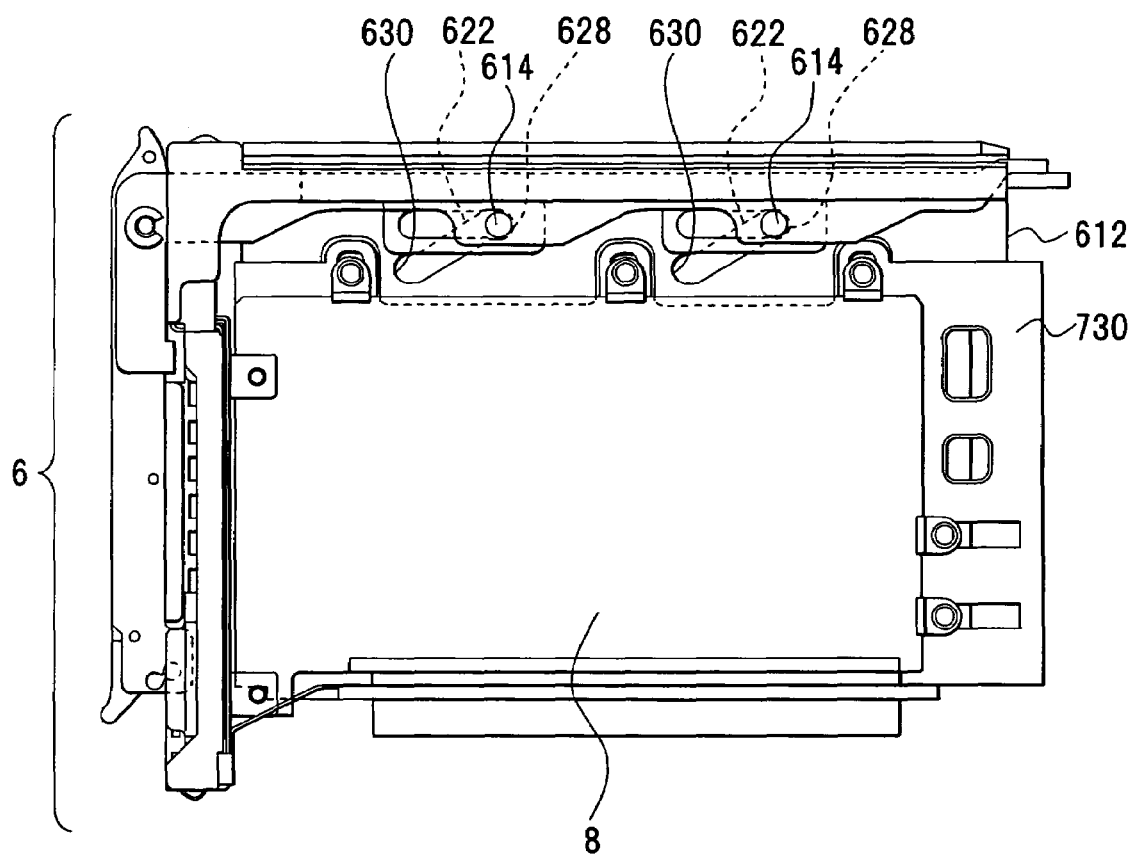
FIG. 37 is a drawing which shows a loaded state of a card.

A card unit and an attaching/detaching lever according to a second embodiment of the present invention are explained by referring to FIG. 25, FIG. 26, FIG. 27, FIG. 28, FIG. 29, FIG. 30, FIG. 31, FIG. 32, FIG. 33, FIG. 34, FIG. 35, FIG. 36 and FIG. 37. FIG. 25 is a perspective view showing the card unit in which the attaching/detaching lever is made into a closed state, FIG. 26 is a perspective view showing the card unit in which the attaching/detaching lever is made into an opened state, FIG. 27 is a perspective view showing the card unit in a case of looking from its rear side, FIG. 28 is a front view showing the card unit, FIG. 29 is a plan view showing the card unit, FIG. 30 is a side view showing the card unit, FIG. 31 and FIG. 32 are exploded perspective view showing the card unit, FIG. 33 is an exploded perspective view showing a movable frame part, FIG. 34 is a perspective view showing the attaching/detaching lever, FIG. 35 is an exploded perspective view showing the attaching/detaching lever, and FIG. 36 and FIG. 37 are drawings which show a loaded state of a card. In FIG. 25 and FIG. 37, the same portions as those of FIG. 1 through FIG. 24 are indicated by the same reference numerals.

This card unit 6 can be used for the sever unit 2 shown in FIG. 1 through FIG. 3 and FIG. 24 and the device unit 4 shown in FIG. 4 through FIG. 7 instead of the card unit 6, 6A and 6B mentioned previously (FIG. 1 through FIG. 24). Therefore, the same portions as those of the card unit 6 mentioned previously are indicated by the same reference numerals, and explanation of those is omitted.

As shown in FIG. 25 through FIG. 32, in this card unit 6, a long-shaped rail 602 is attached at an upper surface of the supporting frame part 610 by a plurality of fixing screws 700. At a lower surface side of this rail 602, guide parts 706 having a long hole 704 which guides the movement of the slide shaft 614 are formed together with a supporting wall 702. In a place between this rail 602 and the supporting frame part 610 of the frame 604, a light pipe bracket 708 which supports the light pipes 634 and 636 is attached. In this light pipe bracket 708, fixing parts 710 which are fixed by the fixing screws 700 fixing the rail 602 are formed, and engaging parts 712 which engage with the light pipes 634 and 636 are also formed. By engaging bridge parts 716 of each of the light pipes 634 and 636 with each engaging part 712 which penetrates a plurality of elongated holes 714 formed in the supporting frame part 610, each of the light pipes 634 and 636 is provided at the lower surface side of the supporting frame part 610. In addition, at a rear end part of the light pipe bracket 708, a supporting part 717 which makes the light pipes 634 and 636 penetrate and supports them is formed.

At the front part of the supporting frame part 610, the front panel part 632 is attached. The slide plate 616 is inserted from a long hole 635 formed in the front panel part 632, and the slide plate 616 is maintained slidably in parallel in the supporting frame part 610. The plurality of slide shafts 614 are fixed in the middle part of the slide plate 616 by fixing screws 718, and each slide shaft 614 is inserted into the inclined holes 622 of the movable frame part 612. The moving direction converting part 626 which converts the movement of a horizontal direction of the slide plate 616 into the movement of an up and down direction of the movable frame part 612 is constituted by the slide plate 616, the slide shafts 614 and the inclined holes 622 of the movable frame part 612.

At a rear end part of the slide plate 616, an L-shaped stopper part 720 is formed. At a supporting hole 722 formed in this stopper part 720, a supporting shaft 726 of the attaching/detaching lever 724 side is rotatably fixed by an e-ring 728.

In the movable frame part 612 a plate-shaped base part 730 on which the card 8 is loaded is installed, and the card 8 is provided on the base part 730. In the base part 730, an adjustable fixing mechanism 732 which can correspond to a size of the card 8 is provided. In both of the movable frame part 612 and the base part 730, a plurality of slide holes 734 corresponding to edge parts of a height direction of the card 8 are formed, and a plurality of slide holes 736 corresponding to edge parts of a width direction of the card 8 are also formed. To the slide holes 734 and 736 of the movable frame part 612 side, rail parts 740 which make slide parts 738 slide are attached. To the slide parts 738, brackets 742 which are contact with the edge parts of the card 8 to fix the card 8 are attached by fixing screws 744. Each of the brackets 742 can be slide by loosening the fixing screw 744 to each slide part 738, and it is possible to adjust the brackets 742 to a position corresponding to a size and a shape of the card 8.

In the base part 730, a cover part 746 which surrounds a connector part 802 of the card 8 is formed. This cover part 746 is inserted into a through hole part 750 which is formed in a supporting part 748 of the movable frame part 612. To a front edge part of the card 8 a fixing pin 804 is attached, and this fixing pin 804 is fixed to the reinforcing frame part 648 of the movable frame part 612.

Further, in the movable frame part 612, the protection cover 658, formed by synthetic resin as an example, which covers the base part 730 and the card 8, is installed, and the card 8 is protected by this protection cover 658. In the protection cover 658, attaching/detaching leg parts 752 which are attached to the movable frame part 612 and are detached from it are formed.

At an upper surface and a side surface of the front panel part 632 of the movable frame part 612, the shielding springs 652 and 654 are provided, respectively. Along with this, also at a side surface part and a lower surface part of the reinforcing frame part 648 fixed in a front edge part side of the movable frame part 612, shielding springs 753, 754, 755 and 756 composed of a spring plate are provided. A gap between the card unit 6 and an adjacent member is complemented by these shielding springs 652, 654, 753, 754, 755 and 756, and the leakage of an electromagnetic wave from the front surface side of the device unit 4 is prevented.

Further, as shown in FIG. 33, a reinforcing frame attaching part 758 in which the reinforcing frame part 648 is attached is formed at the front edge part of the movable frame part 612. At a place between this reinforcing frame attaching part 758 and the reinforcing frame part 648, a shielding plate 760, composed of a spring plate as an example, which corresponds to a shape of a rear surface of the reinforcing frame part 648, is provided. Further, an inserted frame part 762 which is inserted into the front panel part 632 attached to the supporting frame part 610 is fixed at an upper part of the reinforcing frame part 648. Furthermore, a bridge supporting piece 764 is attached between the reinforcing frame attaching part 758 and the supporting part 748, and the mechanical strength of them both is heightened.

At a side part of a frame main part 765 of the reinforcing frame part 648, a window part 766 is formed. Further, at the reinforcing frame part 648, an inserted part 770 into which a guide part 790 (FIG. 34) of the attaching/detaching lever 724 is inserted is formed.

Further, as shown in FIG. 34, at the stopper part 720 of the slide plate 616 to which the attaching/detaching lever 724 is attached rotatably by the supporting shaft 726, a stopper piece 772 which stops the rotation of the attaching/detaching lever 724 is formed. This stopper piece 772 constitutes a rotation start point P1 of the attaching/detaching lever 724. The attaching/detaching lever 724 can be rotated above an angle of 90° around the supporting shaft 726 as a center. However, a rotation stop point P2 of the attaching/detaching lever 724 is set at a position at which the attaching/detaching lever 724 coincides with the slide plate 616 from the rotation start point P1 at which the attaching/detaching lever 724 becomes an orthogonal state against the slide plate 616, for example, at a position of an angle of 90° at which the attaching/detaching lever 724 becomes a horizontal state. In order to suggest this rotation stop point P2 to an operator, a click mechanism 774 is formed between the attaching/detaching lever 724 and the stopper part 720 of the slide plate 616. In the case of this embodiment, for this click mechanism 774, a projecting portion 776 which contacts with the attaching/detaching lever 724 is formed in the slide plate 616 side, and a recess portion 778 corresponding to this projecting portion 776 is formed in the attaching/detaching lever 724 side. That is, an angle between the stopper piece 772 and the projecting portion 776 is a predetermined angle with the supporting shaft 726 as a center, for example, the angle of 90°, and a positional relation of the recess portion 778 and the projecting portion 776 exists on a locus of them both. At a portion between the projecting portion 776 of the slide plate 616 and the attaching/detaching lever 724, a load is given by the friction of them both. As against this, if the projecting portion 776 fits into the recess portion 778, a click feeling is given to an operator as a result of an rotational load being removed partially. Because of this, the operator recognizes sensuously the rotation stop point P2. If the rotation is stopped at this time point, the attaching/detaching lever 724 is maintained in a horizontal state (linear state) with the slide plate 616.

Further, to an end part of the attaching/detaching lever 724, a grip 768 is attached rotatably by a supporting shaft 769. This grip 768 is formed by synthetic resin, for example. A rotation regulating part 780 which regulates the rotation of the grip 768 is formed between the grip 768 and the attaching/detaching lever 724, and a stopper mechanism 782 which obstructs the rotation of the attaching/detaching lever 724 is also formed between the grip 768 and the reinforcing frame part 648. The rotation regulating part 780 is constituted by a projecting portion 784, which is formed in the grip 768 side, and a rotation regulating window 786 which is formed in the attaching/detaching lever 724 side. The projecting portion 784 is inserted into the rotation regulating window 786, and the movement of the projecting portion 784 is limited to the opening range of the rotation regulating window 786.

The stopper mechanism 782 is constituted by a hook stop pawl portion 788, which is formed at the rear part of the grip 768, and a stopper piece 792 of the reinforcing frame part 648 side. In the reinforcing frame part 648, an inserted part 770 into which a guide part 790 formed in the attaching/detaching lever 724 is inserted is formed. In the inside of this inserted part 770, the stopper piece 792 mentioned above is formed. Under a state that the attaching/detaching lever 724 comes into contact with the stopper piece 772 of the slide plate 616 and is also contacted closely to the reinforcing frame part 648, if the grip 768 together with the guide part 790 are inserted into the inserted part 770 of the reinforcing frame part 648 side, the hook stop pawl portion 788 of the grip 768 is engaged with the stopper piece 792, and the rotation of the attaching/detaching lever 724 is obstructed. Under this state, the movement of the movable frame part 612 is prevented. In order to rotate the attaching/detaching lever 724, it is necessary to release the engagement between the hook stop pawl portion 788 and the stopper piece 792 by operating the grip 768.

A positioning part 793 is formed in the attaching/detaching lever 724. The positioning part 793 is set to a length L regulating the draw-out length (position) of the slide plate 616 with the supporting shaft 726, which is a rotational center, as a center. Along with this, in this positioning part 793, a cam surface 795 is formed, and this cam surface 795 is a curved surface which contacts with the front panel part 632 and rotates. This cam surface 795 corresponds to the cam surface 694 in the first embodiment. Further, as shown in FIG. 35, the attaching/detaching lever 724 is constituted by a plurality of attaching/detaching lever pieces 724A, 724B, 724C, 724D and 724E which are laminated, and these are unified by rivets 794. The plurality of attaching/detaching lever pieces 724A, 724B, 724C, 724D and 724E are formed by stainless plate's stamped. In each of the attaching/detaching lever pieces 724A, 724B, 724C, 724D and 724E, a supporting hole 796 which supports the supporting shaft 726 is formed, and rivet holes 798 are also formed. The attaching/detaching lever 724 may also be constituted by a single metal without being constituted by the laminate of metal pieces.

Further, to the base part 730 which is attached to the movable frame part 612 of the card unit 6 of a constitution like this, it is possible to attach the card 8 of a small size as shown in FIG. 36 or to attach the card 8 of a large size as shown in FIG. 37 by the positional adjustment of the adjustable fixing mechanism 732, so that the card 8 is loaded on the movable frame part 612 without relation to the size.

Figure 38:
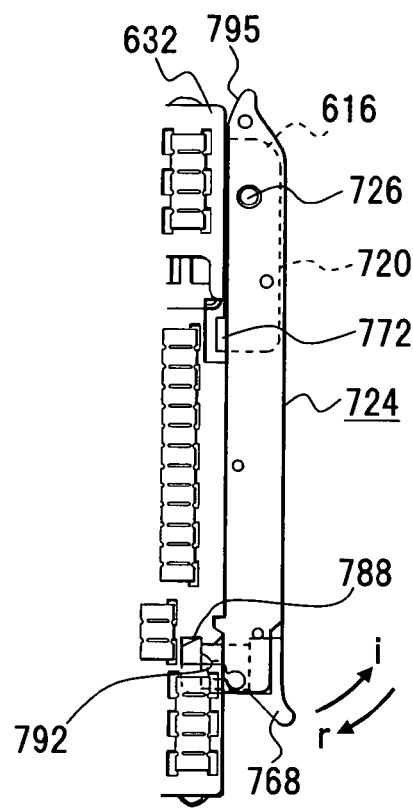
FIG. 38A is a drawing which shows the locked state of the attaching/detaching lever.
FIG. 38B is a drawing which shows the middle of the rotation of the attaching/detaching lever.
Figure 38:
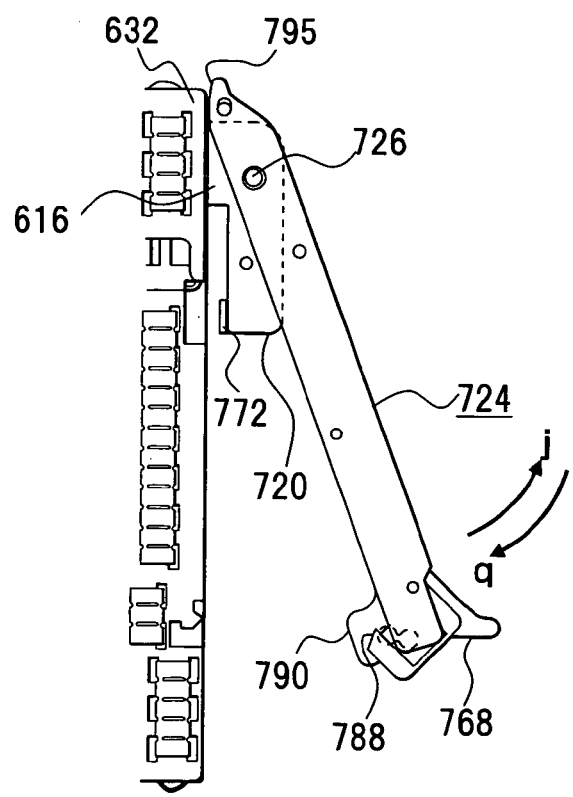
Figure 39A:
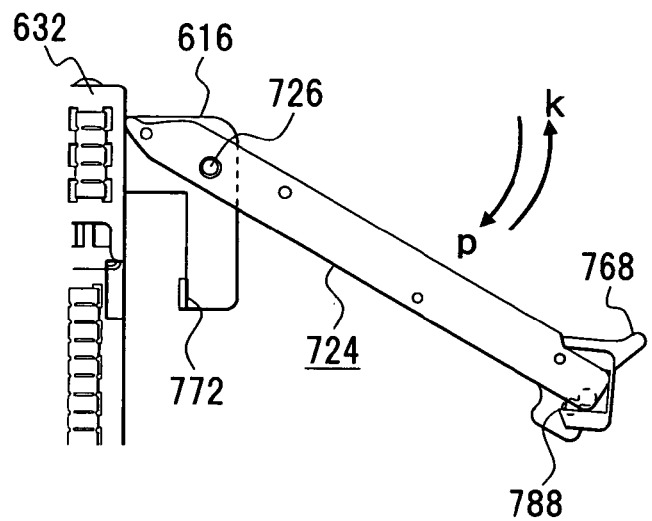
FIG. 39A is a drawing which shows the middle of the rotation of the attaching/detaching lever 724.
Figure 39B:
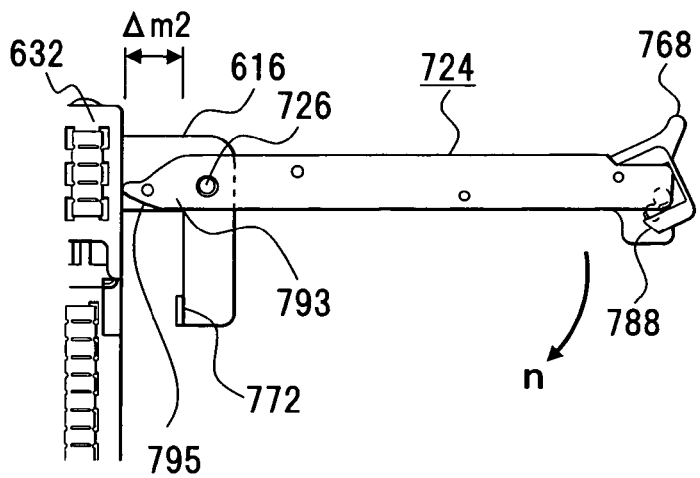
FIG. 39B is a drawing which shows the end of the rotation of the attaching/detaching lever.
Figure 39C:
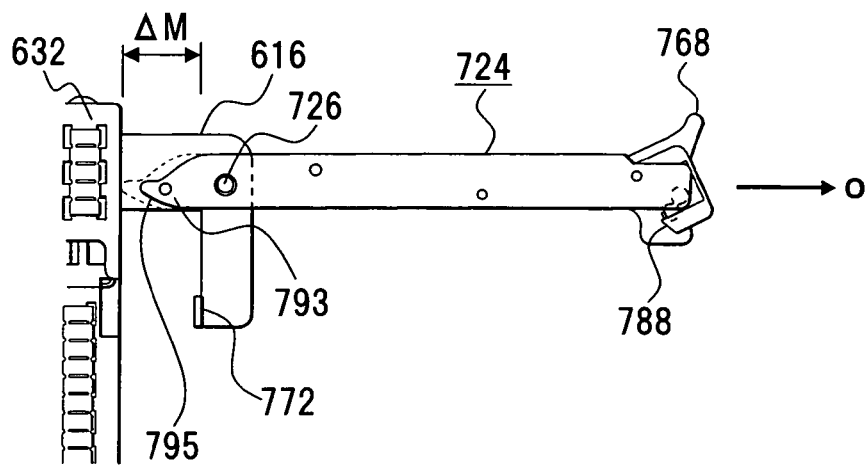
FIG. 39C is a drawing which shows the drawn-out state of the slide plate.

Next, the operation of the attaching/detaching lever 724 and the slide plate 616 is explained by referring to FIG. 38A, FIG. 38B, FIG. 39A, FIG. 39B and FIG. 39C. FIG. 38A is a drawing which shows the locked state of the attaching/detaching lever 724, FIG. 38B is a drawing which shows the middle of the rotation of the attaching/detaching lever 724, FIG. 39A is a drawing which shows the middle of the rotation of the attaching/detaching lever 724, FIG. 39B is a drawing which shows the end of the rotation of the attaching/detaching lever 724, and FIG. 39C is a drawing which shows the drawn-out state of the slide plate 616. In FIG. 38A through FIG. 39C, the same portions as those of FIG. 25 through FIG. 37 are indicated by the same reference numerals.

As shown in FIG. 38A, if the grip 768 is rotated in a direction shown by an arrow (i) under the locked state of the attaching/detaching lever 724, the locked state of the attaching/detaching lever 724 is released and becomes a rotatable state. In this case, the stopper part 720 of the slide plate 616 is in contact with the front panel part 632, and the attaching/detaching lever 724 is in contact with the stopper piece 772 of the stopper part 720 of the slide plate 616.

As shown in FIG. 38B, if the grip 768 is rotated in a direction shown by an arrow (j), the cam surface 795 is in contact with the front surface of the front panel part 632 and rotates, and the slide plate 616 is drawn out forward the front panel part 632 according to the rotation of the cam surface 795. If the attaching/detaching lever 724 is rotated in a direction shown by an arrow (k) as shown in FIG. 39A, and if the attaching/detaching lever 724 reaches a position shown in FIG. 39B, the projecting portion 776 of the slide plate 616 side engages with the recess portion 778 of the attaching/detaching 724 side (FIG. 34), and the click feeling is generated. If the rotation of the attaching/detaching lever 724 is stopped at this position, the attaching/detaching lever 724 is maintained horizontally with the slide plate 616. Under this state, as shown in FIG. 39C, if the slide plate 616 together with the attaching/detaching lever 724 are drawn out in a direction shown by an arrow (o), a projecting width $\Delta M$ occurs. That is, this projecting width $\Delta M$ is larger than a projecting width $\Delta m2$ of a case that the pointed end portion of the positioning part 793 comes in contact with the front panel part 632 ($\Delta M > \Delta m2$). The difference $\Delta Mm$ between the projecting widths $\Delta M$ and $\Delta m2$ ($=\Delta M - \Delta m2$) is a part in which the slide shaft 614 reaches the maintaining surface part 630 (FIG. 33) of the end part of the inclined hole 622 and is maintained there. By this, a state that the movable frame part 612 is maintained is given.

Further, as shown in FIG. 39B, if the pointed end part of the attaching/detaching lever 724 is contacted with the front surface of the front panel part 632, the projecting width $\Delta m2$ of the slide plate 616 is set by the drawn-out length L (FIG. 34) which is set by the positioning part 793. This position is an attaching and detaching position between the card 8, which is loaded on the movable frame part 612, and the connector 412. At this position, if the attaching/detaching lever 724 is rotated in a direction shown by an arrow (n) while contacting the cam surface 795 of the attaching/detaching lever 724 with the front panel part 632, and if the attaching/detaching lever 724 reaches a position shown in FIG. 38A through a continuous rotation as shown by an arrow (p) of FIG. 39A and an arrow (q) of FIG. 38B, the card 8 is attached to the connector 412. Furthermore, if the grip 768 is rotated in a direction shown by an arrow (r) of FIG. 38A, the grip 768 is locked. By this, the rotation of the attaching/detaching lever 724 is obstructed, and the coupled state between the card 8 and the connector 412 is maintained. By rotating the attaching/detaching lever 724 while contacting the cam surface 795 with the front panel part 632, the slide plate 616 moves into the inside of the front panel part 632 along the supporting frame part 610 according to the rotation of the attaching/detaching lever 724, and the card 8 is to fall at an optimum position of the connector 412.

Figure 40:
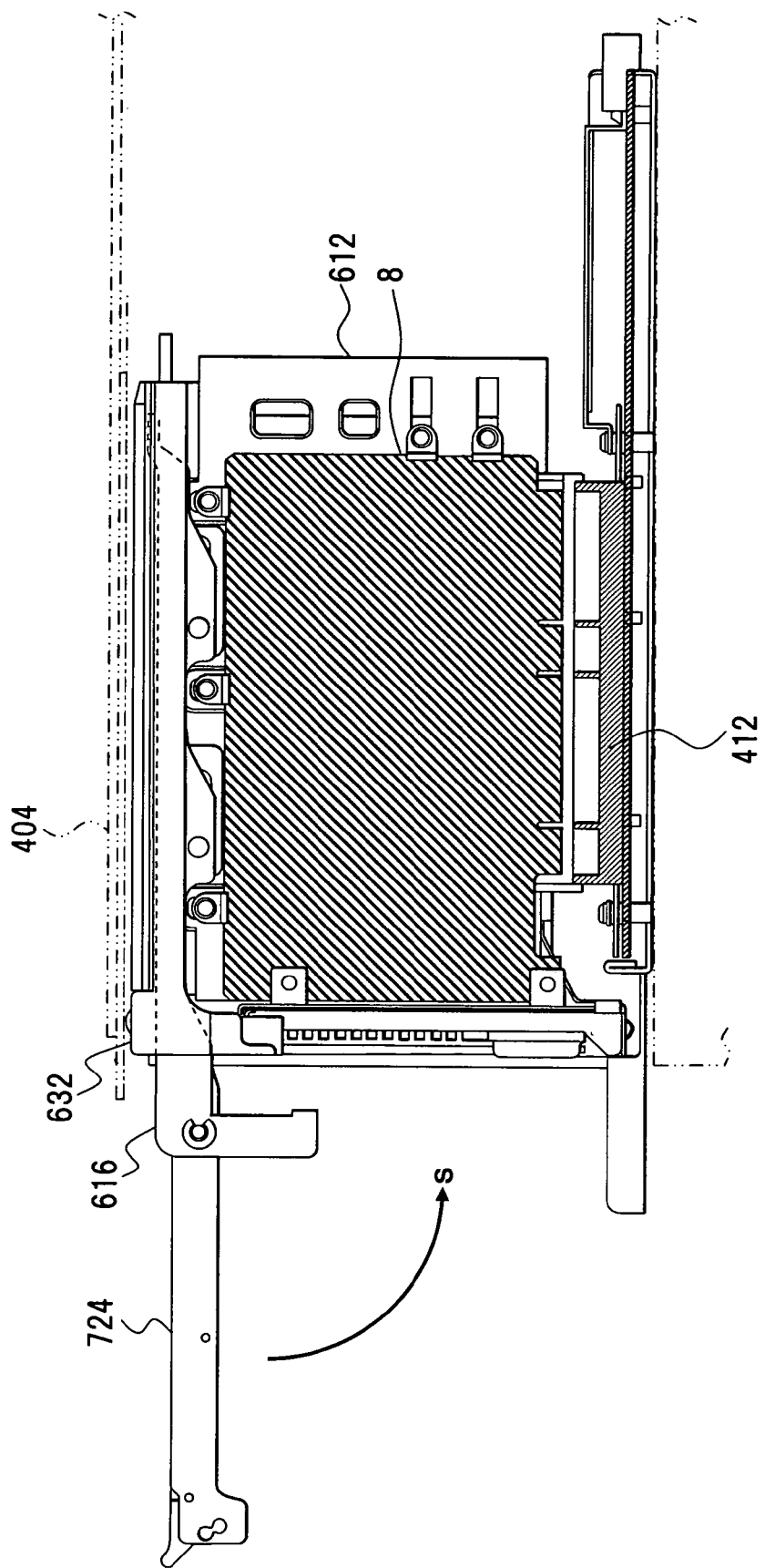
FIG. 40 is a drawing which shows a non-coupled state of the card and a connector.
Figure 41:
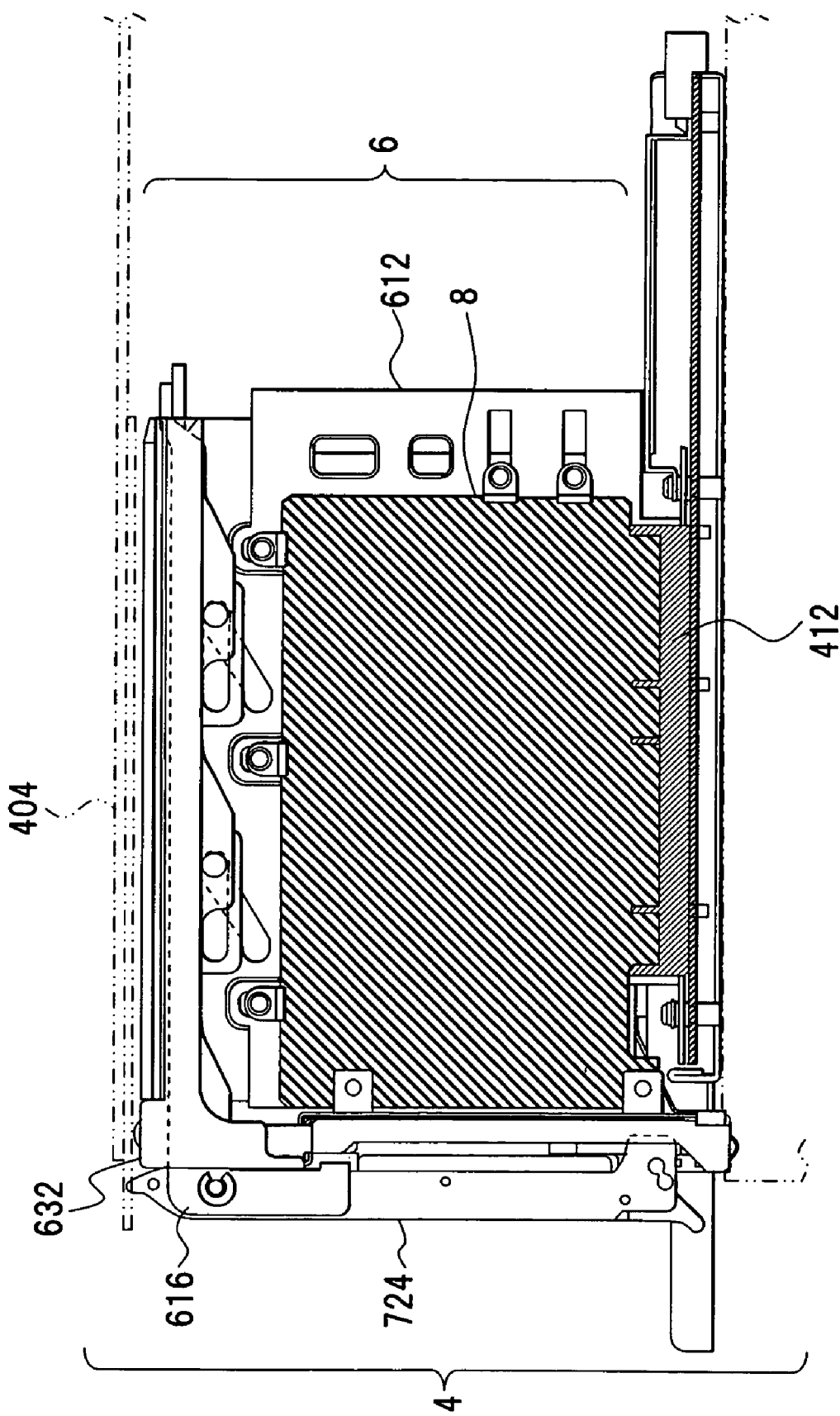
FIG. 41 is a drawing which shows a coupled state of the card and the connector.

Next, the attaching and detaching of the card unit and the connector in the device unit are explained by referring to FIG. 40 and FIG. 41. FIG. 40 is a drawing which shows a non-coupled state of the card and the connector, and FIG. 41 is a drawing which shows a coupled state of the card and the connector. In FIG. 40 and FIG. 41, the same portions as those of FIG. 25 through FIG. 37 are indicated by the same reference numerals.

The slide plate 616 can be moved by the operation of the attaching/detaching lever 724 and so on, as shown in FIG. 38 and FIG. 39. Therefore, as shown in FIG. 40 (FIG. 39B), in the state that the attaching/detaching lever is kept horizontally, the card 8 loaded on the movable frame part 612 becomes a state that the card 8 is disengaged from the connector (the non-coupled state). At this state, if the attaching/detaching lever 724 is rotated in a direction shown by an arrow (s) while maintaining the projecting width $\Delta m2$ of the slide plate 616 by the positioning part 793, and if the attaching/detaching lever 724 is contacted with the front panel part 632, as shown in FIG. 41, it is possible to attach the card 8 loaded on the movable frame part 612 to the connector 412.

Third Embodiment

Figure 42:
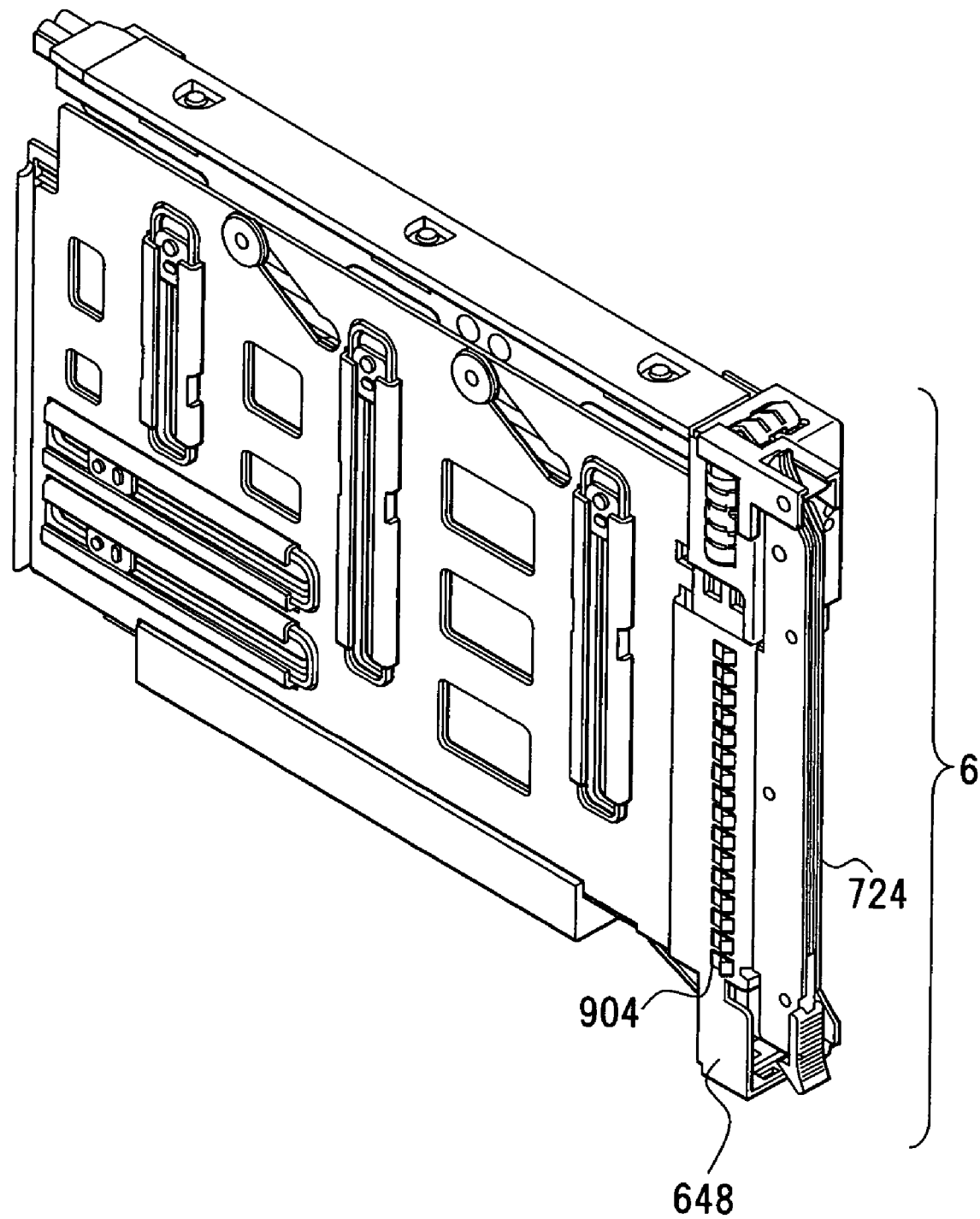
FIG. 42 is a perspective view showing a card unit, in which an attaching/detaching lever is closed, according to a third embodiment.
Figure 43:
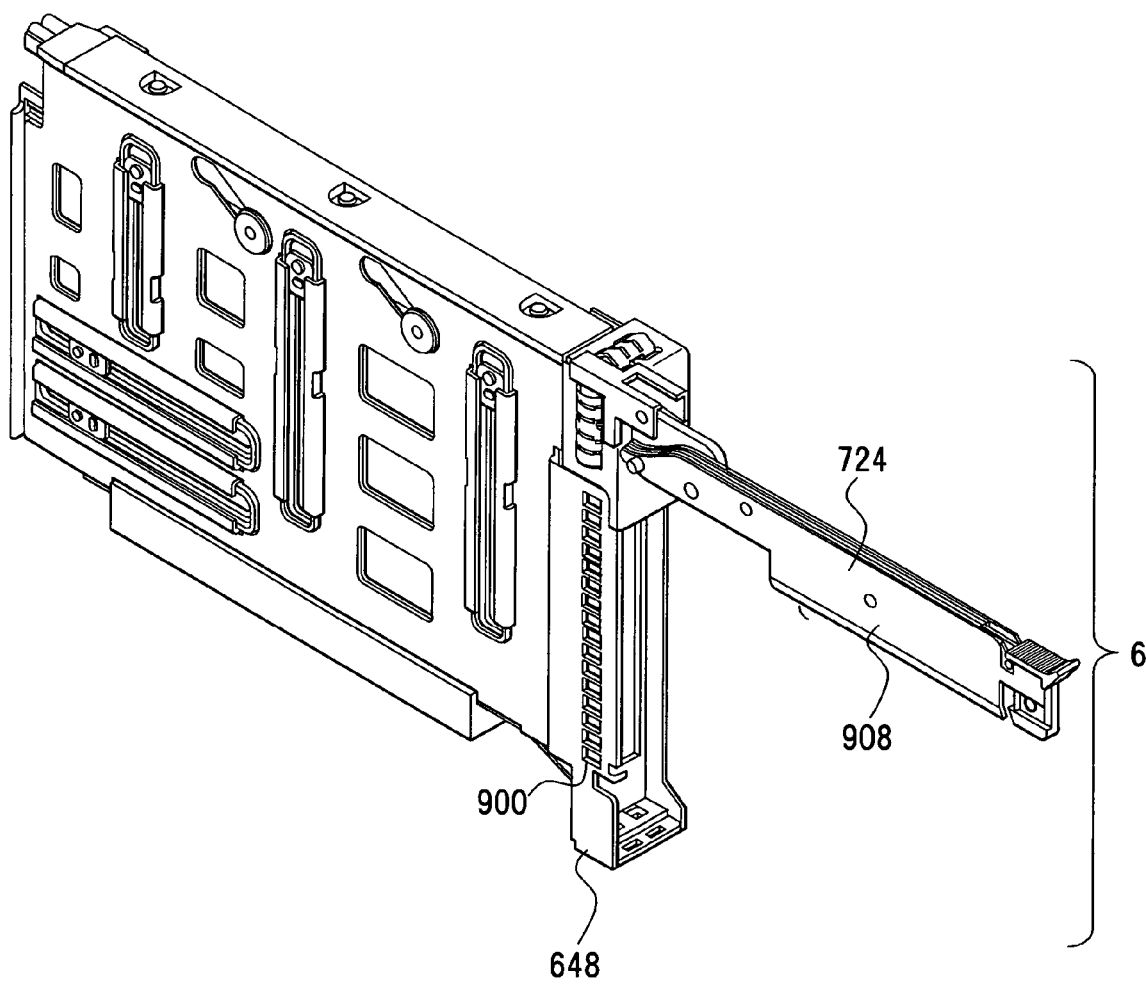
FIG. 43 is a perspective view showing the card unit in which the attaching/detaching lever is opened.
Figure 44:
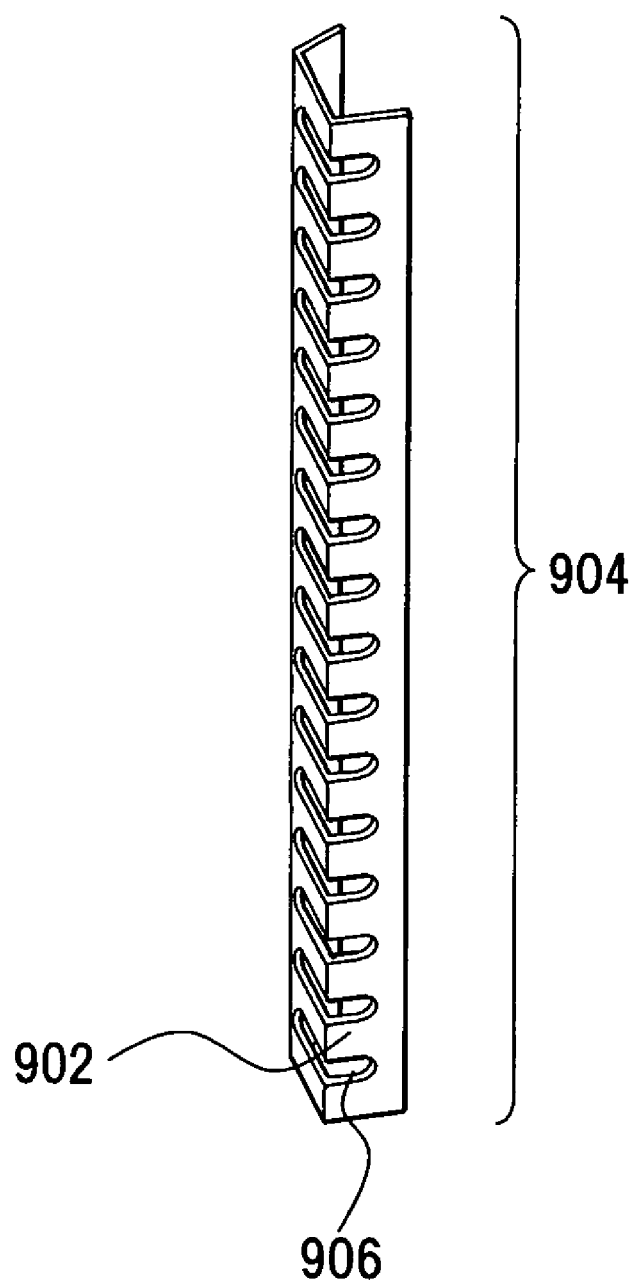
FIG. 44 is a perspective view showing a spring.

A card unit according to a third embodiment of the present invention is explained by referring to FIG. 42, FIG. 43 and FIG. 44. FIG. 42 is a perspective view showing the card unit in which the attaching/detaching lever is closed, FIG. 43 is a perspective view showing the card unit in which the attaching/detaching lever is opened, and FIG. 44 is a perspective view showing a spring. In FIG. 42 through FIG. 44, the same portions as those of FIG. 25 through FIG. 37 are indicated by the same reference numerals.

In this embodiment, a plurality of window portions 900 are formed at a side surface part of the reinforcing frame part 648. Along with this, a shielding spring 904, being a C-shaped section, which has projecting portions 902 corresponding to the window portions 900, is installed, and the projecting portions 902 are projected from the window portions 900. The plurality of projecting portions 902 are formed by a plurality of through holes 906 which are formed with a predetermined interval. The projection state of this shielding spring 904 is maintained by a spring operating part 908, which is formed in the attaching/detaching lever 724, coming into contact with the shielding spring 904. That is, in a case in which the spring operating part 908 exists in the reinforcing frame part 648, the shielding spring 904 is pressed out from the side surface of the reinforcing frame part 648. By this state, the card unit 6 and a neighboring card unit 6 are brought to a fast stuck state, and the leakage of an electromagnetic wave is prevented.

Further, when attaching the card 8 to the card unit 6 and detaching the card 8 from the card unit 6, as shown in FIG. 43, the attaching/detaching lever 724 is disengaged from the reinforcing frame part 648, and the contact with the shielding spring 904 is released. As a result of this, the shielding spring 904 is moved backward the inside of the reinforcing frame part 648. By coming into a withdrawn state like this, contact between the shielding spring 904 and another member is avoided. By this, the shielding spring 904 is protected from unnecessary stress, and the inconvenience of deformation and so on are prevented.

Fourth Embodiment

Figure 45:
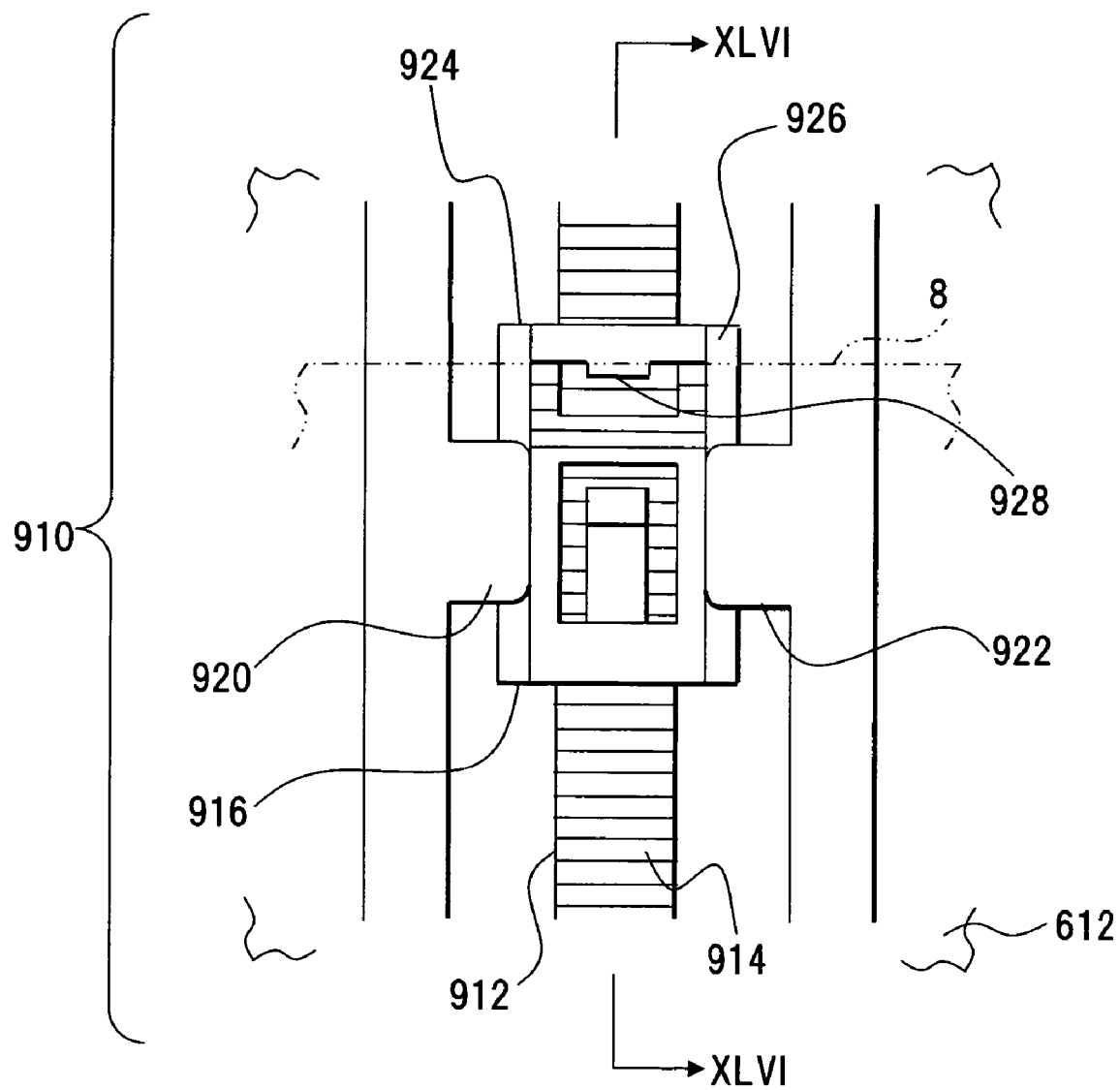
FIG. 45 is a drawing which shows a part of a movable frame part of a card unit according to a fourth embodiment.
Figure 46:
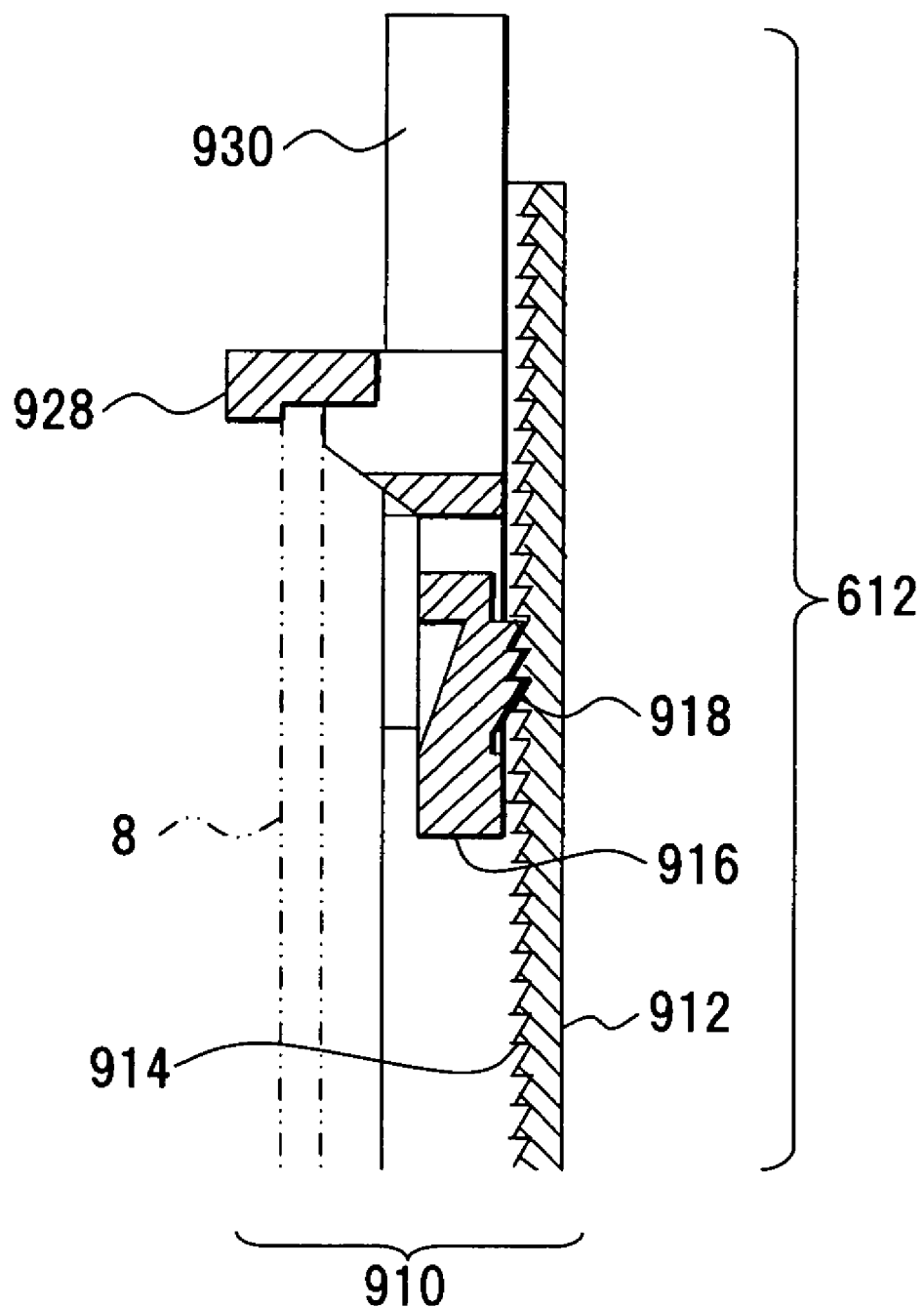
FIG. 46 is a sectional view taken along line XLVI-XLVI of FIG. 45.

A card unit according to a fourth embodiment of the present invention is explained by referring to FIG. 45 and FIG. 46. FIG. 45 is a drawing which shows a part of a movable frame part having another adjustable fixing mechanism, and FIG. 46 is a sectional view taken along line XLVI-XLVI of FIG. 45. In FIG. 45 and FIG. 46, the same portions as those of FIG. 25 through FIG. 37 are indicated by the same reference numerals.

At the front surface part of the movable frame part 612 on which the card 8 is loaded, an adjustable fixing mechanism 910 by which a fixing position of the card 8 is adjusted is installed. In this adjustable fixing mechanism 910, a rail part 912 is provided at the front surface of the movable frame part 612. This rail part 912 is formed by synthetic resin and so on, and an uneven part 914 of a saw tooth shape is formed on the rail part 912. At the rail part 912, a fixing slider 916 corresponding to a fixing position of the card 8 is provided. At this fixing slider 916 an uneven part 918 corresponding to the uneven part 914 is formed, and these uneven parts 914 and 918 are constituted so that they are engaged each other. Further, in order to slidably maintain the fixing slider 916 in the movable frame part 612, maintaining projection parts 920 and 922 are formed in parallel with the rail part 912. Step parts 924 and 926 corresponding to the maintaining projection parts 920 and 922 are formed in the fixing slider 916, and a sliding position of the fixing slider 916 is set by the maintaining projection parts 920 and 922 and the step parts 924 and 926. Furthermore, in the fixing slider 916, an engaging projection part 928 which is engaged with the card 8 is formed.

According to a constitution like this, if the fixing slider 916 is moved according to a size of the card 8 which is loaded on the movable frame part 612, if its engaging projection part 928 is engaged with the edge part of the card 8, and if a supporting member 930 is fixed to the movable frame part 612, it is possible to fix the card 8 to the movable frame part 612 without relating to a size of the card 8.

Another Embodiment

Although in the above-mentioned embodiments the explanation is given to the constitution that the card 8 is loaded on the card unit 6 and the card unit 6 is mounted on the device unit 4, the device unit 4 may also be constituted so that a component or a device other than the card unit is provided.

As described above, although the best mode for carrying out the invention, the object, the configuration and the operation and effect have been described in detail above, the invention is not limited to such embodiment for carrying out the invention, and it is a matter of course that the invention can be variously changed or modified by a person skilled in the art on the basis of a gist and, split of the invention as disclosed in claims and the detailed description of the invention, and such a change or modification, and various conjectured configurations, modified examples and so forth are included in the scope of the invention, and the description of the specification and drawings are not restrictively understood.

Furthermore, as described above, according to the present invention, a tool such as a screw-driver is unnecessary for a card exchange, for example, the exchange of a printed circuit board. Or, its use is reduced. Because of this, easiness in the attaching and detaching of a card may be given. Along with this, since an attaching and detaching position of the card is regulated according to an exchange of the card, there is no deviation in the positional relation between a connector and a card which is an attached and detached object. Because of this, the improvement of the attaching and detaching accuracy between the card and the connector may be given.

What is claimed is:

1. A card unit detachably mounted on an electronic apparatus, in which said card unit a card attached to or detached from said connector of said electronic apparatus is loaded, said card unit comprising:
   a frame having a supporting frame part and a movable frame part that is loaded with said card, said movable frame part being engaged with said supporting frame part so as to be movable in a direction of attachment or detachment of said card without inclining in relation to said connector, said frame expanding or contracting according to movement of said movable frame part; and
   an attaching/detaching mechanism that attaches said card to said connector or detaches said card from said connector by expanding and contracting said frame.

2. The card unit of claim 1, wherein said attaching/detaching mechanism has a rotatable attaching/detaching lever that makes said frame expand or contract by a rotational operation of said attaching/detaching lever.

3. The card unit of claim 1 further comprising a maintaining part that maintains said movable frame part of said frame at a position at which said card is disengaged from said connector.

4. The card unit of claim 1 further comprising a locking mechanism that locks a movement of said movable frame part of said frame at a position at which said card is attached to said connector.

5. The card unit of claim 4, wherein said locking mechanism is provided between said frame and a grip that is provided rotatably in a rotatable attaching/detaching lever which makes said frame expand or contract by its rotational operation, and can be released by a rotation of said grip.

6. The card unit of claim 1 further comprising a protection cover that protects said card loaded on said movable frame part of said frame.

7. The card unit of claim 1 further comprising:
   a base part that is provided in said frame; and
   a card fixing mechanism that a fixing position is adjusted according to said card, said card fixing mechanism fixing said card on said base part.

8. The card unit of claim 7, wherein said card fixing mechanism has a fixing position adjusting mechanism that adjusts a fixing position correspondingly to said card.

9. The card unit of claim 1 further comprising a rail that is provided in said supporting frame part of said frame, said card unit being attached to an external device by said rail.

10. A card unit detachably mounted on an electronic apparatus, in which said card unit a card attached to a connector or detached from said connector is loaded, said card unit comprising:
   a frame having a supporting frame part and a movable frame part that is loaded with said card, said movable frame part being engaged with said supporting frame part so as to be movable in a direction of attachment or detachment of said card without inclining in relation to said connector, said frame expanding or contracting according to movement of said movable frame part; and
   an attaching/detaching mechanism that attaches said card to said connector or detaches said card from said connector by expanding and contracting said frame, said attaching/detaching mechanism including:
   a slide part that is supported slidably at said supporting frame part, and
   a moving direction converting mechanism part, provided between said slide part and said movable frame part, which moves said movable frame part in a direction which intersects a moving direction of said slide part, wherein said card is attached to said connector or is detached from said connector by moving said movable frame part, and said movable frame part is moved through said moving direction converting mechanism part by moving said slide part to said supporting frame part.

11. The card unit of claim 1 or 10, further comprising:
one or both of a moving start point starting a movement to said supporting frame part and a moving end point ending the movement to said supporting frame part; and
a maintaining part to maintain said movable frame part at said moving start point and/or said moving end point.

12. The card unit of claim 10 further comprising a locking mechanism that locks a movement of said movable frame part at a position at which said card is attached to said connector.

13. The card unit of claim 1 or 10 further including a positioning part that determines an attaching and detaching position between said connector and said card loaded on said movable frame part.

14. The card unit of claim 13, wherein said positioning part is included in an attaching/detaching lever, in a body, which moves said movable frame part by its rotation.

15. The card unit of claim 13 wherein said positioning part is constituted by a positioning bar which is attached rotatably to said slide part.

16. The card unit of claim 10, wherein:
said moving direction converting mechanism part comprises
a slide shaft that is attached to said slide part; and
a long hole, formed in said movable frame part, which is provided with some angle in a direction intersecting a moving direction of said slide shaft.

17. The card unit of claim 16 further including a guide part, formed in said supporting frame part, which guides a movement of said slide shaft and also regulates its moving range.

18. The card unit of claim 1 or 10 further comprising a light guide part, provided in said supporting frame part, which guides a light to a front surface side of said card unit.

19. The card unit of claim 10, wherein an operation part that operates an external switch is provided at said slide part.

20. A card unit that is mounted on an electronic apparatus, and loads a card that is attached to or detached from a connector of the electronic apparatus, the card unit comprising:
a frame including:
a supporting frame part;
a rail attached to the supporting frame part, the rail engaging with a mating rail provided in the electronic apparatus in a slidable manner; and
a movable frame part in which the card is loaded, the movable frame part being engaged with the supporting frame part so as to be movable in a direction of attachment or detachment of the card; and
an attaching/detaching mechanism that moves the movable frame part against the supporting frame part in a direction of the attachment or the detachment of the card, so as to attach the card to or detach the card from the connector.

* * * * *